United States Patent
Farrar

(10) Patent No.: US 6,376,370 B1
(45) Date of Patent: Apr. 23, 2002

(54) PROCESS FOR PROVIDING SEED LAYERS FOR USING ALUMINUM, COPPER, GOLD AND SILVER METALLURGY PROCESS FOR PROVIDING SEED LAYERS FOR USING ALUMINUM, COPPER, GOLD AND SILVER METALLURGY

(75) Inventor: Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/484,002

(22) Filed: Jan. 18, 2000

(51) Int. Cl.$^7$ .............................................. H01L 21/44

(52) U.S. Cl. ...................................... 438/678; 257/762

(58) Field of Search ................................ 438/678, 608, 438/625, 642, 650, 652, 635; 437/189; 427/97; 257/762

(56) References Cited

U.S. PATENT DOCUMENTS

| | | | |
|---|---|---|---|
| 2,842,438 A | 7/1958 | Saarivirta et al. | .............. 75/153 |
| 4,762,728 A | 8/1988 | Keyser et al. | ................. 427/38 |
| 4,847,111 A | 7/1989 | Chow et al. | ................... 427/38 |
| 4,962,058 A | 10/1990 | Cronin et al. | ................ 437/187 |
| 5,084,412 A | * 1/1992 | Nakasaki | .................... 437/189 |

(List continued on next page.)

FOREIGN PATENT DOCUMENTS

JP    07078815    3/1995    ....... H01L/21/3205

OTHER PUBLICATIONS

Meng_Hsiung Kiang, Michael A. Lieberman, Nathan W. Chung and X.Y.Qian, Appl. Phys.Lett.60 (22), Jun. 1, 1992, Pages. 2767–2769.*

Shacham–Diamand, Y., et al., "Copper electroless deposition technology for ultra–large–scale–intergration (ULSI) metallization", *Microelectronic Engineering*, NL, vol. 33, No. 1, XP004054497, 47–58, (1997).

Stroud, P.T., et al., "Preferential deposition of silver induced by low energy gold ion implantation", *Thin Solid Films*, Switzerland, vol. 9, No. 2, XP000993098, 273–281, (Feb. 1972).

"Brooks Model 5964 High Performance Metal Seal Mass Flow Controller (Introduced in 1991)", *Brooks Instrument*, http://www.frco.com/brooks/semiconductor/

(List continued on next page.)

*Primary Examiner*—David Nelms
*Assistant Examiner*—David Vu
(74) *Attorney, Agent, or Firm*—Schwegman, Lundberg, Woessner & Kluth, P.A.

(57) ABSTRACT

Structures and methods are provided which improve performance in integrated circuits. The structures and methods include a diffusion barrier and a seed layer in an integrated circuit both formed using a low energy ion implantation followed by a selective deposition of metal lines for the integrated circuit. According to the teachings of the present invention, the selective deposition of the metal lines avoids the need for multiple chemical mechanical planarization (CMP) steps. The low energy ion implantation of the present invention allows for the distinct placement of both the diffusion barrier and the seed layer. A residual resist can be used to remove the diffusion barrier and the seed layer from unwanted areas on a wafer surface. The novel methodology of the present invention includes patterning an insulator material to define a number of trenches in the insulator layer opening to a number of first level vias in a planarized surface. A barrier/adhesion layer is deposited in the number of trenches using a low energy ion implantation, e.g. a 100 to 800 electron volt (e.v.) ion implantation. A seed layer is deposited on the barrier/adhesion layer in the number of trenches also using the low energy ion implantation. Structures formed by this novel process are similarly included within the scope of the present invention and account for aluminum, copper, gold, and silver metal interconnects.

45 Claims, 47 Drawing Sheets

U.S. PATENT DOCUMENTS

| | | | |
|---|---|---|---|
| 5,130,274 A | 7/1992 | Harper et al. | 437/195 |
| 5,158,986 A | 10/1992 | Cha et al. | 521/82 |
| 5,173,442 A | 12/1992 | Carey | 437/173 |
| 5,231,056 A | 7/1993 | Sandhu | 437/200 |
| 5,654,245 A | 8/1997 | Allen | 438/629 |
| 5,670,420 A | 9/1997 | Choi | 437/189 |
| 5,763,953 A | 6/1998 | Iljima et al. | 257/762 |
| 5,824,599 A * | 10/1998 | Schacham-Diamand et al. | 438/678 |
| 5,891,797 A | 4/1999 | Farrar | 438/619 |
| 5,948,467 A | 9/1999 | Nguyen et al. | 427/99 |
| 5,994,777 A | 11/1999 | Farrar | 257/758 |
| 6,071,810 A * | 6/2000 | Wada et al. | 438/635 |
| 6,140,228 A | 10/2000 | Shan et al. | 438/653 |
| 6,171,661 B1 | 1/2001 | Zheng et al. | 427/535 |
| 6,197,688 B1 * | 3/2001 | Simpson | 438/678 |
| 6,207,222 B1 * | 3/2001 | Chen et al. | 427/97 |

OTHER PUBLICATIONS products1i.html, 1 page, (1991).

Andricacos, P.C., "Copper On–Chip Interconnections", *The Electrochemical Society Interface*, pp. 32–37, (1999).

Anonymous, "Improved Metallurgy for Wiring Very Large Scale Integrated Circuits", *International Technology Disclosures*, 4, Abstract, 1 page, (1986).

Bae, S., et al., "Low–Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science*, p. 315, (1997).

Bernier, M., et al., "Laser processing of palladium for selective electroless copper plating", *SPIE*, 2045, pp. 330–337, (1994).

Bhansali, S., et al., "A novel technique for fabrication of metallic structures on polymide by selective electroless copper plating using ion implantation", *Thin Solid Films*, 270, pp. 489–492, (1995).

Bhansali, S., et al., "Selective electroless copper plating on silicon seeded by copper ion implantation", *Thin Solid Films*, 253, pp. 391–394, (1994).

Braud, E., et al., "Ultra Thin Diffusion Barriers for Cu Interconnections at The Gigabit Generation and Beyond", *VMIC Conference Proceedings*, pp. 174–179, (1996).

Cabrera, A.L., et al., "Oxidation protection for a variety of transition metals and copper via surface silicides formed with silane containing atmospheres", *J. Mater. Res.*, 6(1), pp. 71–79, (1991).

de Felipe, T.S., et al., "Electrical Stability and Microstructural Evolution in Thin Films of High Conductivity Copper Alloys", *IEEE*, pp. 293–295, (1999).

Ding, et al., "Copper Barrier, Seed Layer and Planerization Technologies", *VMIC Conference Proceedings*, pp. 87–92, (1997).

Dubin, V.M., et al., "Selective and Blanket Electroless Copper Deposition for Ultralarge Scale Integration", *J. Electrochem. Soc.*, 144(3), pp. 898–908, (1997).

Dushman, S., et al., *Scientific Foundation of Vacuum Technique*, 2nd Edition, John Wiley and Sons, 1–806, (1962).

Edelstein, D., et al., "Full Copper Wiring in a Sub–0.25 micrometer CMOS ULSI Technology", *IEDM*, pp. 773–776, (1997).

Eldridge, J.M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN, pp. 283–285, (1987).

Gladlfelter, W.L., et al., "Trimethylamine Complexes of Alane as Precursors for the Low–Pressure Chemical Vapor Deposition of Aluminum", *Chemistry of Materials*, 1, pp. 339–343, (1989).

Godbey, D.J., et al., "Copper Diffusion in Organic Polymer Resists and Inter–level Dielectrics", *Thin Solid Films*, 308–309, pp. 470–474, (1997).

Grimblot, J., et al., "II. Oxidation of Al Films", *J. Electrochem.*, 129, pp. 2369–2372, (1982).

Hattangady, S.V., et al., "Integrated processing of silicon oxynitride films by combined plasma and rapid–thermal processing", *J. Vac. Sci. Technol. A*, 14(6), pp. 3017–3023, (1996).

Hirata, A., et al., "WSiN Diffusion Barrier Formed by ECR Plasma Nitridation for Copper Damascene Interconnection", *16th Solid State Devices and Materials*, pp. 260–261, (1998).

Holloway, K., et al., "Tantalum as a diffusion barrier between copper and silicon", *Appl. Phys. Lett.*, 57(17), pp. 1736–1738, (Oct. 1990).

Hu, C.K., et al., "Extendibility of Cu Damascene to 0.1 micrometer Wide Interconnections", *Mat. Res. Soc. Symp. Proc*, 514, pp. 287–292, (1998).

Hymes, S., et al., "Passivation of Copper by Silicide Formation in Dilute Silane", *Conference Proceedings ULSI–VII*, pp. 425–431, (1992).

Iijima, T., et al., "Microstructure and Electrical Properties of Amorphous W–Si–N Barrier Layer for Cu Interconnections", *1996 VMIC Conference*, pp. 168–173, (1996).

Jeon, Y., et al., "Low–Temperature Fabrication of Polycrystalline Silicon Thin Films by ECR Pecvd", *The Electrochemical Society Proceedings*, 94(35), pp. 103–114, (1995).

Kamins, T.I., "Structure and Properties of LPCVD Silicon Films", *J. Electrochem. Soc.: Solid–State Science and Technology*, 127, pp. 686–690, (Mar. 1980).

Keppner, H., et al., "The "Micromorph" Cell: A New Way to High–Efficiency–Low–Temperature Crystalline Silicon Thin–Film Cell Manufacturing", *Mat. Res. Soc. Symp. Proc.*, 452, pp. 865–876, (1997).

Kiang, M., et al., "Pd/Si plasma immersion ion implantation for selective electrless copper plating on Sio2", *Appl. Phys. Lett.*, 60, pp. 2767–2769, (1992).

Kistiakowsky, G.B., et al., "Reactions of Nitrogen Atoms. I. Oxygen and Oxides of Nitrogen", *The Journal of Chemical Physics*, 27(5), pp. 1141–1149, (1957).

Laursen, T., et al., "Encapsulation of Copper by Nitridation of Cu–Ti Alloy/Bilayer Structures", *International Conference on Metallurgical Coatings and Thin Films*, Abstract No. H1.03, San Diego, CA, p. 309, (Apr. 1997).

Len, V., et al., "An investigation into the performance of diffusion barrier materials against copper diffusion using metal–oxide–semiconductor (MOS) capacitor structures", *Solid–State Electronics*, 43, pp. 1045–1049, (1999).

Lyman, T., et al., "Metallography, Structures and Phase Diagrams", *Metals Handbook*, 8, American Society for Metals, Metals Park, Ohio, pp. 300 & 302, (1989).

Marcadal, C., et al., "OMCVD Copper Process for Dual Damascene Metallization", *VMIC Conference*, ISMIC, pp. 93–97, (1997).

Miller, R.D., et al., "Low Dielectric Constant Polyimides and Polyimide Nanofoams", *Seventh Meeting of the DuPont Symposium on Polymides in Microelectronics*, pp. 443–473, (Sep. 1996).

Murarka, S.P., et al., "Copper Interconnection Schemes: Elimination of The Need of Diffusion Barrier/Adhesion Promoter by the Use of Corrosion Resistant, Low Resistivity Doped Copper", *SPIE*, 2335, pp. 80–90, (1994).

Nakao, S., et al., "Thin and Low–Resistivity Tantalum Nitride Diffusion Barrier and Giant–Grain Copper Interconnects for Advanced ULSI Metallization", *Japanese Journal of Applied Physics*, 38(4B), pp. 262–263, (Apr. 1999).

Newboe, B., et al., "Applied Materials Announces First Barrier/Seed Layer System For Copper Interconnects", *Applied Materials*, http://www.appliedmaterials.com/newsroom/pr–00103.html, pp. 1–4, (1997).

Okamoto, Y., et al., "Magnetically Excited PLasma Oxynitridation of Si at Room Temperature", *Jpn. J. Appl. Phys.*, 34, pp. L955–957, (1995).

Radzimski, Z.J., et al., "Directional Copper Deposition using d–c Magnetron Self–sputtering", *J. Vac. Sci. Technol. B*, 16(3), pp. 1102–1106, (1998).

Rath, J.K., et al., "Low–Temperature deposition of polycrystalline silicon thin films by hot–wire CVD", *Solar Energy Materials and Solar Cells*, 48, pp. 269–277, (1997).

Ray, S.K., et al., "Fluorine–enhanced nitridation of silicon at low temperatures in a microwave plasma", *J. Appl. Phys.*, 70(3), pp. 1874–1876, (1991).

Rossnagel, S.M., et al., "Metal ion deposition from ionized mangetron sputtering discharge", *J. Vac. Sci. Technol. B*, 12(1), pp. 449–453, (1994).

Ryan, J.G., et al., "Copper Interconnects for Advanced Logic and DRAM", Extended Abstracts of the 1998 International Conference on Solid–State Devices and Materials, Hiroshima, pp. 258–259, (1998).

Ryu, C., et al., "Barriers for copper interconnections", *Solid State Technology*, pp. 53,54,56, (Apr. 1999).

Saarivirta, M.J., "High Conductivity Copper Rich Cu–Zr Alloys", *Transactions of the Metallurgical Society of AIME*, 218, pp. 431–437, (1960).

Senzaki, Y., "Chemical Vapor Deposition of Copper using a New Liquid Precursor with Improved Thermal Stability", *Conference Proceedings ULSI XIII, Materials Research Society*, pp. 451–455, (1998).

Shacham–Diamond, Y., et al., "Copper electroless deposition technology for ultra–large–scale–integration (ULSI) metallization", *Microelectronic Engineering*, 33, pp. 47–58, (1997).

Tsukada, T., et al., "Adhesion of copper films on ABS polymers deposited in an internal magnet magnetron sputtering system", *J. Vac. Sci. Technol.*, 16(2), pp. 348–351, (1979).

Venkatesan, S., et al., "A High Performance 1.8V, 0.20 micrometer CMOS Technology with Copper Metalization", *IEEE*, pp. 769–772, (1997).

Vossen, J.L., et al., *Thin Film Processes II*, Academic Press, Inc., 1–866, (1991).

Wang, K., et al., "Very Low Temperature Deposition of Polycrystalline Silicon Films with Micro–Meter–Order Grains on SiO2", *Mat. Res. Soc. Symp. Proc.*, 355, pp. 581–586, (1995).

Winters, H.F., et al., "Influence of Surface Absorption Characteristics on Reactivity Sputtered Films Grown in the Biased and Unbiased Modes", *J. Appl. Phys.*, 43(3), pp. 794–799, (1972).

Yeh, J.L., et al., "Selective Copper plating of Polysilicon Surface Micromachined Structures", *Solid–State Sensor and Actuator Workshop*, pp. 248–251, (1998).

Zhang, J., et al., "Investigations of photo–induced decomposition of palladium acetate for electroless copper plating", *Thin Solid Films*, 318, pp. 234–238, (1998).

* cited by examiner

PROCESS FOR PROVIDING SEED LAYERS FOR USING ALUMINUM, COPPER, GOLD AND SILVER METALLURGY PROCESS FOR PROVIDING SEED LAYERS FOR USING ALUMINUM, COPPER, GOLD AND SILVER METALLURGY

RELATED APPLICATIONS

This application is related to the following co-filed and commonly assigned applications: Ser. No. 09/488,098 entitled "Method and Apparatus for Making Integrated-Circuit Wiring from Copper, Silver, Gold, and Other Metals," and Ser. No. 09/484,303 entitled "Method for Making Copper Interconnects in Integrated Circuits," which are hereby incorporated by reference. This application is further related to the following co-pending and commonly assigned application: U.S. Ser. No. 09/128,859 filed Aug. 9, 1999, entitled "Copper Metallurgy in Integrated Circuits," which is hereby incorporated by reference.

FIELD OF THE INVENTION

The present invention relates generally to integrated circuits. More particularly, it pertains to structures and methods for providing seed layers for integrated circuit metallurgy.

BACKGROUND OF THE INVENTION

One of the main problems confronting the semiconductor processing industry, in the ULSI age, is that of Capacitive-Resistance loss in the wiring levels. This has led to a large effort to reduce the resistance of and lower the capacitive loading on the wiring levels. Since its beginning, the industry has relied on aluminum and aluminum alloys for wiring. In a like manner, the industry has mainly relied on $SiO_2$ as the insulator of choice, although polyimide was used in a number of products by one vendor (IBM), for a number of years. The capacitive resistance problem grows with each succeeding generation of technology. As the dimensions decrease the minimum line space combination decreases, thus increasing both capacitance and resistance, if the designer is to take advantage of the improved ground rules.

To improve the conductivity, it has been suggested by numerous investigators, that copper or perhaps silver or gold metallurgy be substituted for the aluminum metallurgy, now being used. Several potential problems have been encountered in the development of these proposed metallurgies. One of the main ones is the fast diffusion of copper through. both silicon and $SiO_2$. This along with the known junction poising effects of copper and gold have led to proposals to use a liner, to separate these metallurgies from the $SiO_2$ insulator.

For example, an article authored by Karen Holloway and Peter M. Fryer, entitled, "Tantalum as a diffusion barrier between copper and silicon", Appl. Phys. Letter vol.57, No. 17, 22 October 1990, pp. 1736–1738, suggests the use of a tantalum metal liner. In another article authored by T. Laursen and J. W. Mayer, entitled, "Encapsulation of Copper by Nitridation of Cu—Ti Alloy/Bilayer Structures", International Conference on Metallurgical Coatings and Thin Films, San Diego, Calif., Apr. 21–25, 1997, Abstract No. H1.03, pg. 309, suggests using a compound such as CuTi as the liner. Still another article published by Vee S. C. Len, R. E. Hurley, N. McCusker, D. W. McNill, B. M. Armstrong and H. S. Gamble, entitled, "An investigation into the performance of diffusion barrier materials against copper diffusion using metal-oxide-semiconductor (MOS) capacitor structures", Solid-State Electronics 43 (1999) pp. 1045–1049 suggests using a compound such as TaN as the liner. These approaches, however, do not fully resolve the above-stated problem of the minimum line space decreases. Thus, the shrinking line size in the metal line and liner combination again increases both the. capacitance and resistance.

At the same time other investigators, in looking at the capacitive loading effect, have been studying various polymers such as fluorinated polyimides as possible substitutions for $SiO_2$ insulators. Several of these materials have dielectric constants considerably lower than $SiO_2$. However as in the case of $SiO_2$, an incompatibility problem with copper metallurgy has been found. For example, in a presentation by D. J. Godbey, L. J. Buckley, A. P. Purdy and A. W. Snow, entitled, "Copper Diffusion in Organic Polymer Resists and Inter-level Dielectrics", at the International Conference on Metallurgical Coatings and Thin Films, San Diego, Calif., Apr. 21–25, 1997, Abstract H2.04 pg. 313, it was shown that polyimide, and many other polymers, react with copper during the curing process, forming a conductive oxide $CuO_2$, which is dispersed within the polymer. This then raises the effective dielectric constant of the polymer and in many cases increases the polymers conductivity. In addition it has been found that reactive ion etching (RIE) of all three metals, copper, silver or gold, is difficult at best.

Other approaches by investigators have continued to look for ways to continue to use aluminum wiring with a lower dielectric constant insulator. This would decrease the capacitive load with a given inter-line space but require wider or thicker lines. The use of thicker lines would increase the capacitive loading in direct proportion to the thickness increase. Thus to some measure, it defeats the objectives of decreasing the capacitive loading effects. Therefore, the use of thicker lines should be avoided as much as possible. As the resistivity of the line is directly proportional to its cross-sectional area, if it cannot be made thicker, it must be. made wider. If however the lines are made wider, fewer wiring channels can be provided in each metal level. To obtain the same number of wiring channels, additional levels of metal must be provided. This increases the chip cost. So if this approach is to be followed, it is imperative that a low cost process sequence be adopted.

One approach provided by the present inventor in a co-pending application, entitled, "Copper Metallurgy in Integrated Circuits", filed Aug. 4, 1998, application Ser. No. 09/128,859, proposes a method to solve many of the problems associated with using copper in a polymer insulator. This process, which was specifically designed to be compatible with a polymer or foam insulation, required that the unwanted copper on the surface of each layer be removed by Chemical Mechanical Polishing (CMP) or a similar planarizing process. However, this method may require careful process control, leading to additional expense. Another approach is provided in a co-pending application by Kie Ahn and Leonard Forbes, entitled "Method for Making Copper and Other Metal Interconnections in Integrated Circuits", filed Feb. 27, 1998, U.S. Ser. No. 09/032,197, which proposes a method using ionized sputtering to form the underlayer, then forming a low wetting layer on the areas where no copper is desired using jet vapor deposition. The copper is deposited with ionized Magnetron sputtering followed by hydrogen annealing. The excess copper is then removed by CMP as in the aforementioned application.

Another process is described by the present inventor in a co-pending application, entitled, "Integrated Circuit with Oxidation Resistant Polymeric Layer", filed Sep. 1, 1998, U.S. Ser. No. 09/145,012, which eliminates many of the CMP processes and uses lift-off to define the trench and the seed layer simultaneously. A process is also described by the present inventor in a co-pending. application, entitled, "Conductive Structures in Integrated Circuits" filed Mar. 1, 1999, U.S. Ser. No. 09/259,849, which required a CMP process to remove unwanted seed material prior to a selective deposition of the metal layers in a damascene or dual damascene process.

The use of CMP has proven to be effective in reducing local non-planarity. However, extensive dishing in wide lines and rounding of corners of the insulator are a common occurrence. It has been found that by maintaining a regular structure through the use of dummy structures and small feature sizes, it is possible to planarize a level to a nearly flat surface. The use of these techniques are however costly and in some cases come with density or performance penalties. It is, however, generally possible to planarize a structure prior to the metal levels using these methods with little or no density penalty. The use of electroless plating has been suggested in an article authored by Yosi Schacham-Diamand and Valery M. Dubin, entitled "Copper electroless deposition technology for ultra-large scale integration (ULSI) metallization", Microelectronic Engineering 33 (1997) 47–58, however a simple process for obtaining both a barrier layer as well as a seed layer is needed to improve the cost effectiveness of this technique. One technique for seeding polyimide and silicon surfaces using high energy (10–20 Kilo Electron Volts {KEV}) ion implantation has been demonstrated in an article authored by S. Bhansali, D. K. Sood and R. B. Zmood, entitled "Selective electroless copper plating on silicon seeded by copper ion implantation", Thin Solid Films V253 (1994) pp. 391–394. However this process has not been shown to be implementable into a product structure where a barrier and/or adhesion layer is required.

For the reasons stated above and for others which will become apparent from reading the following disclosure, structures and methods are needed which alleviate the problems associated with via and metal line fabrication processes. These structures and methods for via and metal line fabrication must be streamlined and accommodate the demand for higher performance in integrated circuits even as the fabrication design rules shrink.

SUMMARY OF THE INVENTION

The above mentioned problems associated with integrated circuit size and performance, the via and metal line formation process, and other problems are addressed by the present invention and will be understood by reading and studying the following specification. The structures and methods of the present invention include a diffusion barrier and a seed layer in an integrated circuit both formed using a low energy ion implantation followed by a selective deposition of metal lines for the integrated circuit. According to the teachings of the present invention, the selective deposition of the metal lines avoids the need for multiple chemical mechanical planarization (CMP) steps. The low energy ion implantation of the present invention allows for the distinct placement of both the diffusion barrier and the seed layer. A residual resist can be used to remove the diffusion barrier and the seed layer from unwanted areas on a wafer surface.

In particular one illustrative embodiment of the present invention includes a method of making a diffusion barrier and a seed layer in an integrated circuit. The method includes patterning an insulator material to define a number of trenches in the insulator layer opening to a number of first level vias in a planarized surface. A barrier/adhesion layer is deposited in the number of trenches using a low energy ion implantation, e.g. a 100 to 800 electron volt (eV) ion implantation. A seed layer is deposited on the barrier/adhesion layer in the number of trenches also using the low energy ion implantation. This novel methodology further accommodates the formation of aluminum, copper, gold, and/or silver metal interconnects.

BRIEF DESCRIPTION OF THE DRAWINGS

The following detailed description of the preferred embodiments can best be understood when read in conjunction with the following drawings, in which:

FIGS. 1A–1K illustrate one embodiment of the various processing steps for forming vias and metal lines according to the teachings of the present invention;

FIGS. 2A–2K illustrate another embodiment of the various processing steps for forming vias and metal lines according to the teachings of the present invention;

FIGS. 3A–3K illustrate another embodiment of the various processing steps for forming vias and metal lines according to the teachings of the present invention;

FIGS. 4A–4L illustrate another embodiment of the various processing steps for forming vias and metal lines according to the teachings of the present invention;

DETAILED DESCRIPTION

Figure 1A:
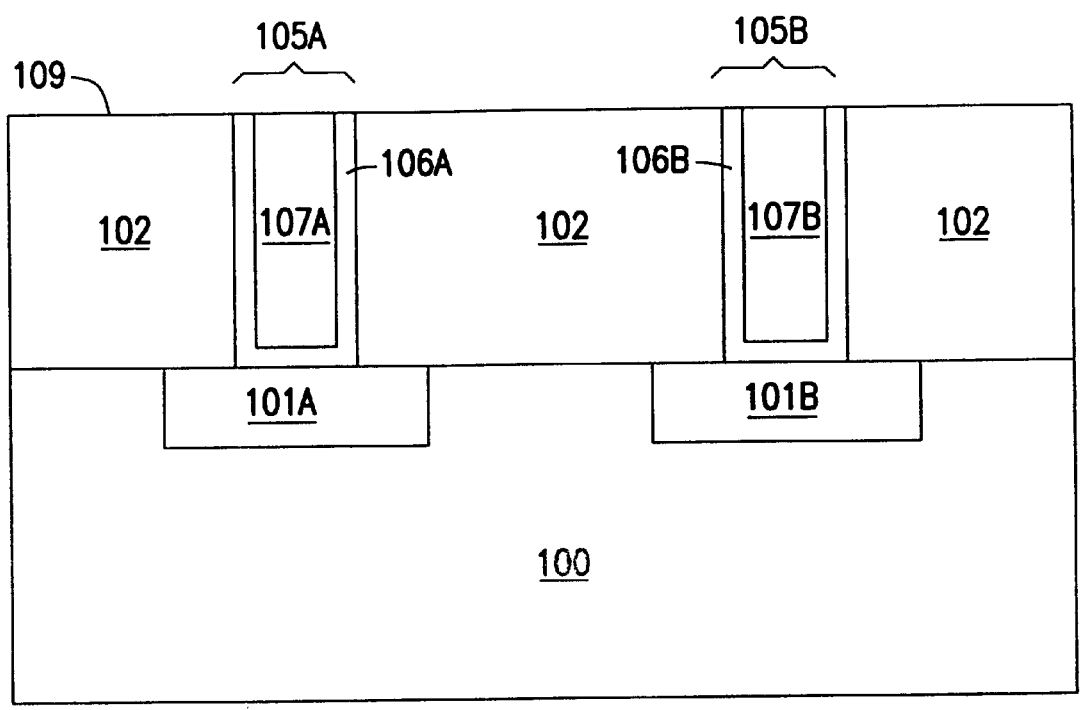

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Substrate include doped and unhoped semiconductors, epitaxial semiconductor layers supported by a base semiconductor or insulator, as well as other semiconductor structures well known to one skilled in the art. The term insulator is defined to include any material that is less electrically conductive than the materials generally referred to as conductors by those skilled in the art. The following detailed description is, therefore, not to be taken in a limiting sense.

What is disclosed herein is a low cost process to achieve reduced capacitance and resistance loss in wiring levels. The present invention requires only one complete CMP planarizing coupled with the formation of the first level vias, no matter how many levels of metallurgy are used. What are essentially cleanup CMP steps on each metal level are used in one process sequence. This process can be used with an aluminum, copper, silver, gold or any other material which can subsequently be electrolessly plated or deposited by selective CVD or any other selective deposition process. A polyimide, other polymer or foam polymer can be used as an insulator. It can also be used with an oxide or other inorganic insulating structure if the insulating stack is compatible with the metal being used. It can also be used to form air bridge structures as well. The process uses low energy ion implantation to deposit both the adhesion and/or barrier layer along with the seed layer. This is coupled with using the resist layer which defines the damascene trench as the blocking layer to define the implant areas. Low energy implantation allows the placing of distinct layers of both barrier/adhesion and seed layers. The use of the same resist layers to define both the trench and seed layers allows a low cost implementation of the process.

Embodiment of a Metal Interconnect using Copper and Polyimide

FIGS. 1A–1K illustrate a novel methodology for the formation of metal interconnects and/or a wiring structure in an integrated circuit according to the teachings of the present invention. The novel methodology includes the novel formation of a barrier/adhesion layer and a seed layer in an integrated circuit using a low energy ion implantation. The novel methodology also encompasses a novel method of making copper, silver, aluminum, or gold interconnect for an integrated circuit.

FIG. 1A illustrates a portion of an integrated circuit structure, namely an integrated circuit having a number of semiconductor devices formed in a substrate. FIG. 1 illustrates the structure after a device structure is formed in the substrate and the contact structure to the device structure is in place. One of ordinary skill in. the art will understand upon reading this disclosure the manner in which a number of semiconductor structures, e.g. transistors, can be formed in a substrate. One of ordinary skill in the art will also understand upon reading this disclosure the manner in which a contact structure can be formed connecting to a given semiconductor device in a substrate. For example, FIG. 1A illustrates the structure after a number of device structures, e.g. transistor 101A and 101B are formed in the substrate 100. An insulator layer 102 is deposited over the number of semiconductors 101A and 101B. The deposition of the insulator layer 102 can include depositing a layer of $Si_3N_4$ having a thickness in the range of 100 to 500 Angstroms (Å). This insulator layer will also serve as an additional barrier to impurities coming from subsequent processing steps. Contact holes 105A and 105B are opened to the number of device structures 101A and 101B using a photolithography technique. One of ordinary skill in the are will understand, upon reading this disclosure, the manner in which a photolithography technique can be used to create contact holes 105A and 105B. In one embodiment of the present invention a titanium silicide liner 106A and 106B is placed in the contact holes 105A and 105B, such a through a process such as chemical vapor deposition (CVD). Next, tungsten vias 107A and 107B can be deposited in the contact holes 105A and 105B. The tungsten vias 107A and 107B can be deposited in the contact holes using any suitable technique such as using a CVD process. The excess tungsten is then removed from the wafer surface by chemical mechanical planarization (CMP) or other suitable processes to form a planarized surface 109.

Figure 1B:
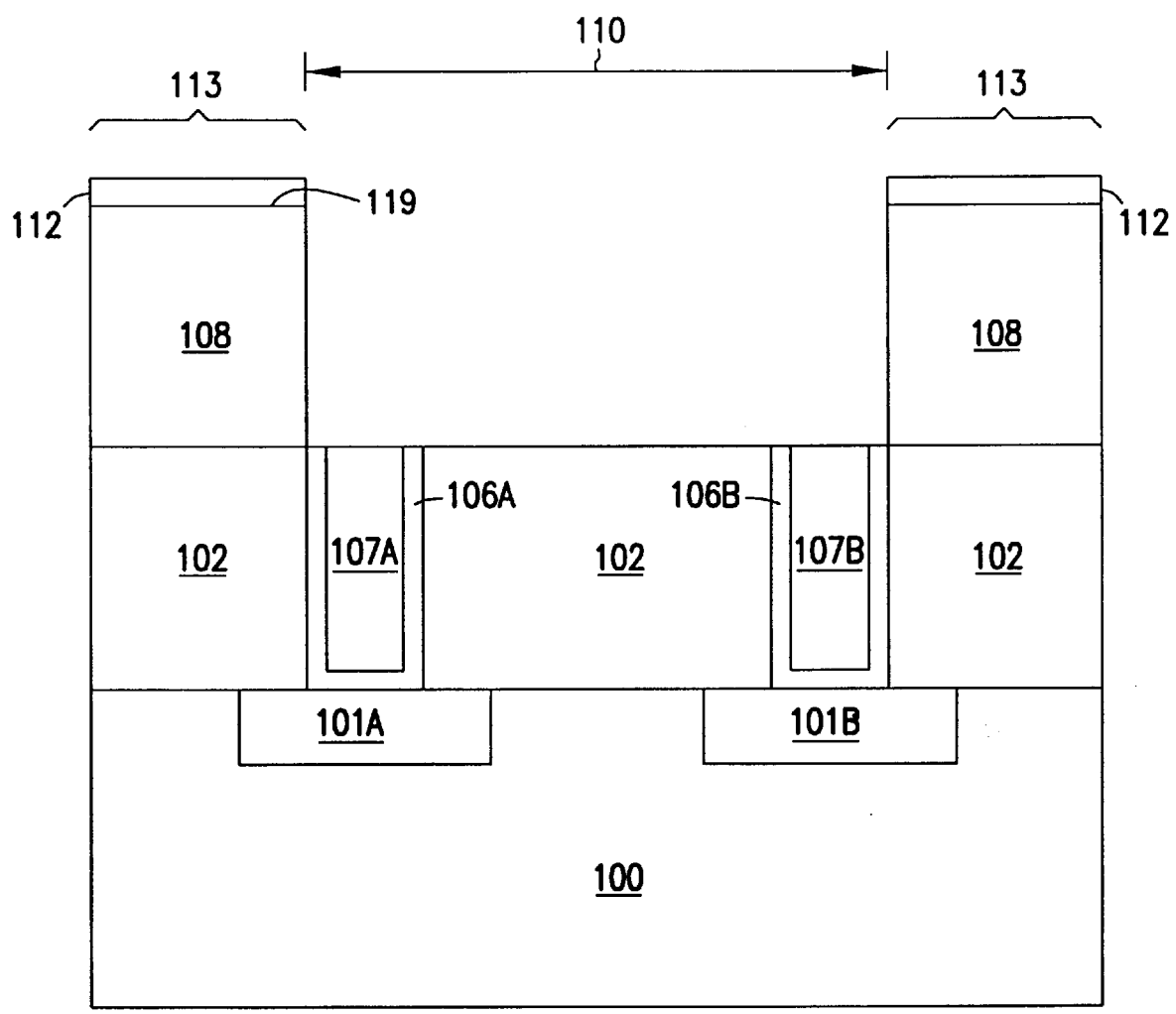

As shown in FIG. 1B, a first polymer layer 108, or first layer of polyimide 108, is deposited over the wafer surface. The first polymer layer 108 may be deposited using, for example, the process and material described in co-pending and commonly assigned application U.S. Ser. No. 09/128, 859, entitled "Copper Metallurgy in Integrated Circuits," which is hereby incorporated by reference. In one embodiment, depositing a first polymer layer 108 includes depositing a foamed polymer layer 108. In one embodiment, the first layer of polyimide 108 is deposited and cured, forming a 5000 Å thick layer of polymer 108 after curing. As one of ordinary skill in the art will understand, upon reading this disclosure, other suitable thickness for the first layer of polyimide 108, or insulator layer/material 108, may also be deposited as suited for forming a first level metal pattern, the invention is not so limited. The first layer of polyimide 108, or first insulator layer/material 108 is patterned to define a number of trenches 110 in the first insulator layer 108 opening to a number of first level vias, e.g. tungsten vias 107A and 107B in planarized surface 109. In other words, a first level metal pattern 110 is defined in a mask layer of photoresist 112 and then the first layer of polyimide 108 is etched, using any suitable process, e.g. reactive ion etching (RIE), such that the first level metal pattern 110 is defined in the polyimide. According to the teachings of the present invention, a residual photoresist layer 112 is left in place on the first insulator layer 108 in a number of region 113 outside of the number trenches 110. The structure is now as appears in FIG. 1B.

Figure 1C:
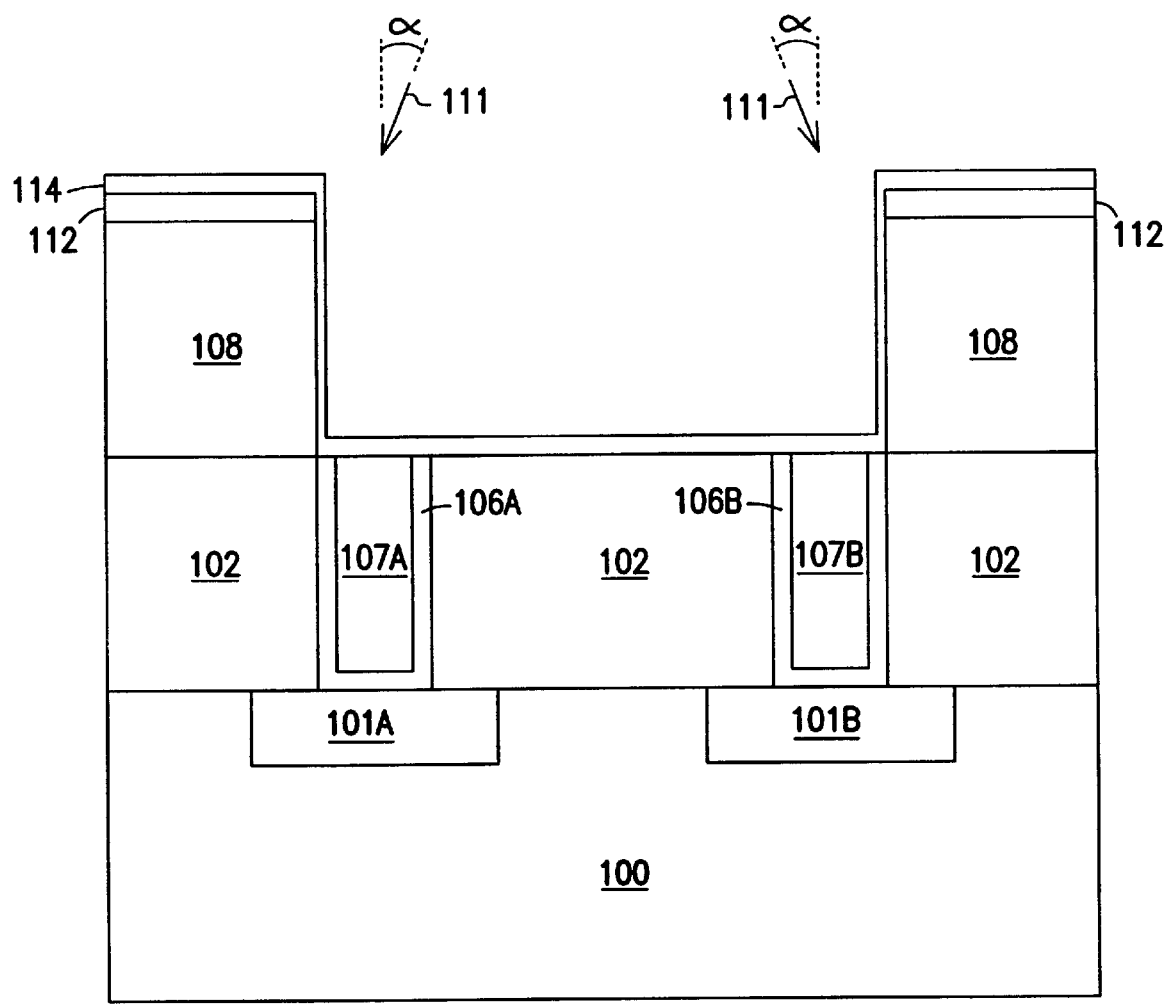

As shown in FIG. 1C, a first barrier/adhesion layer 114 is deposited in the number of trenches 110 using a low energy ion implantation. In one embodiment according to the teachings of the present invention, depositing the barrier/adhesion layer 114 includes depositing a layer of zirconium 114 having a thickness of approximately 5 to 100 Å. In alternate embodiments, depositing the barrier/adhesion layer 114 includes depositing a barrier/adhesion layer 114 of titanium and/or hafnium. In one embodiment, depositing the depositing a layer of zirconium 114 includes depositing a layer of zirconium 114 having a thickness of approximately 50 Å. This can be achieved using a $10^{17}$ ion implant of zirconium, i.e. $10^{17}$ ions of zirconium per square centimeter ($cm^2$). According to the teachings of the present invention, the layer of zirconium 114 is implanted at 100 electron volts (eV) into the surface of the trenches 110 in the polymer layer 108 using a varying angle implant ( ), as represented by arrows 111, where the angle of implantation is changed from normal to the wafer surface to 15 degrees off normal. As one of ordinary skill in the art will understand upon reading this disclosure, using a varying angle implant, where an angle of implantation is changed from normal to the planarized surface 109 to approximately 15 degrees off normal deposits the barrier/adhesion layer 114 on all surfaces in the number of trenches 110. The structure is now as appears in FIG. 1C.

Figure 1D:
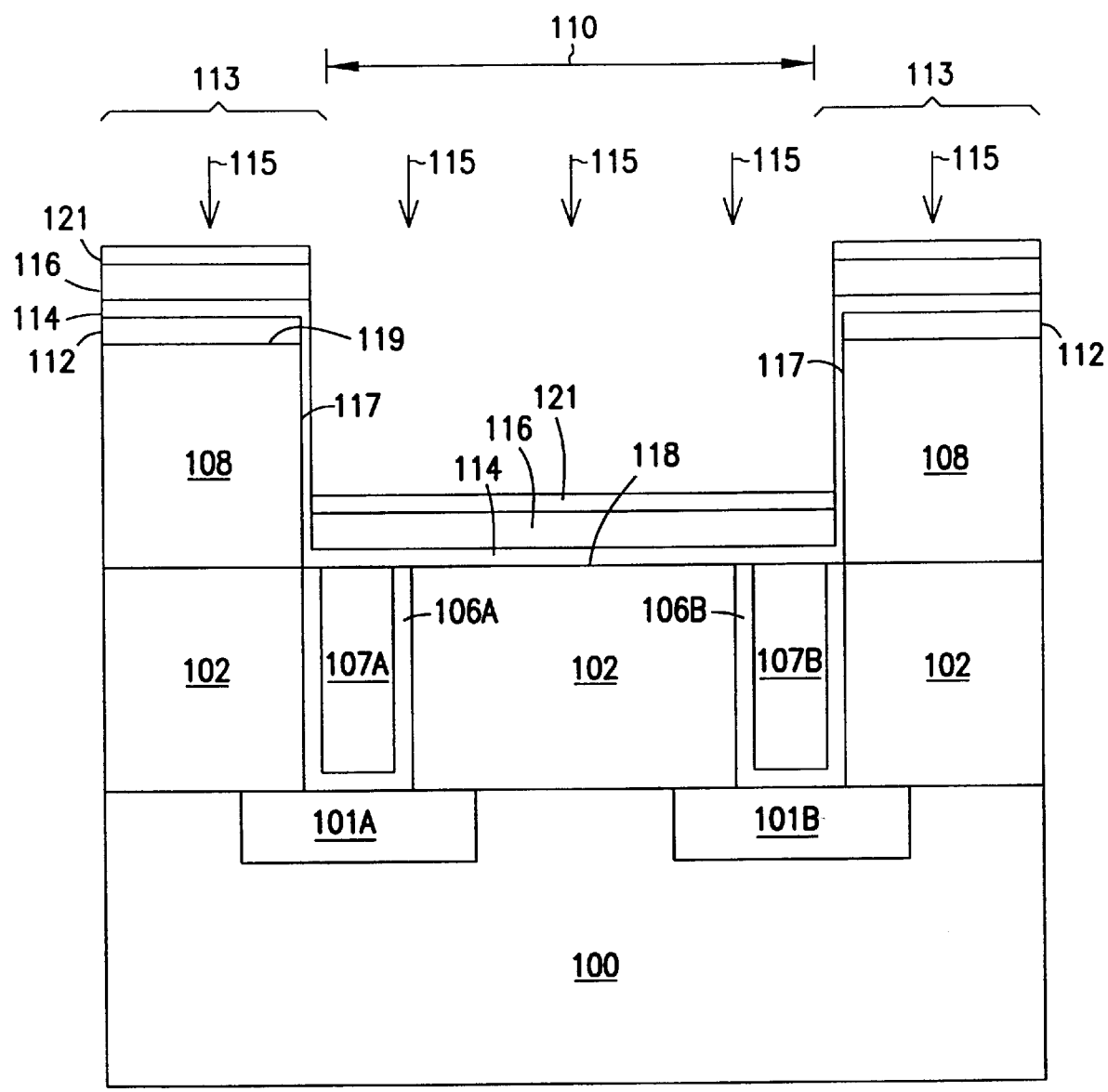

In FIG. 1D, a first seed layer 116 is deposited on the first barrier/adhesion layer 114 using a low energy ion implantation. According to the broader teachings of the present invention, depositing the seed layer 116 on the barrier/adhesion layer 114 includes depositing a seed layer 116 selected from the group consisting of aluminum, copper, silver, and gold. However, according to the teachings of the present embodiment, depositing the seed layer 116 includes depositing a layer of copper 116 having a thickness of approximately a 100 Å. This can be achieved using an $8 \times 10^{16}$ ion implant of copper. According to the teachings of the present invention, using a low energy ion implantation includes implanting the layer of copper 116 at 100 electron volts (eV) into the surface of the trenches 110 in the polymer layer. Also the layer of copper 116 is implanted at an angle normal to the wafer's surface, as shown by arrows 115. As one of ordinary skill in the art will understand upon reading this disclosure, implanting the layer of copper 116 at an angle normal to the planarized surface results in the seed layer of copper 116 remaining on a bottom surface 118 in the number of trenches 110 and to a much lesser extent on the side surfaces 117 of the number of trenches 110. In one embodiment, an optional layer of aluminum 121 is deposited over the copper seed layer 116 again using a low energy ion implantation of 100 electron volts (eV). The optional layer of aluminum 121 is deposited to have a thickness of approximately a 50 Å. This can be achieved using a $3\times10^{16}$ ion implant of aluminum normal to the wafer surface. As one of ordinary skill in the art will understand upon reading this disclosure, the layer of aluminum 121 is used to protect the copper seed layer 116 from oxidation prior to subsequent processing steps. The structure is now as shown in FIG. 1D.

Figure 1E:
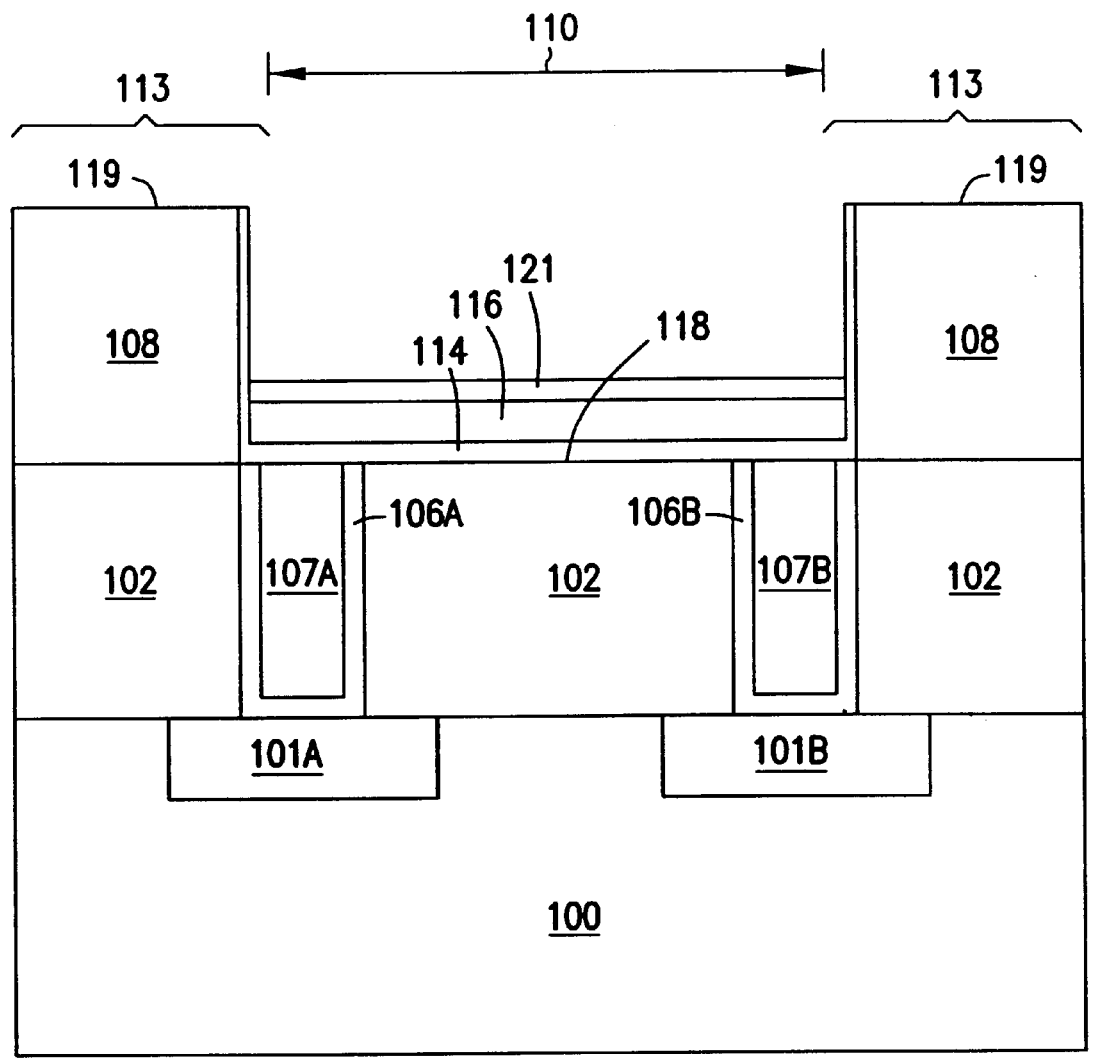

FIG. 1E illustrates the structure after the next sequence of process steps. As one of ordinary skill in the art will understand upon reading this disclosure, the residual photoresist layer 112 has served as a blocking layer to define the implant areas for the barrier/adhesion layer 114, the seed layer 116, and the layer of aluminum 121. The residual photoresist layer 112 is now removed using a wet strip process, as the same will be understood by one of ordinary skill in the art upon reading this disclosure. According to the teachings of the present invention, removing the residual photoresist layer 112 includes removing the unwanted aluminum layer 121, the unwanted seed layer 116, and the unwanted barrier/adhesion layer 114 from other areas of the wafer's surface, e.g., from over a number of regions 113 outside of the trenches 110 on a top surface 119 of the first insulator layer 108. The structure is now as shown in FIG. 1E.

Figure 1F:
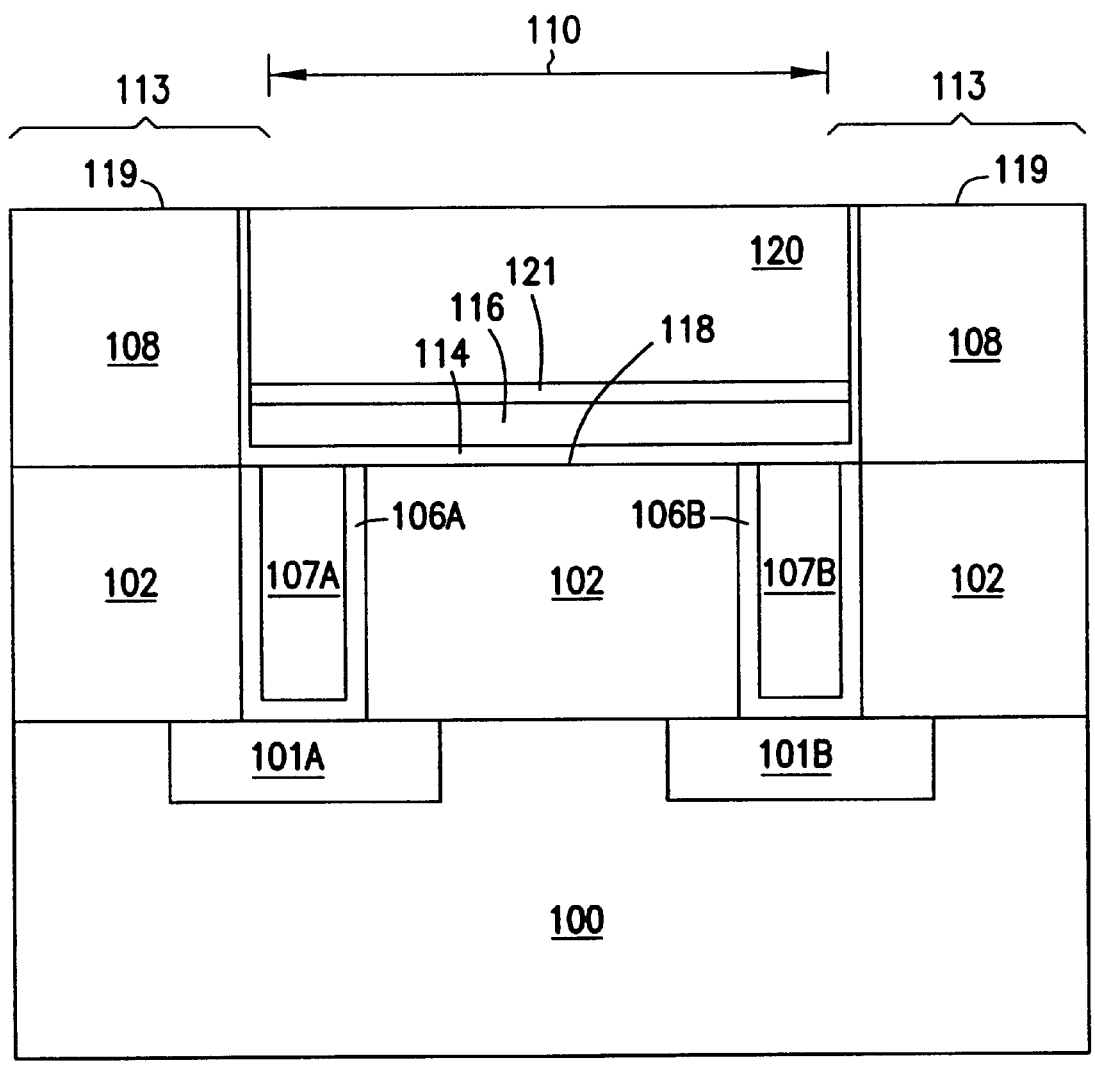

In FIG. 1F, a metallic conductor 120, or number of first level metal lines 120, is deposited over the seed layer 116 in the number of trenches 110. According to teachings of the present invention, metallic conductor 120, or number of first level metal lines 120, is selected from the group consisting of aluminum, copper, silver, and gold depending on the type of seed layer 116 which was deposited. According to this embodiment, the metallic conductor 120, or number of first level metal lines 120 are selectively formed on the copper seed layer 116 such that the number of copper metal lines 120, or first level copper metal lines 120 are not formed on the top surface 119 of the first insulator layer 108. In one embodiment, the metallic conductor 120, or number of first level metal lines 120, is deposited using a selective CVD process. In another embodiment, depositing a metallic conductor 120, or number of first level metal lines 120, over the seed layer 116 includes depositing a metallic conductor 120 using electroless plating. Electroless copper plating is used to deposit sufficient copper to fill the number of trenches 110 to the top surface 119 of the first insulator layer 108.

Figure 1G:
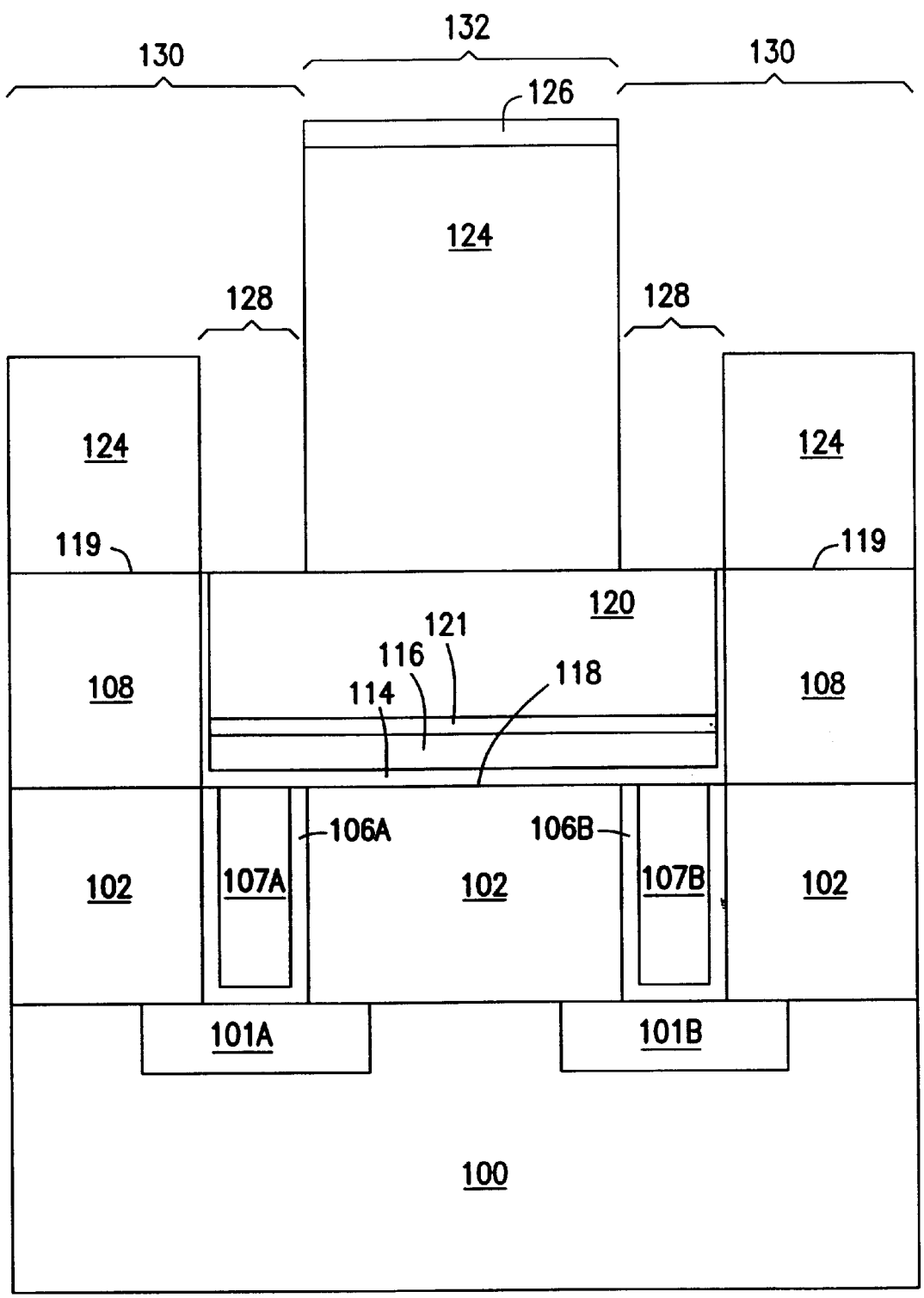

As shown in FIG. 1G, the process sequence may be continued to form any number of subsequent metal layers in a multilayer wiring structure. FIG. 1G illustrates the structure after the next sequence of processing steps. In FIG. 1G, a dual damascene process is used to define and fill a first to a second level of vias and a second level metallurgy. To do so, a second polymer layer 124, or second layer of polyimide 124, is deposited over the wafer surface, e.g. the metallic conductor 120, or number of first level metal lines 120, and the first polymer layer 108. The second polymer layer 124 may similarly be deposited using, for example, the process and material described in co-pending and commonly assigned U.S. application Ser. No. 09/128,859, entitled "Copper Metallurgy in Integrated Circuits," which is hereby incorporated by reference. In one embodiment, depositing a second polymer layer 124 includes depositing a foamed second polymer layer 124. In one embodiment, the second polymer layer 124 is deposited and cured, forming a 10,000 Å thick second polymer layer 124 after curing. As one of ordinary skill in the art will understand, upon reading this disclosure, other suitable thickness for the second polymer layer 124, or second insulator layer/material 124, may also be deposited as suited for forming a first to a second level of vias, e.g. second level vias, and a number of second level metal lines, the invention is not so limited. The second polymer layer 124, or second insulator layer/material 124 is patterned to define a second level of vias and a number of second level metal lines in the second insulator layer/material 124 opening to the metallic conductor 120, or number of first level metal lines 120. In other words, a second level of vias is defined in a second mask layer of photoresist 126 and then the second polymer layer 124 is etched, using any suitable process, e.g. reactive ion etching (RIE), such that a second level of via openings 128 are defined in the polyimide. Using the dual damascene process, a number of second level metal lines are also defined in a second mask layer of photoresist 126 and the second polymer layer 124 is again etched, using any suitable process, e.g. reactive ion etching (RIE), such that a second level of metal line trenches 130 are defined in the polyimide. One of ordinary skill in the art will understand upon reading this disclosure, the manner in which a photoresist layer 126 can be mask, exposed, and developed using a dual damascene process to pattern a second level of via openings 128 and a second level of metal line trenches 130 in the second insulator layer/material 124.

As described previously, and according to the teachings of the present invention, a residual photoresist layer 126 is left in place on the second insulator layer/material 124 in a number of regions 132 outside of the second level of metal line trenches 130. A suitable plasma and/or wet cleaning process is used to remove any contaminates from the second level of via openings 128 and a second level of metal line trenches 130, as the same will be understood by one of ordinary skill in the art upon reading this disclosure. The structure is now as appears in FIG. 1G.

Figure 1H:
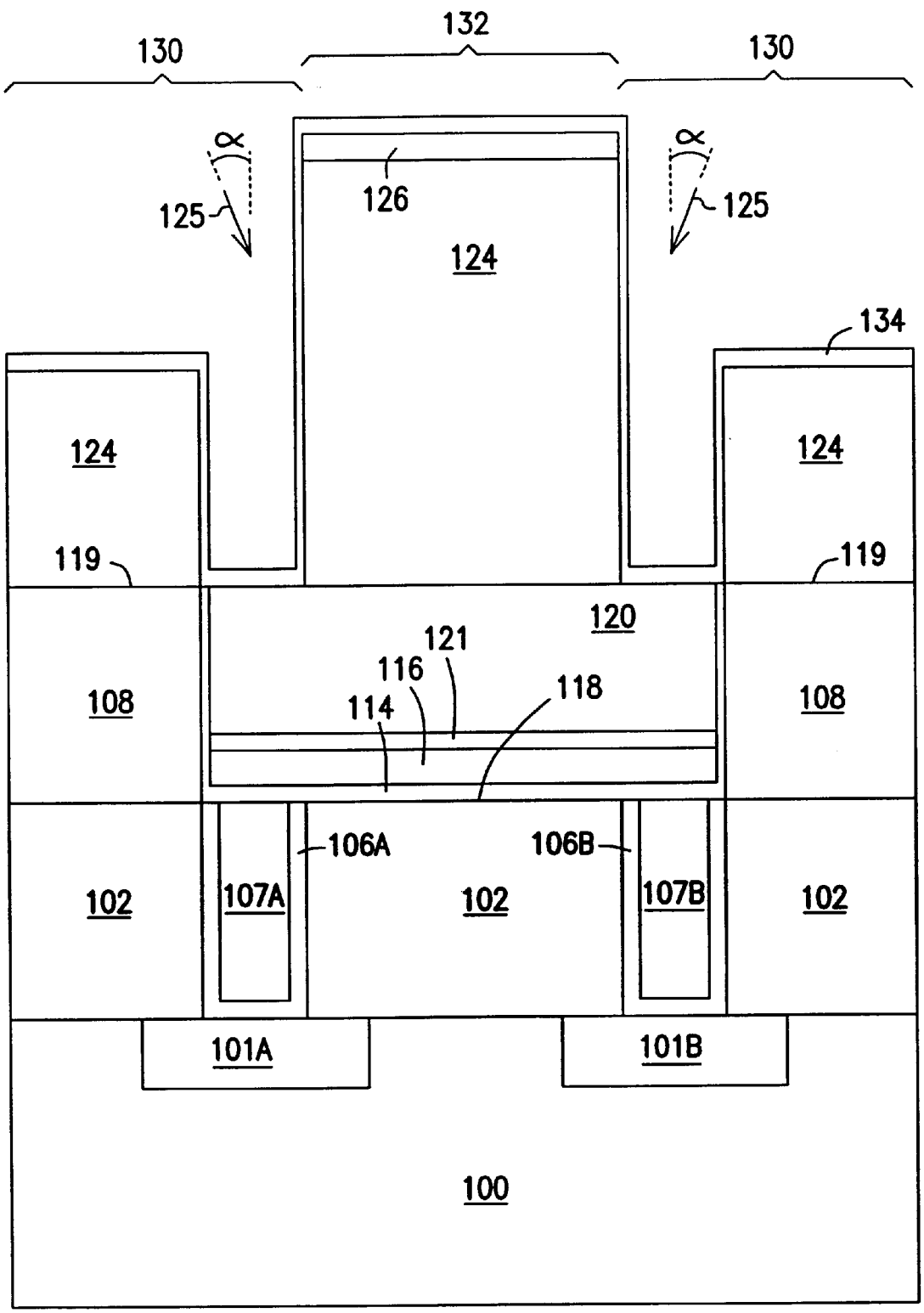

FIG. 1H illustrates the structure 100 after the next sequence of processing steps. In FIG. 1H, a second barrier/adhesion layer 134 is deposited in the second level of via openings 128 and a second level of metal line trenches 130 using a low energy ion implantation. As described above, in one embodiment according to the teachings of the present invention, depositing the second barrier/adhesion layer 134 includes depositing a layer of zirconium 134 having a thickness of approximately 5 to 100 Å. In alternate embodiments, depositing the second barrier/adhesion layer 134 includes depositing a barrier/adhesion layer 134 of titanium and/or hafnium. In one embodiment, depositing the layer of zirconium 134 includes depositing a layer of zirconium 134 having a thickness of approximately 50 Å. In one embodiment, this is achieved using a $10^{17}$ ion implant of zirconium. According to the teachings of the present invention, the layer of zirconium 134 is implanted at 100 electron volts (eV) into the surface of the second level of via openings 128 and a second level of metal line trenches 130 in the second polymer layer 124 using a varying angle, as shown by arrows 125, implant where the angle of implantation is changed from normal to the wafer surface to 15 degrees off normal. As one of ordinary skill in the art will understand upon reading this disclosure, using a varying angle implant, where an angle of implantation is changed from normal to the wafer surface to approximately 15 degrees off normal deposits the barrier/adhesion layer 134 on all surfaces in the second level of via openings 128 and a second level of metal line trenches 130. The structure is now as appears in FIG. 1H.

FIG. 1I illustrates the structure 100 after the next sequence of processing steps. In FIG. 1I, a second seed layer 136 is deposited on the second barrier/adhesion layer 134 using a low energy ion implantation. According to the broader teachings of the present invention, depositing the second seed layer 136 on the second barrier/adhesion layer 114 includes depositing a second seed layer 136 selected from the group consisting of aluminum, copper, silver, and gold. However, according to the teachings of the present embodiment, depositing the second seed layer 136 includes depositing a second layer of copper 136 having a thickness of approximately a 100 Å. In one embodiment, this is achieved using an $8 \times 10^{16}$ ion implant of copper. According to the teachings of the present invention, using a low energy ion implantation includes implanting the layer of copper 136 at 100 electron volts (eV) into the surfaces of the second level of via openings 128 and the polymer layer. Also the layer of copper 136 is implanted at an angle normal to the wafer's surface as shown by arrows 137. As one of ordinary skill in the art will understand upon reading this disclosure, implanting the layer of copper 136 at an angle normal to the planarized surface results in the second seed layer of copper 136 remaining on a bottom surface 138 in the second level of via openings 128 and second level of metal line trenches 130 and to a much lesser extent on the side surfaces 140 of the second level of via openings 128 and a second level of metal line trenches 130. In one embodiment, an optional layer of aluminum 141 is deposited over the second copper seed layer 136 again using a low energy ion implantation of 100 electron volts (eV). The optional layer of aluminum is deposited to have a thickness of approximately a 50 Å. In one embodiment, this is achieved using a $3 \times 10^{16}$ ion implant of aluminum normal to the wafer surface. As one of ordinary skill in the art will understand upon reading this disclosure, the layer of aluminum 141 is used to protect the second copper seed layer 136 from oxidation prior to subsequent processing steps.

Figure 1J:
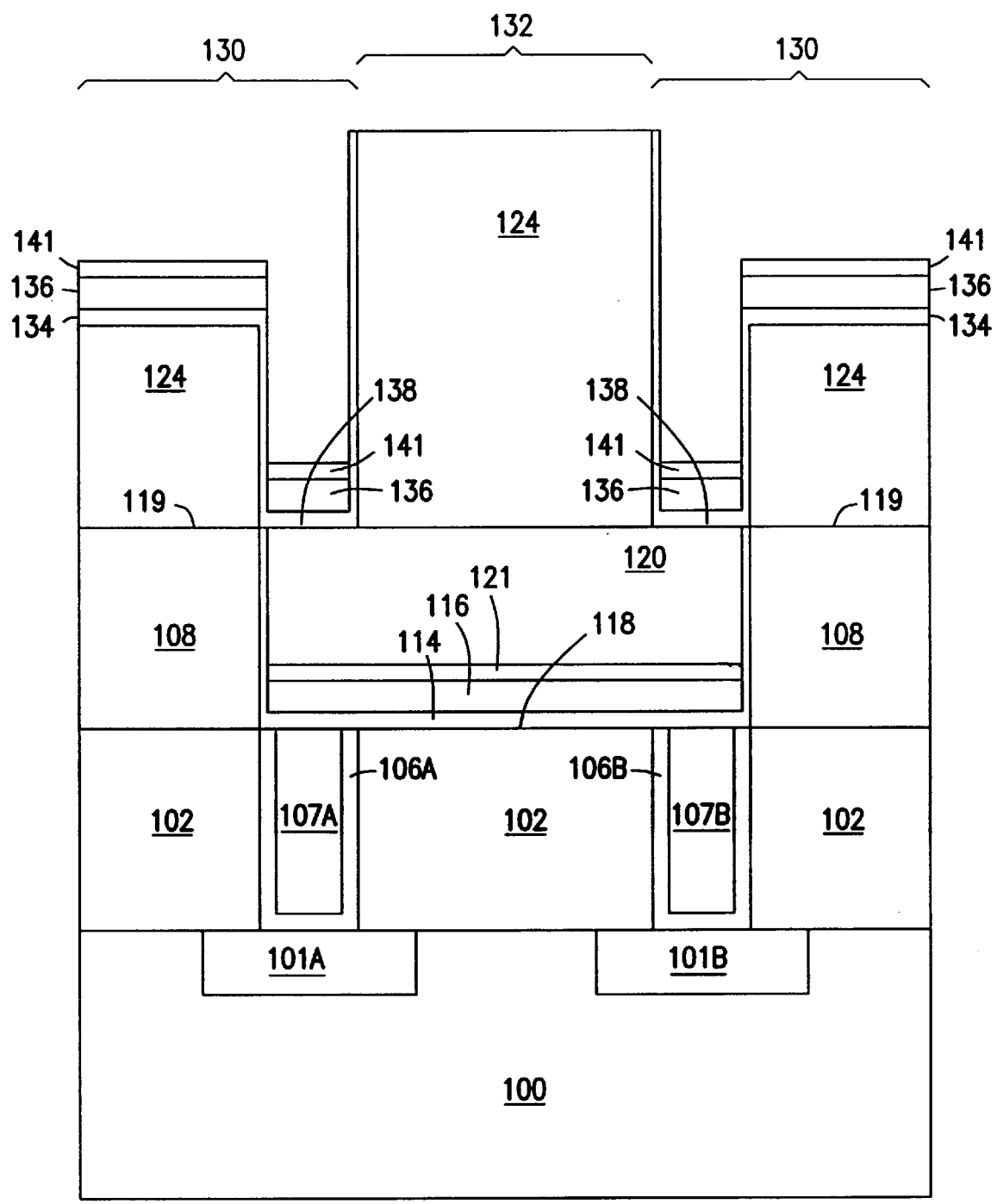

FIG. 1J illustrates the structure after the next sequence of processing steps. As one of ordinary skill in the art will understand upon reading this disclosure, the residual photoresist layer 126 has served as a blocking layer to define the implant areas for the second barrier/adhesion layer 134, the second seed layer 136, and the aluminum layer 141. The residual photoresist layer 126 is now removed using a wet strip process, as the same will be understood by one of ordinary skill in the art upon reading this disclosure. According to the teachings of the present invention, removing the residual photoresist layer 126 includes removing the unwanted aluminum layer 141, the unwanted seed layer 136, and the unwanted barrier/adhesion layer 134 from other areas of the wafer's surface, e.g. from over a number of regions 132 outside of second level of metal line trenches 130 on a top surface 142 of the second insulator layer 124. The structure is now as shown in FIG. 1J.

Figure 1K:
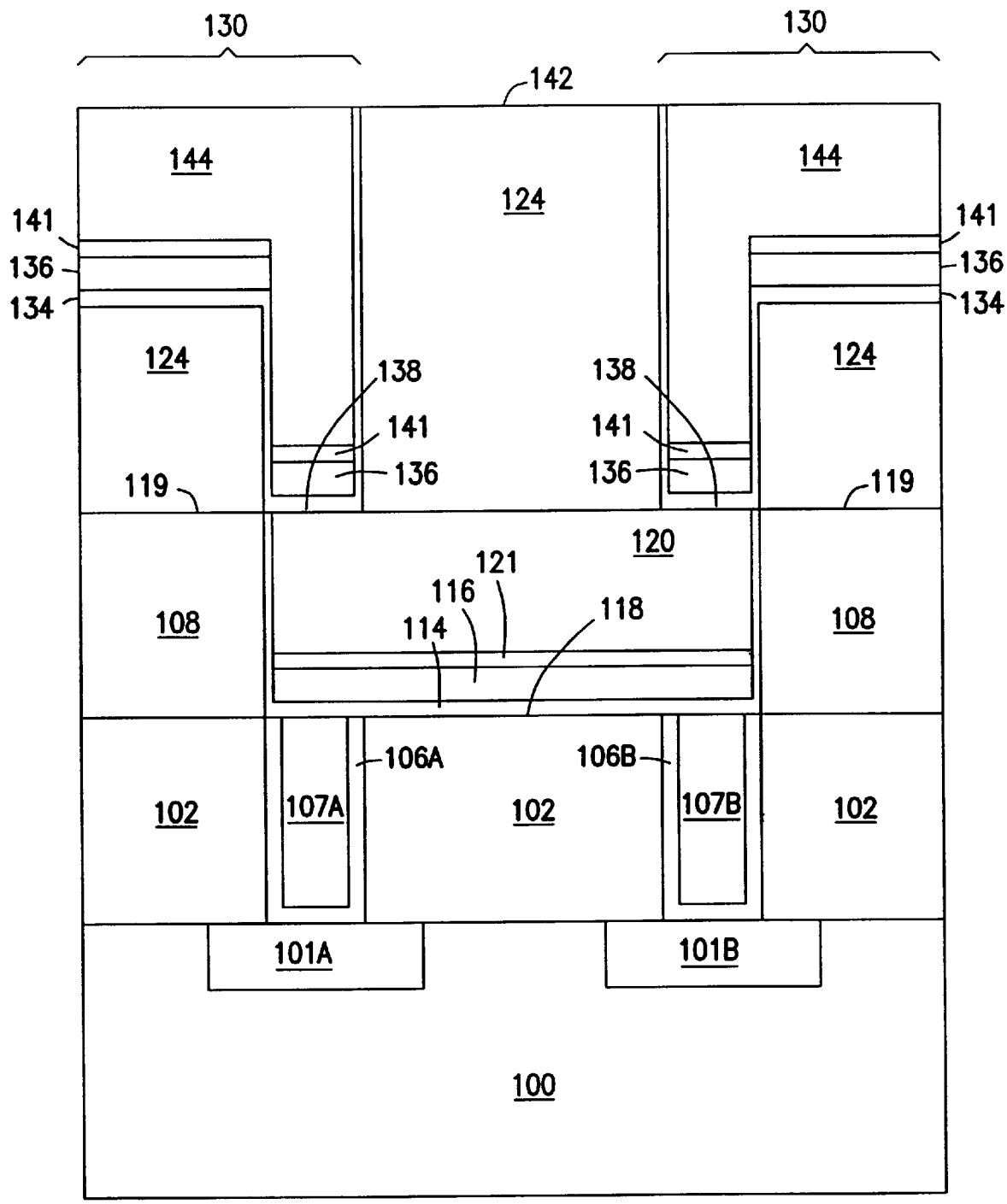

In FIG. 1K, a second metallic conductor 144, or second core conductor 144, is deposited over or formed on the second seed layer 136 and within the second barrier/adhesion layer 134 in the second level of via openings 128 and the second level of metal line trenches 130 in the polymer layer. In this embodiment the second metallic conductor 144, or second core conductor 144, is copper, but in other embodiments of the present invention can be selected from the group consisting of aluminum, silver, and gold. In one embodiment, the second metallic conductor 144, or second core conductor 144, is deposited using a selective CVD process such that the second metallic conductor 144, or second core conductor 144 is not formed on a top surface 142 of the second insulator layer 124. In another embodiment, depositing a second metallic conductor 144, or second core conductor 144, over on the second seed layer 136 and within the second barrier/adhesion layer 134 includes depositing a second metallic conductor 144, or second core conductor 144, using electroless plating. Electroless copper plating is used to deposit sufficient copper to fill the second level of via openings 128 and the second level of metal line trenches 130 to the top surface 142 of the second insulator layer 124. Thus, the second barrier/adhesion layer 134, the second seed layer 136, and the second metallic conductor 144, or second core conductor 144, constitute a second number of conductive structures which includes a number of second level vias and a number of second level metal lines which are formed over and connect to a first number of conductive structures, e.g. the first level metal lines 120.

Embodiment of a Metal Interconnect using Aluminum Metal Lines and Oxide Insulators FIGS. 2A–2K illustrate a novel methodology for the formation of metal interconnects and/or a wiring structure in an integrated circuit according to the teachings of the present invention. The novel methodology includes the novel formation of a barrier/adhesion layer and a seed layer in an integrated circuit using a low energy ion implantation. The novel methodology also encompasses a novel method of making copper, silver, aluminum, or gold interconnect for an integrated circuit.

Figure 2A:
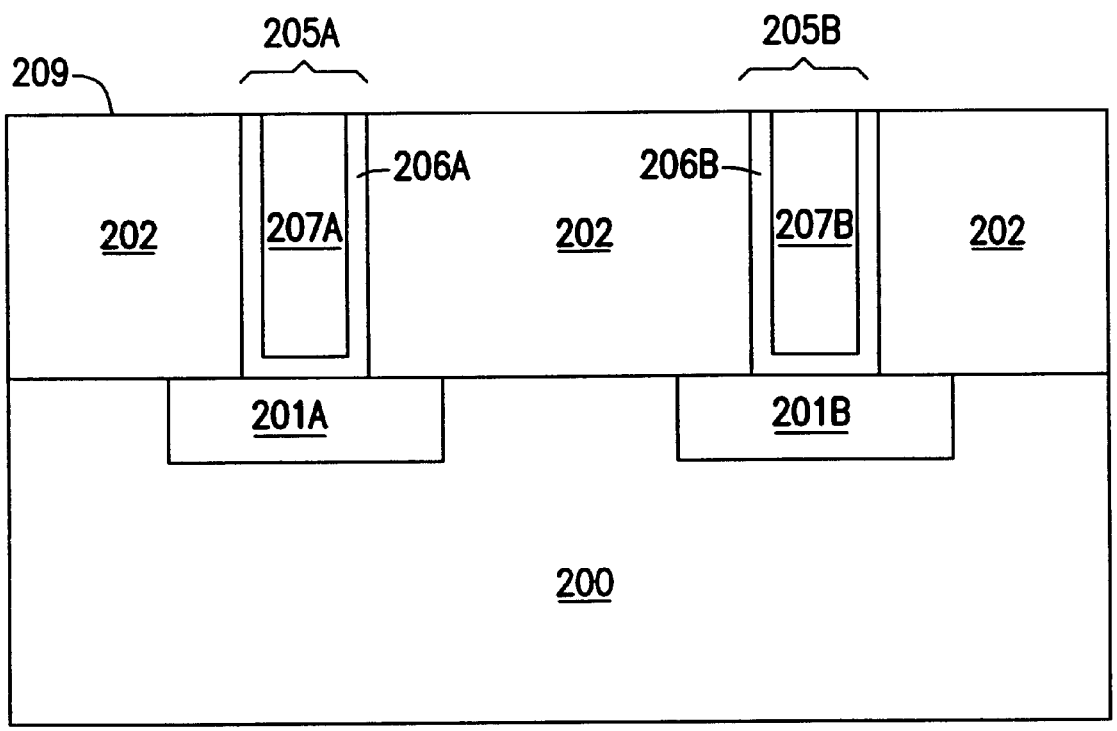

FIG. 2A illustrates a portion of an integrated circuit structure, namely an integrated circuit having a number of semiconductor devices formed in a substrate as described above in connection with FIG. 1A. That is, FIG. 2A illustrates the structure after a device structure is formed in the substrate and the contact structure to the device structure is in place. Like FIG. 1A, FIG. 2A illustrates the structure after a number of device structures, e.g. transistor 201A and 201B are formed in the substrate 200. An insulator layer 202 is deposited over the number of semiconductors 201A and 201B. The deposition of the insulator layer 202 can include depositing a layer of $Si_3N_4$ having a thickness in the range of 100 to 500 Angstroms (Å). This insulator layer will also serve as an additional barrier to impurities coming from subsequent processing steps. Contact holes 205A and 205B are opened to the number of device structures 201A and 201B using a photolithography technique. One of ordinary skill in the are will understand, upon reading this disclosure, the manner in which a photolithography technique can be used to create contact holes 205A and 205B. In one embodiment of the present invention a titanium silicide liner 206A and 206B is placed in the contact holes 205A and 205B, such a through a process such as chemical vapor deposition (CVD). Next, tungsten vias 207A and 207B can be deposited in the contact holes 205A and 205B. The tungsten vias 207A and 207B can be deposited in the contact holes using any suitable technique such as using a CVD process. The excess tungsten is then removed from the wafer surface by chemical mechanical planarization (CMP) or other suitable processes to form a planarized surface 209.

Figure 2B:
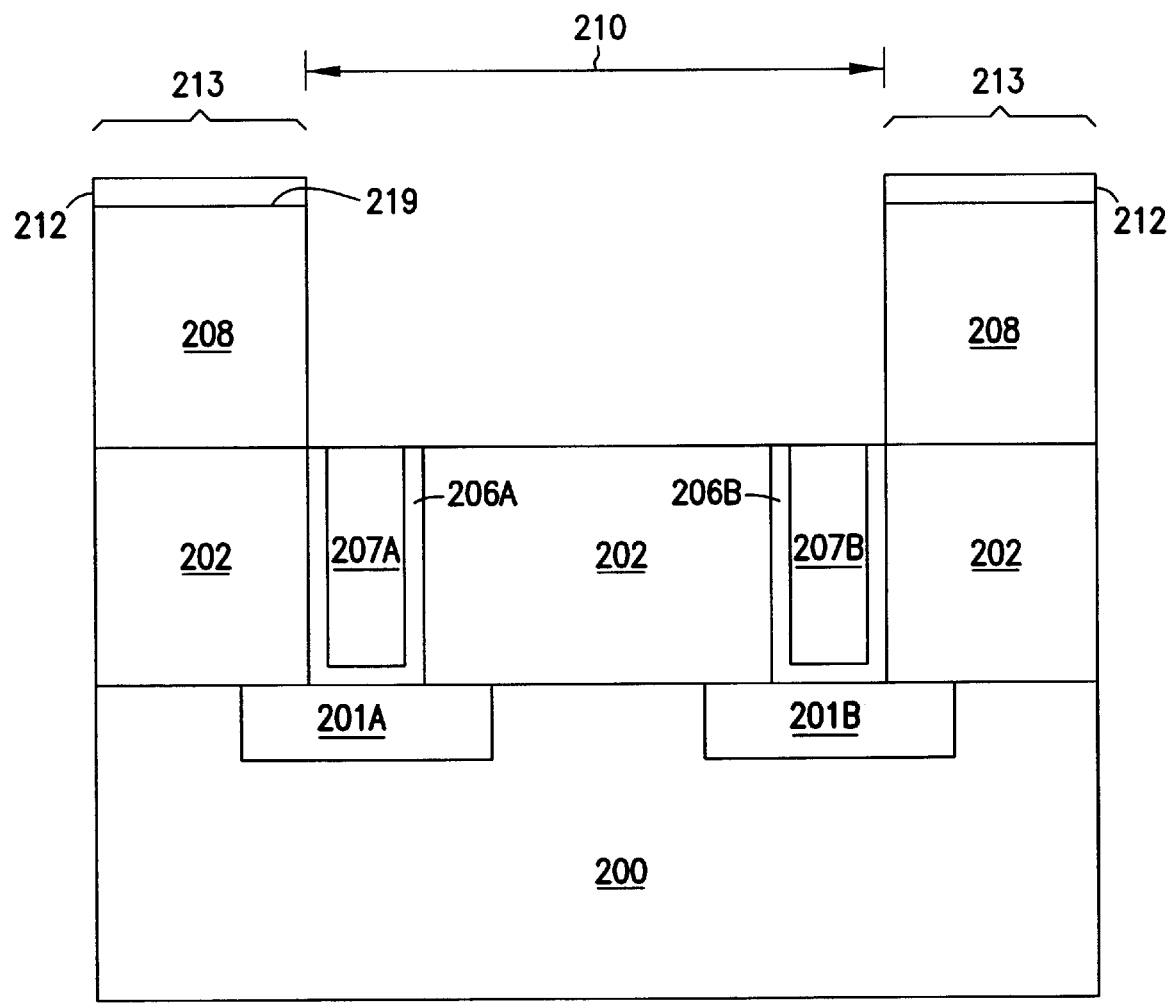

As shown in FIG. 2B, a first oxide layer 208, e.g. a silicon dioxide layer ($SiO_2$), is deposited over the wafer surface. In one embodiment, depositing a first oxide layer 208 includes depositing a fluorinated silicon oxide layer 208. The first oxide layer 208 may be deposited using any suitable technique, such as, for example, using a CVD process. In one embodiment, depositing a first oxide layer 208 having a thickness of approximately 5000 Å. As one of ordinary skill in the art will understand, upon reading this disclosure, other suitable thicknesses for the first oxide layer 208 may also be deposited as suited for forming a first level metal pattern, the invention is not so limited. The first oxide layer 208 is patterned to define a number of trenches 210 in the first oxide layer 208 opening to a number of first level vias, e.g. tungsten vias 207A and 207B in planarized surface 209. In other words, a first level metal pattern 210 is defined in a mask layer of photoresist 212 and then the first oxide layer 208 is etched, using any suitable process, e.g. reactive ion etching (RIE), such that the first level metal pattern 210 is defined in the first oxide layer 208. One of ordinary skill in the art will understand upon reading this disclosure that any desired first level metal pattern 210 can be created using a photolithography technique. According to the teachings of the present invention, a residual photoresist layer 212 is left in place on the first oxide layer 208 in a number of region 213 outside of the number trenches 210. The structure is now as appears in FIG. 2B.

Figure 2C:
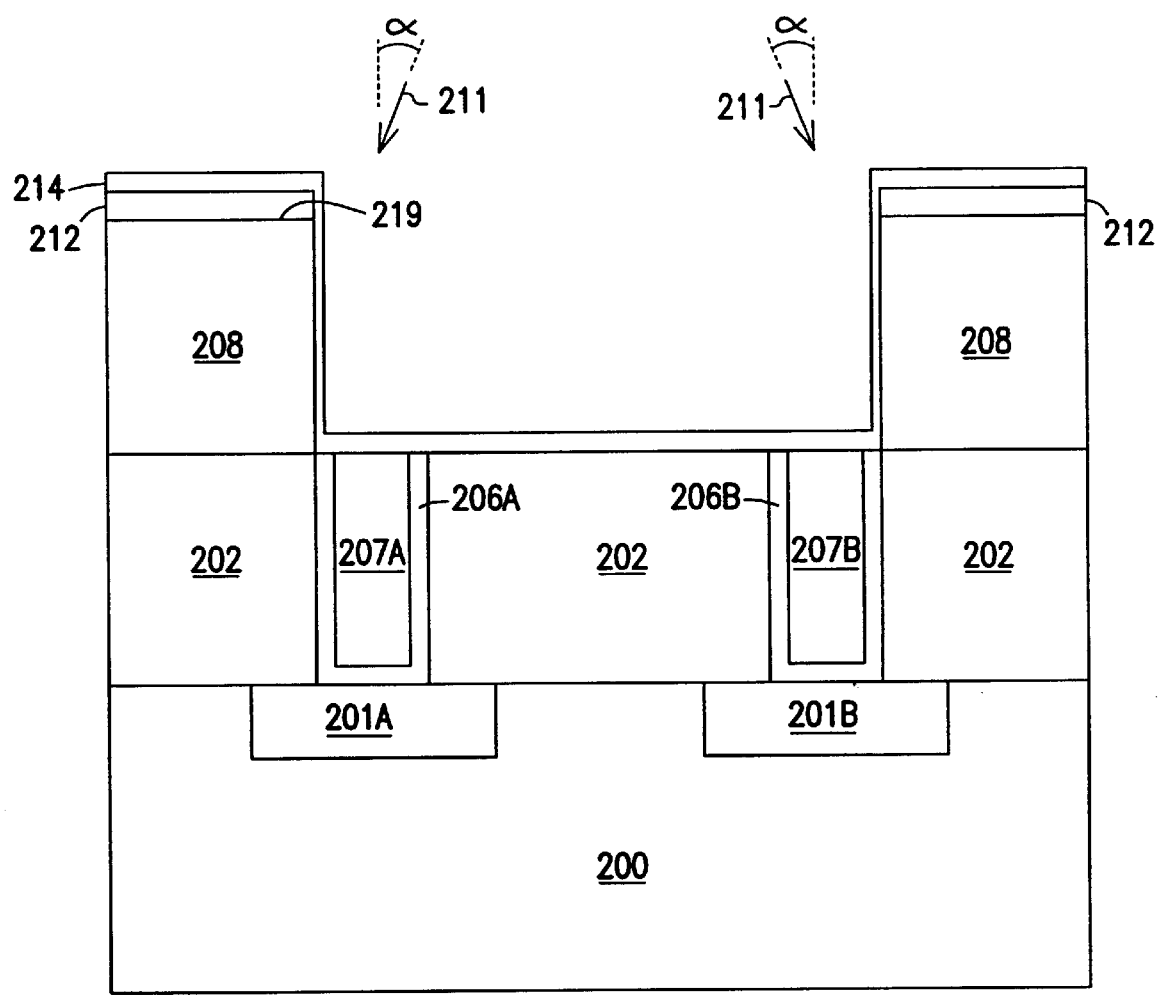

As shown in FIG. 2C, a first barrier/adhesion layer 214 is deposited in the number of trenches 210 using a low energy ion implantation. In one embodiment according to the teachings of the present invention, depositing the barrier/adhesion layer 214 includes depositing a layer of zirconium 214 having a thickness of approximately 5 to 100 Å. In alternate embodiments, depositing the barrier/adhesion layer 214 includes depositing a barrier/adhesion layer 214 of titanium and/or hafnium. In one embodiment, depositing the depositing a layer of zirconium 214 includes depositing a layer of zirconium 214 having a thickness of approximately 50 Å. This can be achieved using a $10^{17}$ ion implant of zirconium. According to the teachings of the present invention, the layer of zirconium 214 is implanted at 100 electron volts (eV) into the surface of the trenches 210 in the first oxide layer 208 using a varying angle implant ( ), as represented by arrows 211, where the angle of implantation is changed from normal to the wafer surface to 15 degrees off normal. As one of ordinary skill in the art will understand upon reading this disclosure, using a varying angle implant, where an angle of implantation ( ) is changed from normal to the wafer's surface to approximately 15 degrees off normal deposits the barrier/adhesion layer 214 on all surfaces in the number of trenches 210. The structure is now as appears in FIG. 2C.

Figure 2D:
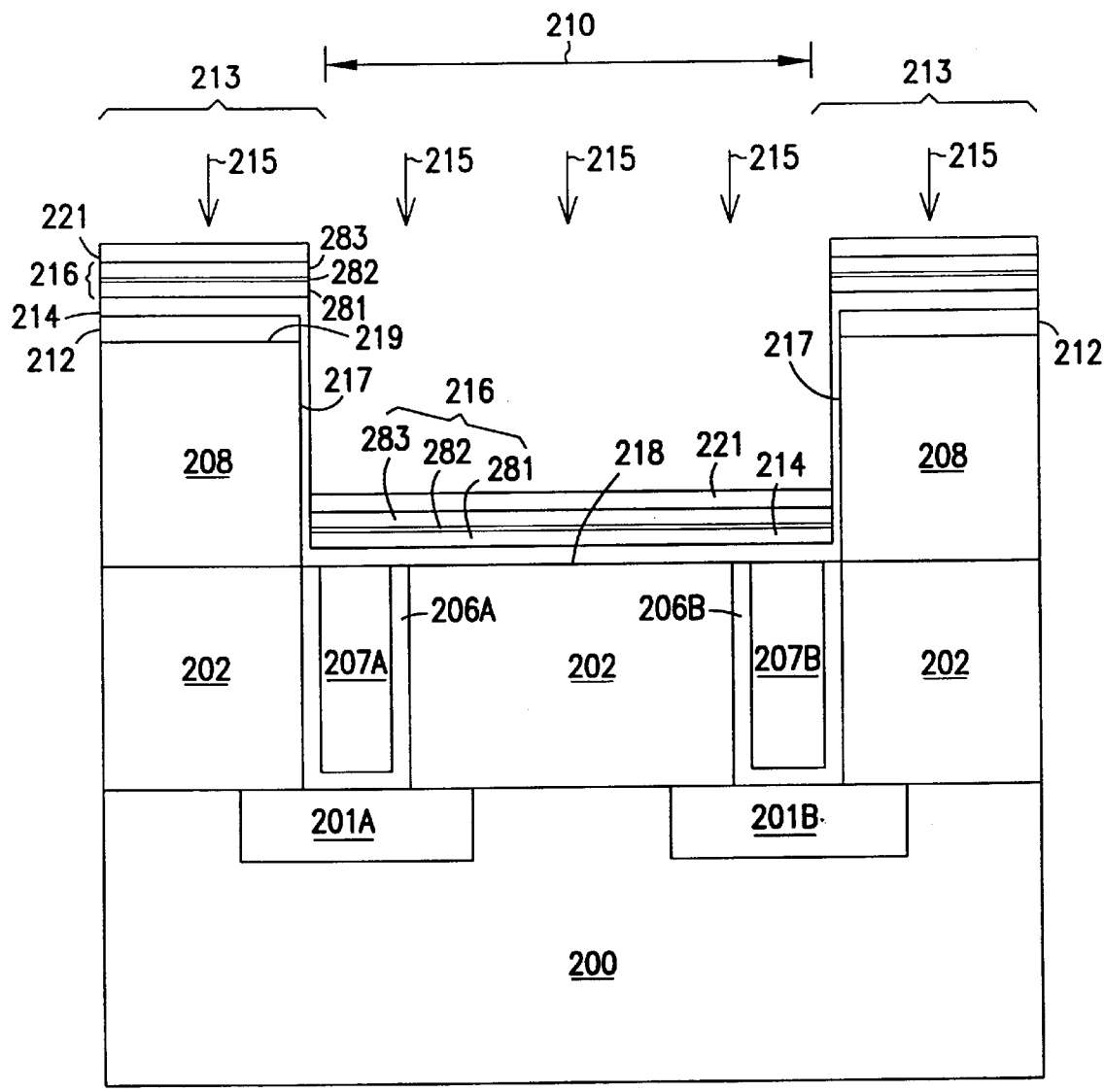

In FIG. 2D, a first seed layer 216 is deposited on the first barrier/adhesion layer 214 using a low energy ion implantation. According to the broader teachings of the present invention, depositing the seed layer 216 on the barrier/adhesion layer 214 includes depositing a first seed layer 216 selected from the group consisting of aluminum, copper, silver, and gold. However, according to the teachings of the present embodiment, depositing the seed layer 216 includes depositing a layer of an aluminum copper alloy 216 having a thickness of approximately 110 Å. This can be achieved by depositing a first layer of aluminum 281 on the barrier/adhesion layer 214 to a thickness of approximately 50 Å using a low energy ion implantation of approximately 100 electron volts (eV). A layer of copper 282 is then deposited on the first layer of aluminum 281 to a thickness of approximately 10 Å using a low energy ion implantation of approximately 100 eV. A second layer of aluminum 283 is then deposited on the layer of copper 282 to a thickness of approximately 50 Å using a low energy ion implantation of approximately 100 eV. Also the first seed layer 216 is implanted at an angle normal to the planarized surface, as shown by arrows 215. As one of ordinary skill in the art will understand upon reading this disclosure, implanting the first seed layer 216 at an angle normal to the planarized surface results in the first seed layer 216 remaining on a bottom surface 218 in the number of trenches 210 and to a much lesser extent on the side surfaces 217 of the number of trenches 210.

Figure 2E:
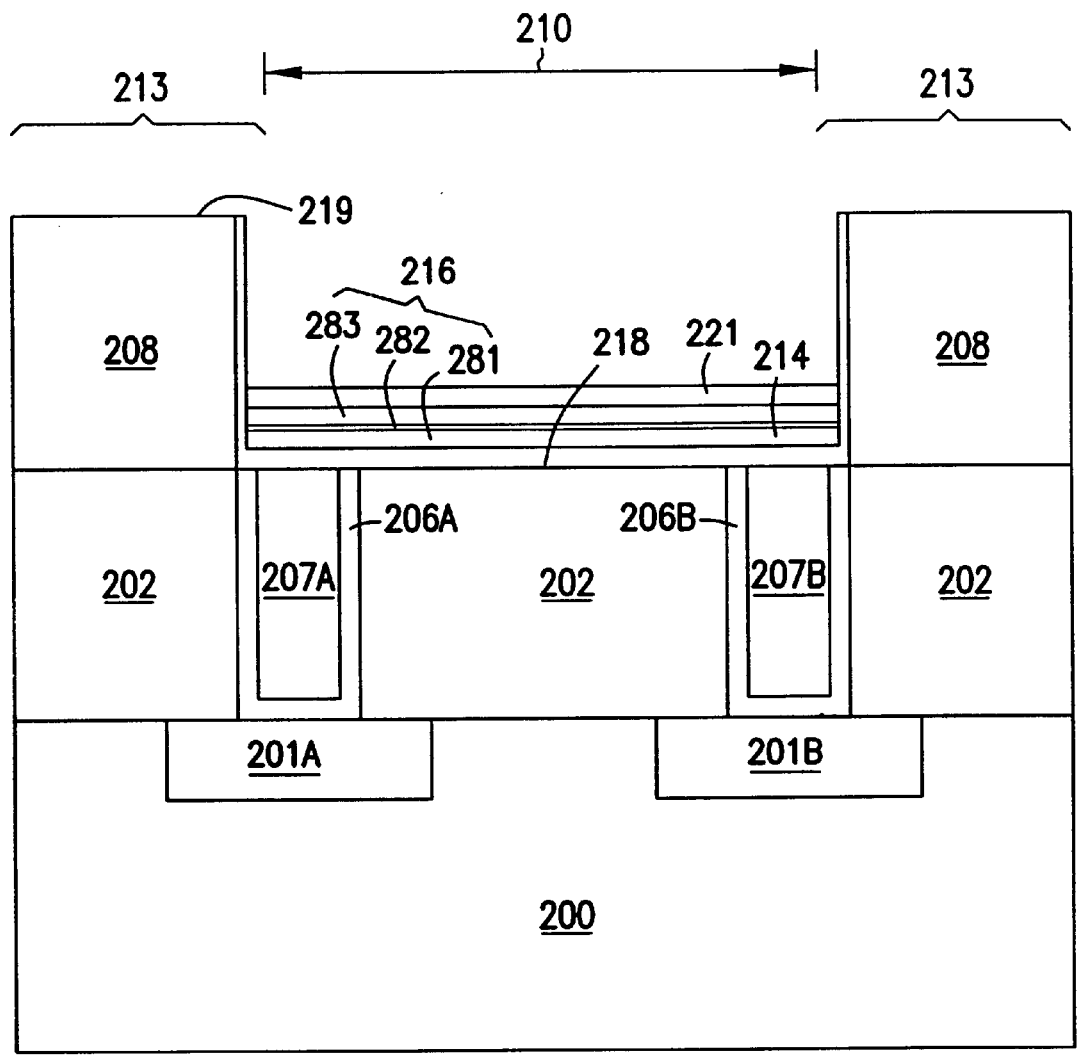

FIG. 2E illustrates the structure after the next sequence of processing steps. As one of ordinary skill in the art will understand upon reading this disclosure, the residual photoresist layer 212 has served as a blocking layer to define the implant areas for the barrier/adhesion layer 214 and the seed layer 216. The residual photoresist layer 212 is now removed using a wet strip process, as the same will be understood by one of ordinary skill in the art upon reading this disclosure. According to the teachings of the present invention, removing the residual photoresist layer 212 includes removing the unwanted seed layer 216 and the unwanted barrier/adhesion layer 214 from other areas of the wafer's surface, e.g. from over a number of regions 213 outside of the trenches 210 on a top surface 219 of the first insulator layer 208. The structure is now as shown in FIG. 2E.

Figure 2F:
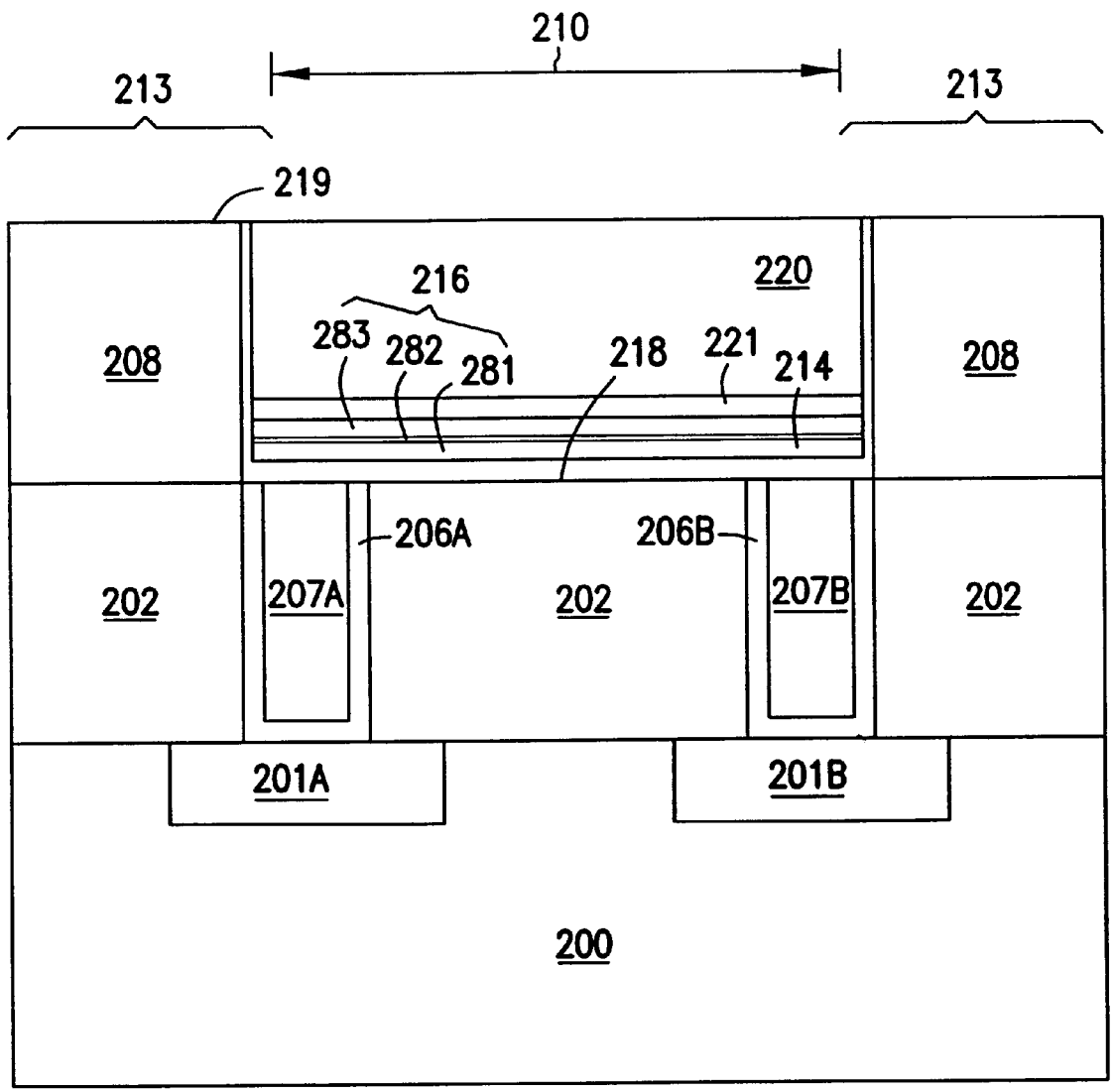

In FIG. 2F, a metallic conductor 220, or number of first level metal lines 220, is deposited over the first seed layer 216 and within the first barrier/adhesion layer 214 in the number of trenches 210. In this embodiment, the metallic conductor 220, or number of first level metal lines 220, is aluminum, but in other embodiments of the present invention the metallic conductor 220, or number of first level metal lines 220, is selected from the group consisting of copper, silver, and gold depending on the type of seed layer 216 which was deposited. In one embodiment, the metallic conductor 220, or number of first level metal lines 220, is deposited using a selective CVD process. In another embodiment, depositing a metallic conductor 220, or number. of first level metal lines 220, over the seed layer 216 includes depositing a metallic conductor 220 using electroless plating. According to the teachings of the present invention the number of first level aluminum metal lines 220, is deposited to fill the number of trenches 210 to the top surface 219 of the first oxide layer 208. Thus, the first level aluminum metal lines 220, the first seed layer 216, and the first barrier/adhesion layer 214 in the number of trenches 210 constitute a first number of conductive structures. The copper composition of the first seed layer 216 can be adjusted to give the appropriate percentage of copper in the completed first number of conductive structures. For example, in the above described embodiment the layer thicknesses of the aluminum copper sandwich was designed to give a 0.7 weight percent of copper in the first number of conductive structures.

Figure 2G:
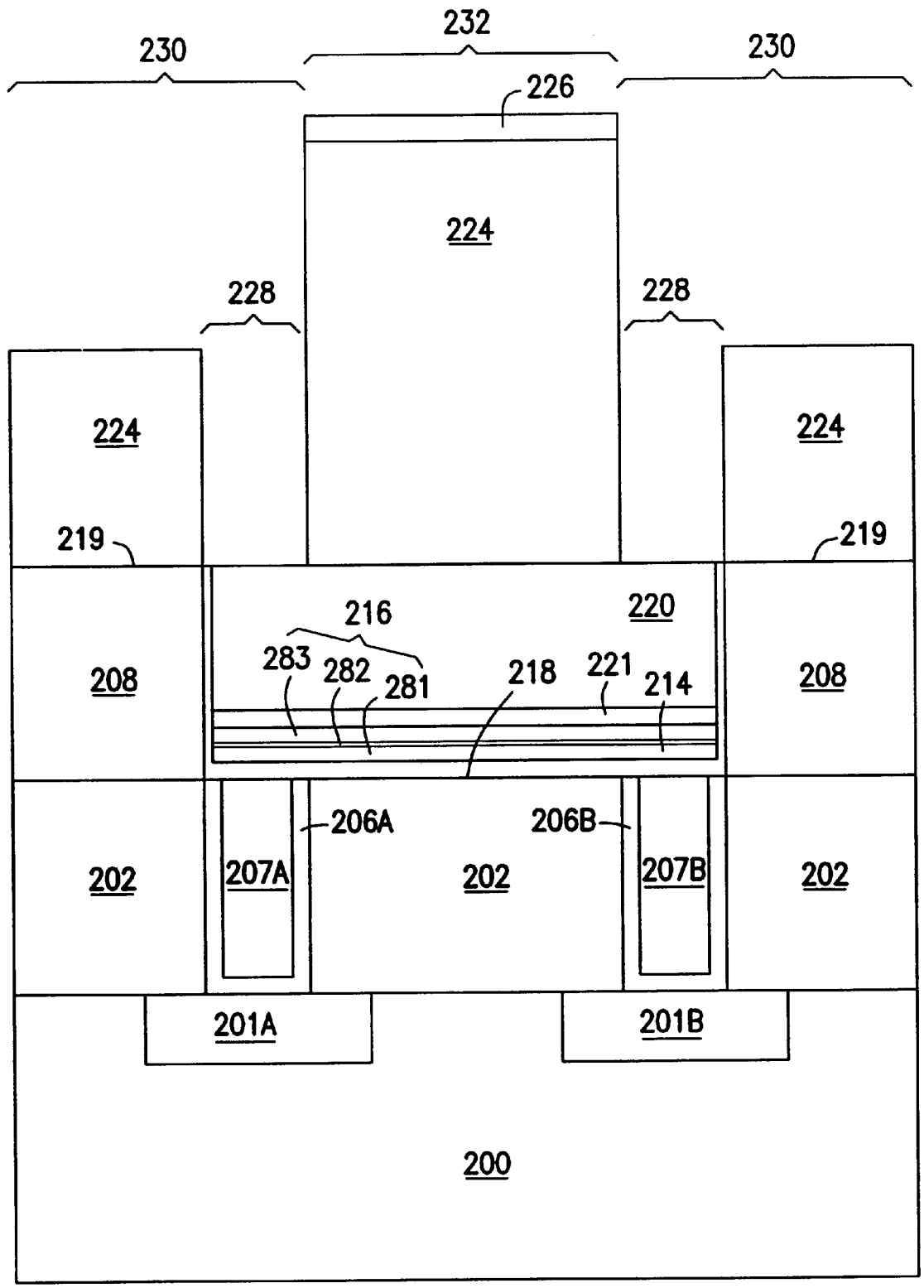

As shown in FIG. 2G, the process sequence may be continued to form any number of subsequent metal layers in a multilayer wiring structure. FIG. 2G illustrates the structure after the next sequence of processing steps. In FIG. 2G, a dual damascene process is used to define and fill a first to a second level of vias and a second level metallurgy. To do so, a second oxide layer 224 is deposited over the wafer surface, e.g. the metallic conductor 220, or number of first level metal lines 220, and the first oxide layer 208. In one embodiment, depositing a second oxide layer 224 includes depositing a second fluorinated silicon oxide layer 224. In one embodiment, the second oxide layer 224 is formed to have a thickness of approximately 10,000 Å. As one of ordinary skill in the art will understand, upon reading this disclosure, other suitable thickness for the second oxide layer 224 may also be deposited as suited for forming a first to a second level of vias, e.g. second level vias, and a number of second level metal lines, the invention is not so limited. The second oxide layer 224 is patterned to define a second level of vias and a number of second level metal lines in the second oxide layer 224 opening to the metallic conductor 220, or number of first level metal lines 220. In other words, a second level of vias is defined in a second mask layer of photoresist 226 and then the second oxide layer 224 is etched, using any suitable process, e.g. reactive ion etching (RIE), such that a second level of via openings 228 are defined in the polyimide. Using the dual damascene process, a number of second level metal lines are also defined in a second mask layer of photoresist 226 and the second oxide layer 224 is again etched, using any suitable process, e.g. reactive ion etching (RIE), such that a second level of metal line trenches 230 are defined in the second oxide layer 224. One of ordinary skill in the art will understand upon reading this, disclosure, the manner in which a photoresist layer 226 can be mask, exposed, and developed using a dual damascene process to pattern a second level of via openings 228 and a second level of metal line trenches 230 in the second oxide layer 224.

As described previously, and according to the teachings of the present invention, a residual photoresist layer 226 is left in place on the second oxide layer 224 in a number of regions 232 outside of the second level of metal line trenches 230. A suitable plasma and/or wet cleaning process is used to remove any contaminates from the second level of via openings 228 and a second level of metal line trenches 230, as the same will be understood by one of ordinary skill in the art upon reading this disclosure. The structure is now as appears in FIG. 2G.

Figure 2H:
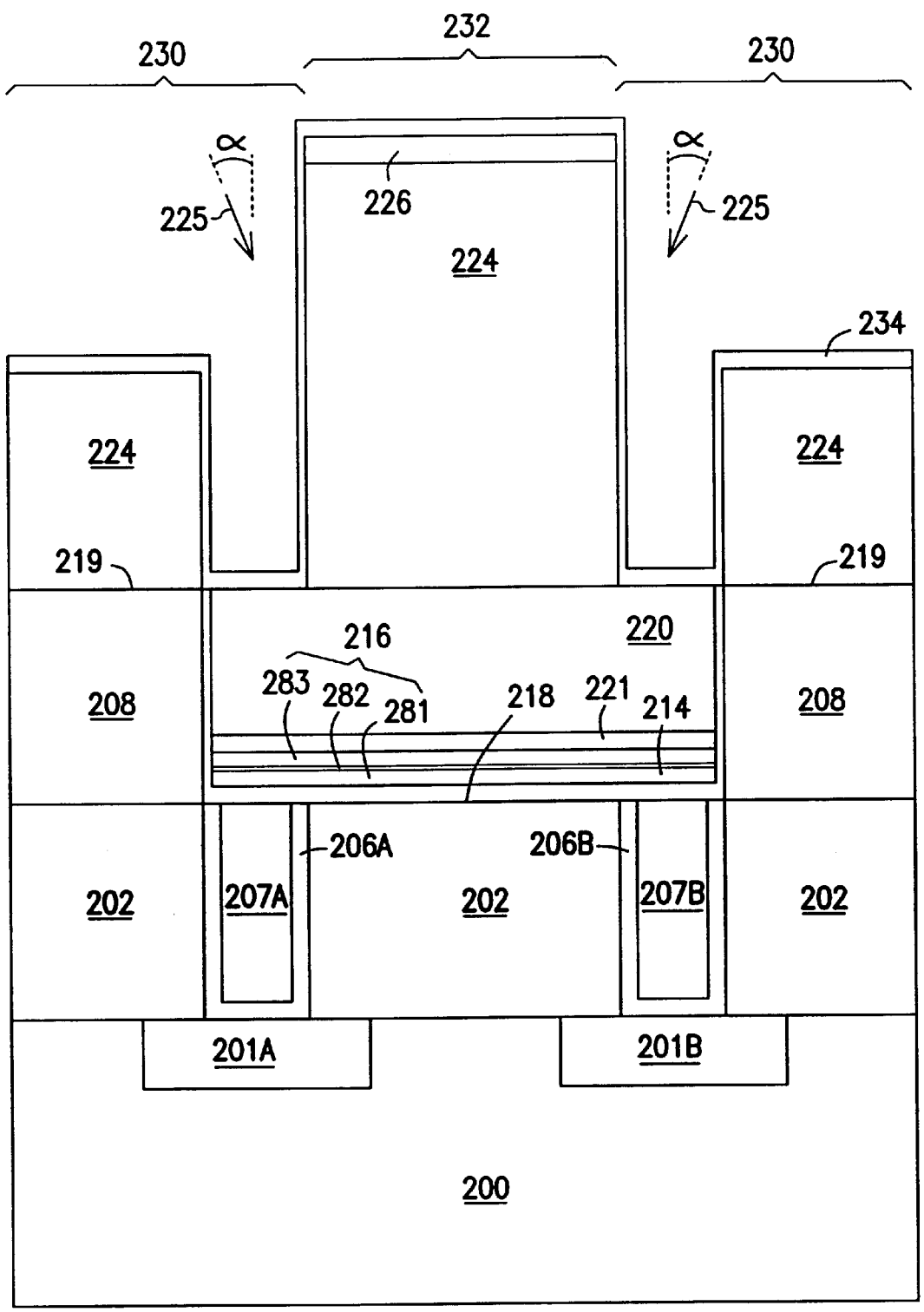
Figure 21:
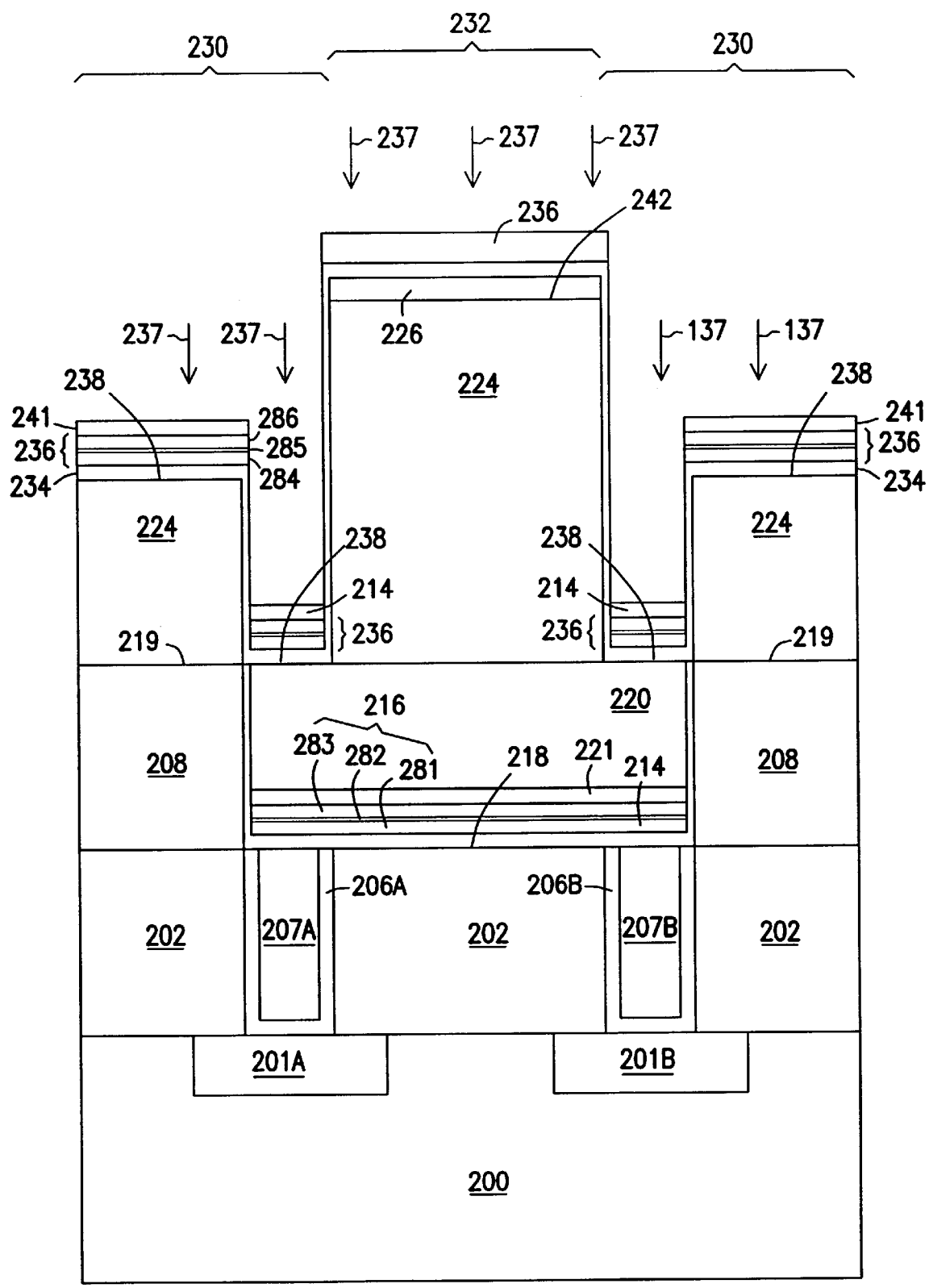

FIG. 2H illustrates the structure after the next sequence of processing steps. In FIG. 2H, a second barrier/adhesion layer 234 is deposited in the second level of via openings 228 and a second level of metal line trenches 230 using a low energy ion implantation. As described above, in one embodiment according to the teachings of the present invention, depositing the second barrier/adhesion layer 234 includes depositing a layer of zirconium 234 having a thickness of approximately 5 to 100 Å. In alternate embodiments, depositing the second barrier/adhesion layer 234 includes depositing a barrier/adhesion layer 234 of titanium and/or hafnium. In one embodiment, depositing the layer of zirconium 234 includes depositing a layer of zirconium 234 having a thickness of approximately 50 Å. In one embodiment, this is achieved using a $10^{17}$ ion implant of zirconium (that is $10^{17}$ ions per square centimeter). According to the teachings of the present invention, the layer of zirconium 234 is implanted at 100 electron volts (eV) into the surface of the second level of via openings 228 and a second level of metal line trenches 230 in the second polymer layer 224 using a varying angle implant ( ), as shown by arrows 225 where the angle of implantation is changed from normal to the wafer surface to 15 degrees off normal. As one of ordinary skill in the art will understand upon reading this disclosure, using a varying angle implant, where an angle of implantation, , is changed from normal to the wafer surface to approximately 15 degrees off normal deposits the barrier/adhesion layer 234 on all surfaces in the second level of via openings 228 and a second level of metal line trenches 230. The structure is now as appears in FIG. 2H.

FIG. 2I illustrates the structure after the next sequence of processing steps. In FIG. 2I, a second seed layer 236 is deposited on the second barrier/adhesion layer 234 using a low energy ion implantation. According to the broader teachings of the present invention, depositing the second seed layer 236 on the second barrier/adhesion layer 214 includes depositing a second seed layer 236 selected from the group consisting of aluminum, copper, silver, and gold. However, according to the teachings of the present embodiment, depositing the seed layer 216 includes depositing a layer of an aluminum copper alloy 216 having a thickness of approximately 110 Å. This can be achieved by depositing a first layer of aluminum 284 on the barrier/adhesion layer 214 to a thickness of approximately 50 Å using a low energy ion implantation of approximately 100 electron volts (eV). A layer of copper 285 is then deposited on the first layer of aluminum 284 to a thickness of approximately 10 Å using a low energy ion implantation of approximately 100 eV. A second layer of aluminum 286 is then deposited on the layer of copper 285 to a thickness of approximately 50 Å using a low energy ion implantation of approximately 100 eV. Also the first seed layer 216 is implanted at an angle normal to the wafer's surface as shown by arrows 237. As one of ordinary skill in the art will understand upon reading this disclosure, implanting the layer of copper 236 at an angle normal to the planarized surface results in the second seed layer of copper 236 remaining on a bottom surface 238 in the second level of via openings 228 and to a much lesser extent on the side surfaces 240 of the second level of via openings 228 and a second level of metal line trenches 230.

Figure 2J:
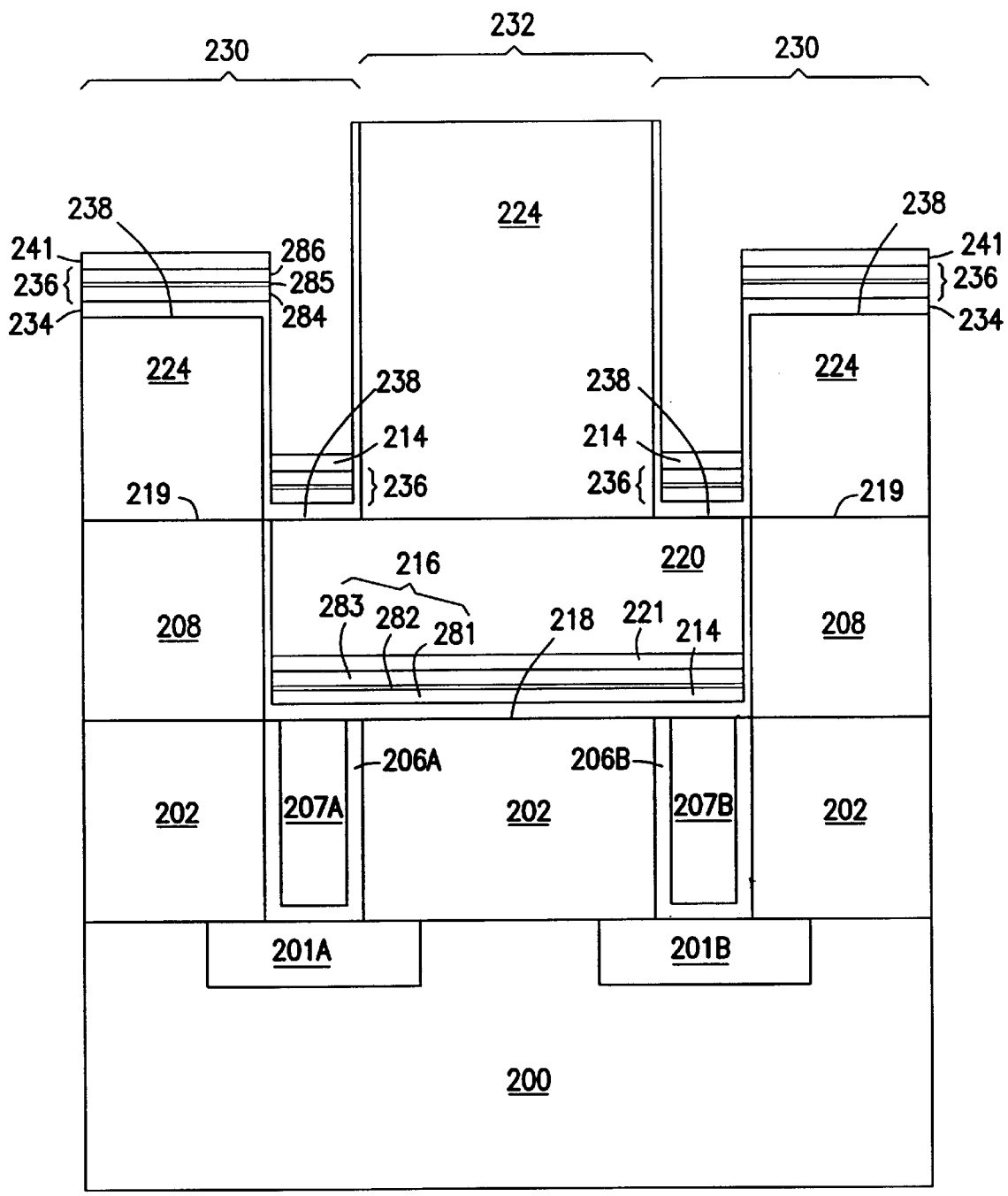

FIG. 2J illustrates the structure following the next sequence of process steps. As one of ordinary skill in the art will understand upon reading this disclosure, the residual photoresist layer 226 has served as a blocking layer to define the implant areas for the second barrier/adhesion layer 234 and the second seed layer 236. The residual photoresist layer 226 is now removed using a wet strip process, as the same will be understood by one of ordinary skill in the art upon reading this disclosure. According to the teachings of the present invention, removing the residual photoresist layer 226.includes removing the unwanted barrier/adhesion layer 234 and the unwanted second seed layer 236, from other areas of the wafer's surface, e.g. from over a number of regions 232 outside of second level of metal line trenches 230 on a top surface 242 of the second oxide layer 224. The structure is now as shown in FIG. 2J.

Figure 2K:
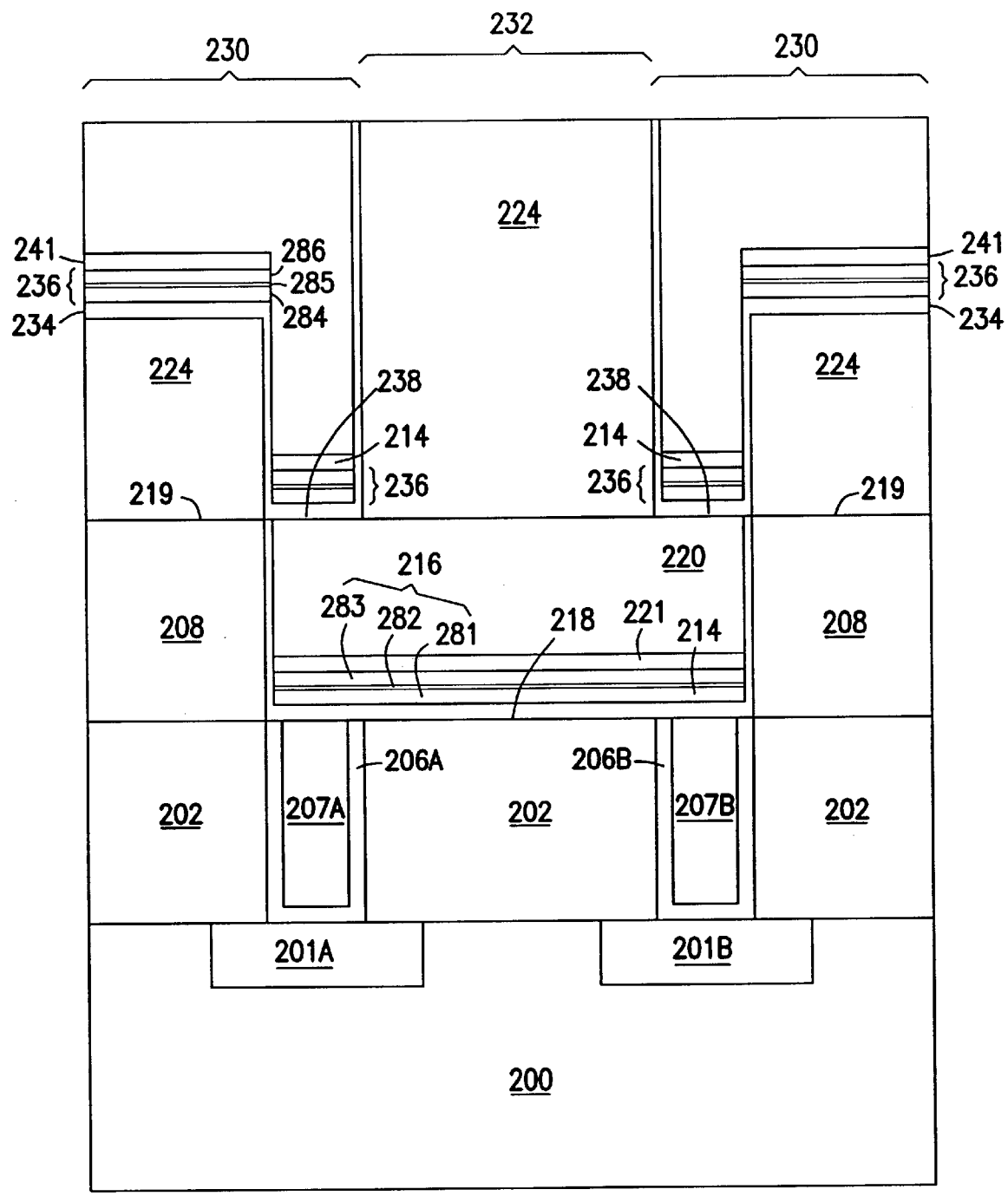

In FIG. 2K, a second metallic conductor 244, or second core conductor 244, is deposited over or formed on the second seed layer 236 and within the second barrier/adhesion layer 234 in the second level of via openings 228 and the second level of metal line trenches 230 in the polymer layer. In this embodiment the second metallic conductor 244, or second core conductor 244, is aluminum, but in other embodiments of the present invention the second metallic conductor 244, or second core conductor 244, can be selected from the group consisting of copper, silver, and gold. In one embodiment, the second metallic conductor 244, or second core conductor 244, is deposited using a selective CVD process. In another embodiment, depositing a second metallic conductor 244, or second core conductor 244, over on the second seed layer 236 and within the second barrier/adhesion layer 234 includes depositing a second metallic conductor 244, or second core conductor 244, using electroless plating. The second aluminum conductor 244, or second core conductor 244 is deposited to fill the second level of via openings 228 and the second level of metal line trenches 230 to the top surface 242 of the second insulator layer 224. Thus, the second barrier/adhesion layer 234, the second seed layer 236, and the second metallic conductor 244, or second core conductor 244, constitute a second number of conductive structures which includes a number of second level vias and a number of second level metal lines which are formed over and connect to a first number of conductive structures, e.g. the first level of vias 207A and 207B.

Embodiment of a Metal Interconnect using Copper Metal Lines and Oxide Insulators FIGS. 3A–3K illustrate a novel methodology for the formation of metal interconnects and/or a wiring structure in an integrated circuit according to the teachings of the present invention. The novel methodology includes the novel formation of a barrier/adhesion layer and a seed layer in an integrated circuit using a low energy ion implantation. The novel methodology also encompasses a novel method of making copper, silver, aluminum, or gold interconnect for an integrated circuit.

Figure 3A:
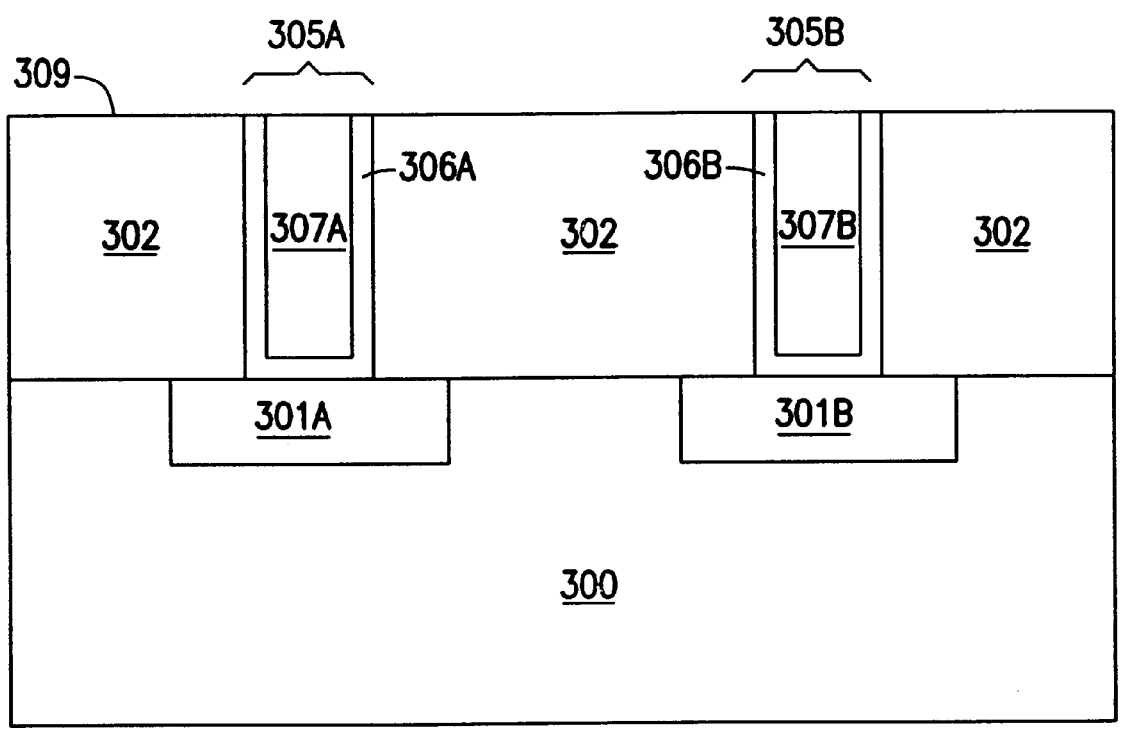

FIG. 3A illustrates a portion of an integrated circuit structure, namely an integrated circuit having a number of semiconductor devices formed in a substrate. FIG. 3 illustrates the structure after a device structure is formed in the substrate and the contact structure to the device structure is in place. One of ordinary skill in the art will understand upon reading this disclosure the manner in which a number of semiconductor structures, e.g. transistors, can be formed in a substrate. One of ordinary skill in the art will also understand upon reading this disclosure the manner in which a contact structure can be formed connecting to a given semiconductor device in a substrate, such as explained in connection with FIG. 1A. For example, FIG. 3A illustrates the structure after a number of device structures, e.g. transistor 301A and 301B are formed in the substrate 300. An insulator layer 302 is deposited over the number of semiconductors 301A and 301B. The deposition of the insulator layer 302 can include depositing a layer of $Si_3N_4$ having a thickness in the range of 100 to 500 Angstroms (Å). This insulator layer will also serve as an additional barrier to impurities coming from subsequent processing steps. Contact holes 305A and 305B are opened to the number of device structures 301A and 301B using a photolithography technique. One of ordinary skill in the are will understand, upon reading this disclosure, the manner in which a photolithography technique can be used to create contact holes 305A and 305B. In one embodiment of the present invention a titanium silicide liner 306A and 306B is placed in the contact holes 305A and 305B, such a through a process such as chemical vapor deposition (CVD). Next, tungsten vias 306A and 306B can be deposited in the contact holes 305A and 305B. The tungsten vias 307A and 307B can be deposited in the contact holes using any suitable technique such as using a CVD process. The excess tungsten is then removed from the wafer surface by chemical mechanical planarization (CMP) or other suitable processes to form a planarized surface 309.

Figure 3B:
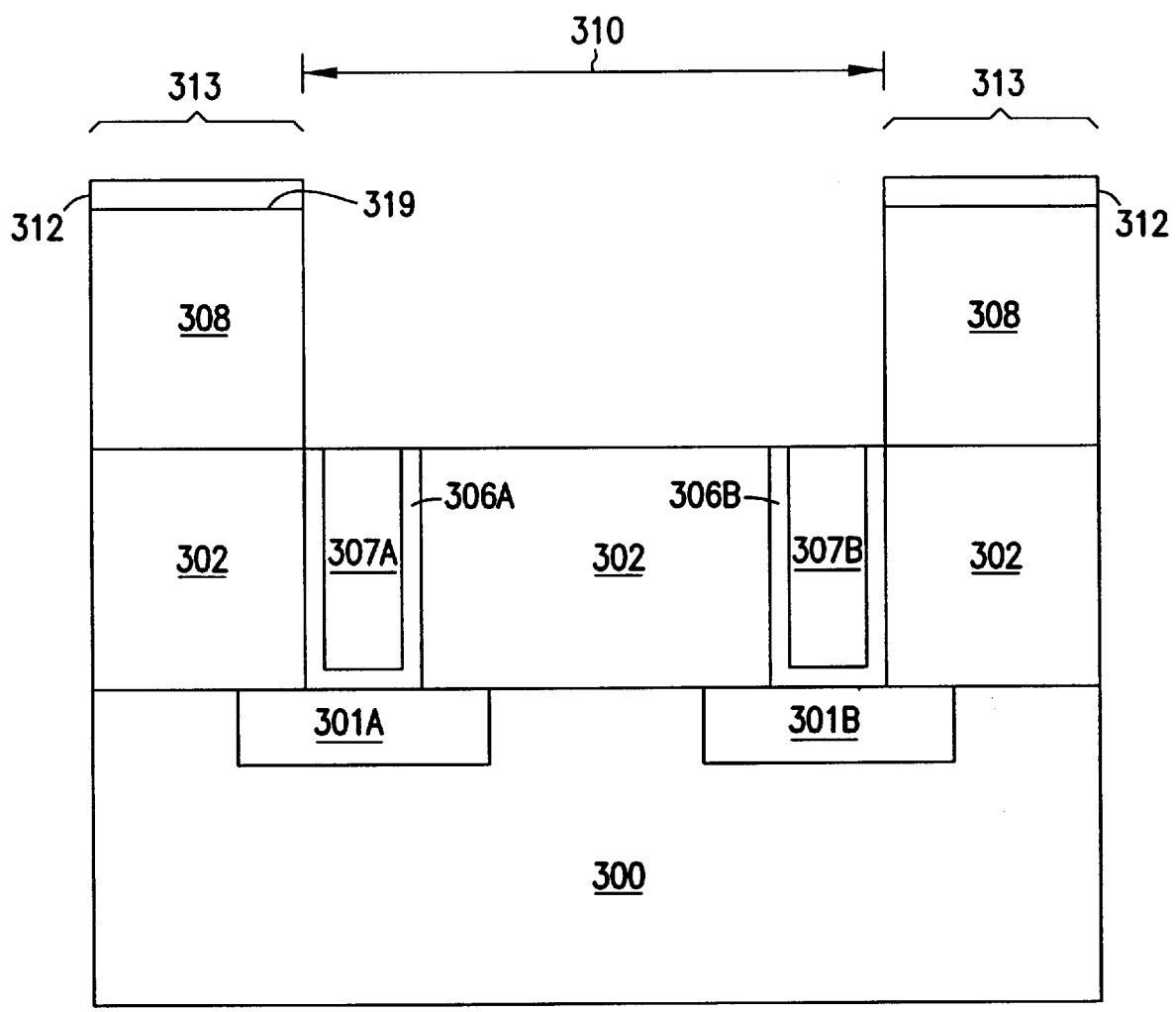

As shown in FIG. 3B, a first polymer layer 308, or first layer of polyimide 308, is deposited over the wafer surface. The first oxide layer 308 may be deposited using any suitable technique such as, for example, a CVD process. In one embodiment, depositing a first oxide layer 308 includes depositing a fluorinated silicon oxide layer 308. In one embodiment, the first oxide layer 308 is deposited to have a thickness of approximately 5000 Å. As one of ordinary skill in the art will understand, upon reading this disclosure, other suitable thickness for the first oxide layer 308 may also be deposited as suited for forming a first level metal pattern, the invention is not so limited. The first oxide layer 308 is patterned to define a number of trenches 310 in the first oxide layer 308 opening to a number of first level vias, e.g. tungsten vias 307A and 307B in planarized surface 309. In other words, a first level metal pattern 310 is defined in a mask layer of photoresist 312 and then the first oxide layer 308 is etched, using any suitable process, e.g. reactive ion etching (RIE), such that the first level metal pattern 310 is defined in the first oxide layer 308. According to the teachings of the present invention, a residual photoresist layer 312 is left in place on the first oxide layer 308 in a number of region 313 outside of the number trenches 310. The structure is now as appears in FIG. 3B.

Figure 3C:
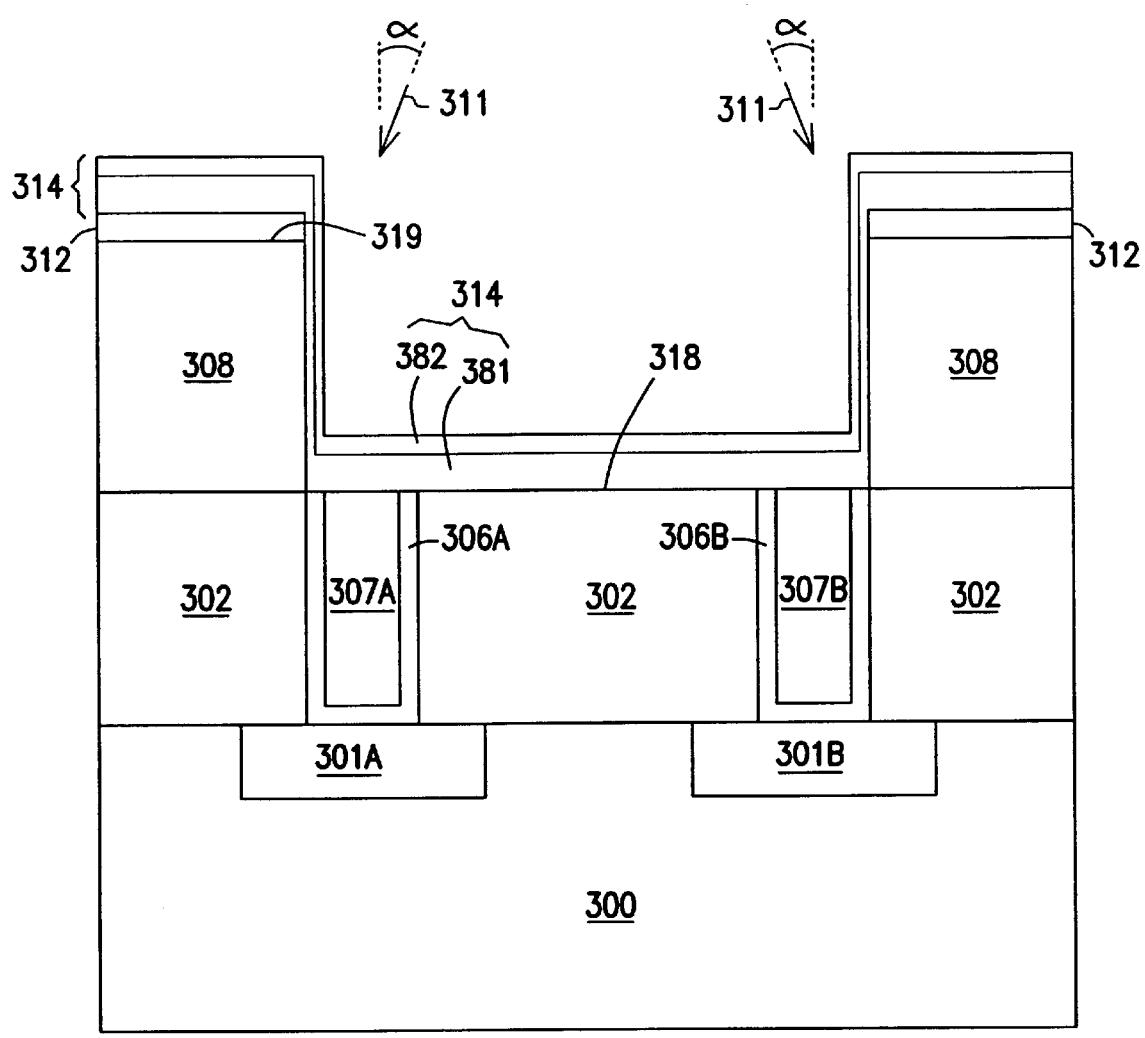

As shown in FIG. 3C, a first barrier/adhesion layer 314 is deposited in the number of trenches 310 using a low energy ion implantation. In one embodiment according to the teachings of the present invention, depositing the barrier/adhesion layer 314 includes depositing a tantalum nitride layer 314 having a thickness of approximately 5 to 100 Å. In alternate embodiments, depositing the barrier/adhesion layer 314 includes depositing a barrier/adhesion layer 314 of tantalum and/or CuTi. In one embodiment, depositing the tantalum nitride layer 314 includes first depositing a layer of tantalum 381 to have a thickness of approximately 100 Å using a low energy ion implantation of approximately 100 electron volts (eV) at a varying angle implant ( ), e.g. the angle of implantation ( ) is changed from normal to the planarized surface 309 to approximately 15 degrees off normal as shown by arrows 311. In one embodiment, this is achieved using a $10^{17}$ ion implant of tantalum. Next, according to the teachings of the present invention, a layer of nitrogen 382 is implanted at 700 electron volts (eV) into the layer of tantalum 381. In one embodiment, this is achieved using an $8 \times 10^{16}$ ion implant of nitrogen. As one of ordinary skill in the art will understand upon reading this disclosure, using a varying angle implant, where an angle of implantation is changed from normal to the planarized surface 309 to approximately 15 degrees off normal deposits the barrier/adhesion layer 314 on all surfaces in the number of trenches 310. The structure is now as appears in FIG. 3C.

Figure 3D:
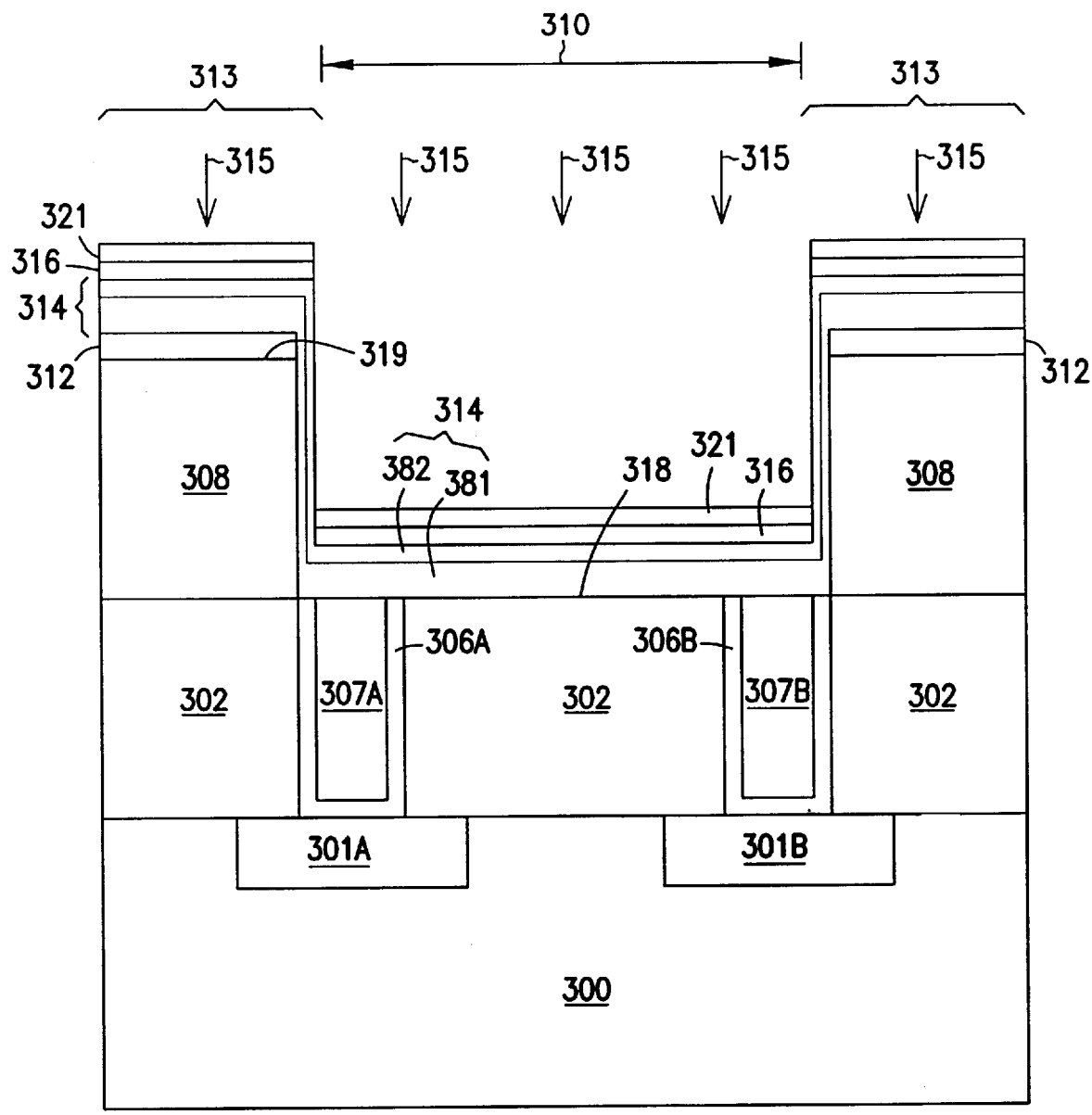

In FIG. 3D, a first seed layer 316 is deposited on the first barrier/adhesion layer 314 using a low energy ion implantation. According to the broader teachings of the present invention, depositing the seed layer 316 on the barrier/adhesion layer 314 includes depositing a seed layer 316 selected from the group consisting of aluminum, copper, silver, and gold. However, according to the teachings of the present embodiment, depositing the seed layer 316 includes depositing a layer of copper 316 having a thickness of approximately 50 Å. This can be achieved using an $8 \times 10^{16}$ ion implant of copper. According to the teachings of the present invention, using a low energy ion implantation includes implanting the layer of copper 316 at 100 electron volts (eV) into the first barrier/adhesion layer 314. Also the layer of copper 316 is implanted at an angle normal to the planarized surface 309 as shown by arrows 315. As one of ordinary skill in the art will understand upon reading this disclosure, implanting the layer of copper 316 at an angle normal to the planarized surface results in the seed layer of copper 316 remaining on a bottom surface 318 in the number of trenches 310 and to a much lesser extent on the side surfaces 320 of the number of trenches 310. In one embodiment, an optional layer of aluminum 321 is deposited over the copper seed layer 316 again using a low energy ion implantation of 100 electron volts (eV). The optional layer of aluminum 321 is deposited to have a thickness of approximately a 50 Å. This can be achieved sing a $3 \times 10^{16}$ ion implant of aluminum normal to the wafer surface. As one of ordinary skill in the art will understand upon reading this disclosure, the layer of aluminum 321 is used to protect the copper seed layer 316 from oxidation prior to subsequent processing steps. The structure is now as appears in FIG. 3D.

Figure 3E:
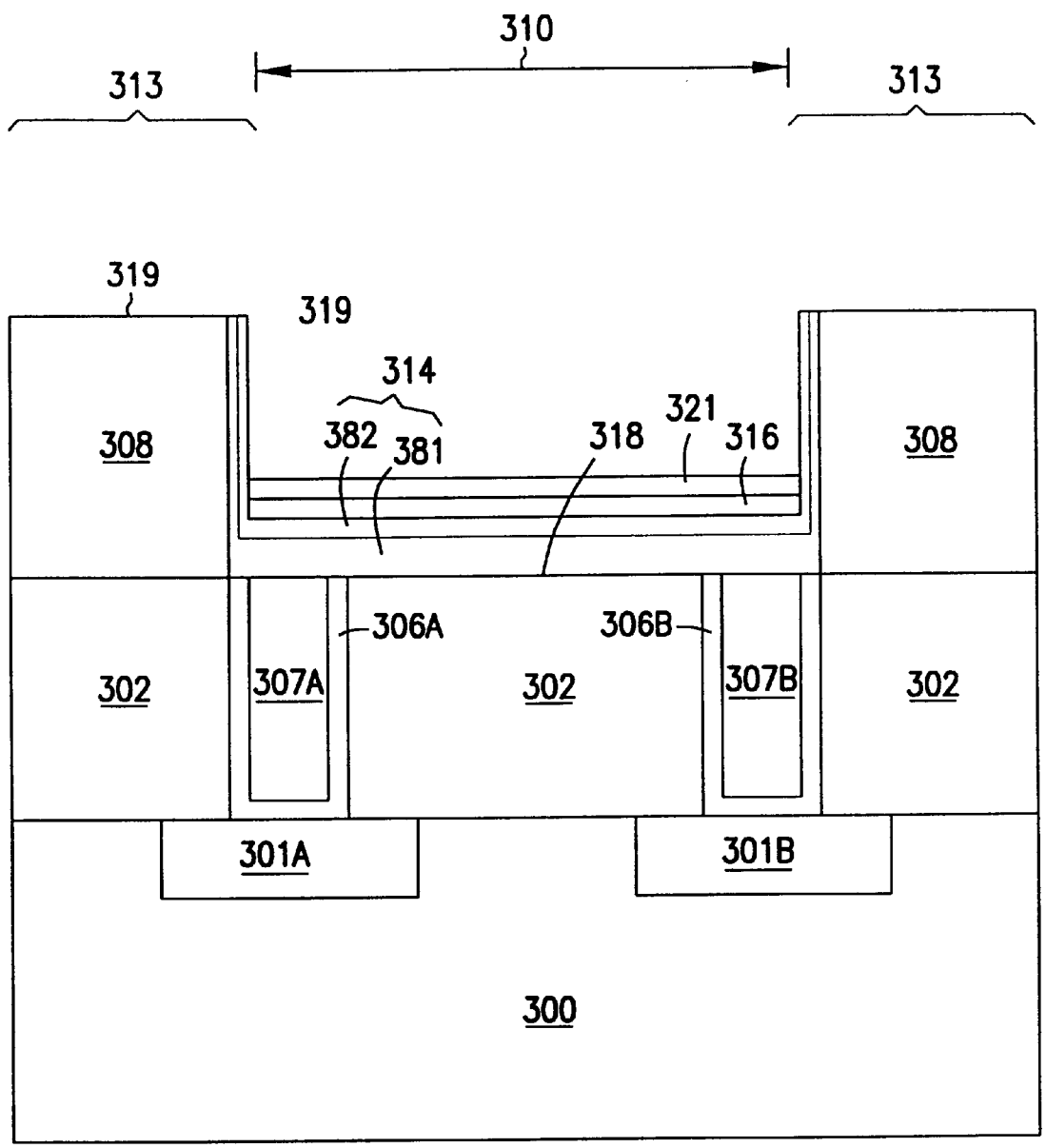

FIG. 3E illustrates the structure after the next sequence of processing steps. As one of ordinary skill in the art will understand upon reading this disclosure, the residual photoresist layer 312 has served as a blocking layer to define the implant areas for the barrier/adhesion layer 314, the seed layer 316, and the layer of aluminum 321. The residual photoresist layer 312 is now removed using a wet strip process, as the same will be understood by one of ordinary skill in the art upon reading this disclosure. According to the teachings of the present invention, removing the residual photoresist layer 312 includes removing the unwanted aluminum layer 321, the unwanted seed layer 316, and the unwanted barrier/adhesion layer 314 from other areas of the wafer's surface, e.g. from over a number of regions outside of the trenches 310 on a top surface 319 of the first insulator layer 308. The structure is now as shown in FIG. 3E.

Figure 3F:
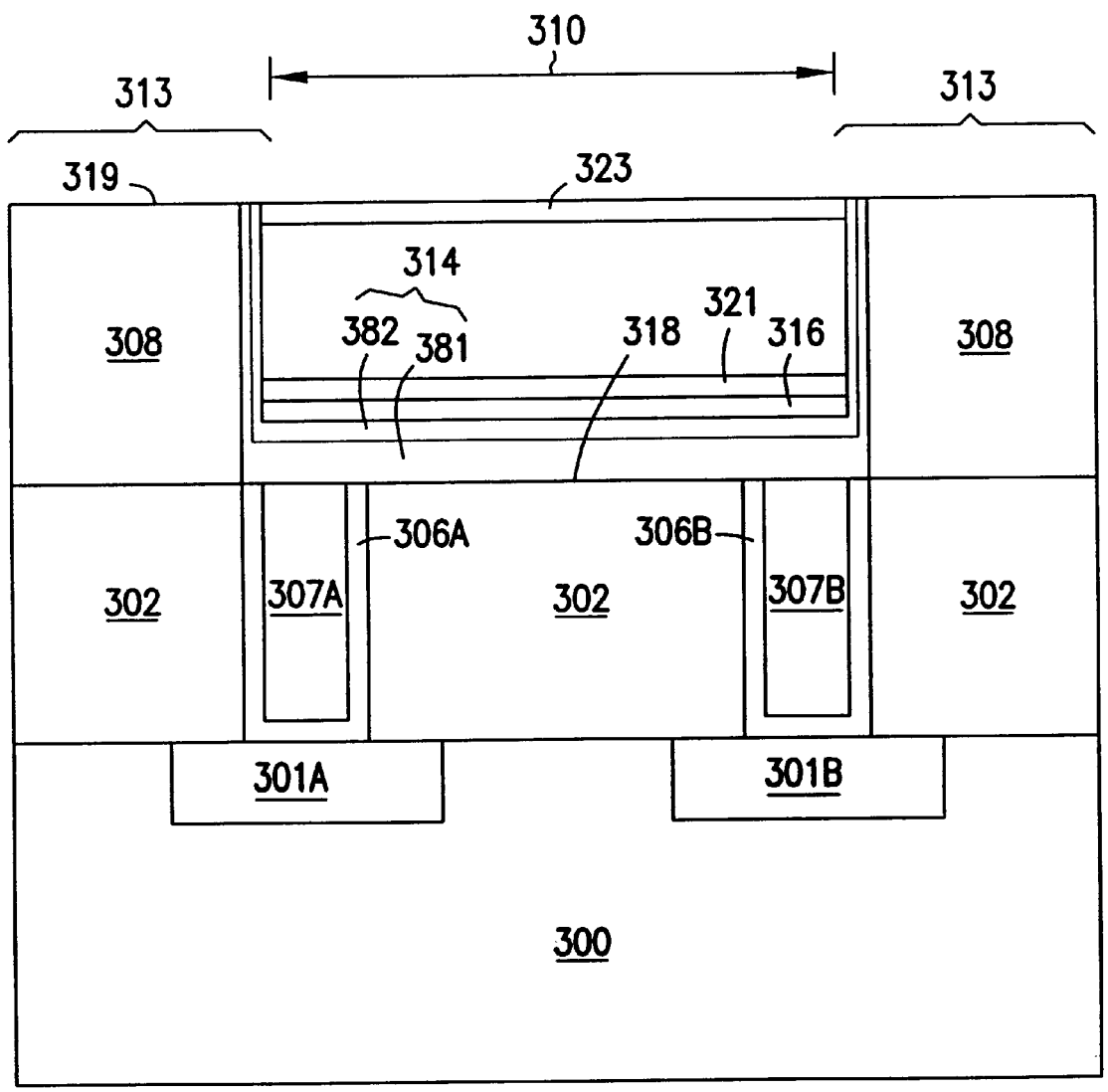

In FIG. 3F, a metallic conductor 320, or number of first level metal lines 320, is deposited over the seed layer 316 in the number of trenches 310. According to teachings of the present embodiment, the metallic conductor 320, or number of first level metal lines 320, is copper. In one embodiment, the metallic conductor 320, or number of first level metal lines 320, is deposited using a selective CVD process. In another embodiment, depositing a metallic conductor 320, or number of first level metal lines 320, over the seed layer 316 includes depositing a metallic conductor 320 using electroless plating. Electroless copper plating is used to deposit sufficient copper to fill the number of trenches 310 to a level approximately 100 Å below the top surface 319 of the first oxide layer 308. At this point, a second layer of tantalum nitride 323 is deposited to a thickness of approximately 100 Å on the copper metallic conductor 320, or number of first level copper lines 320. A chemical mechanical planarization (CMP) cleanup process is then used to remove the tantalum nitride from the top surface 319 of the first oxide layer 308.

Figure 3G:
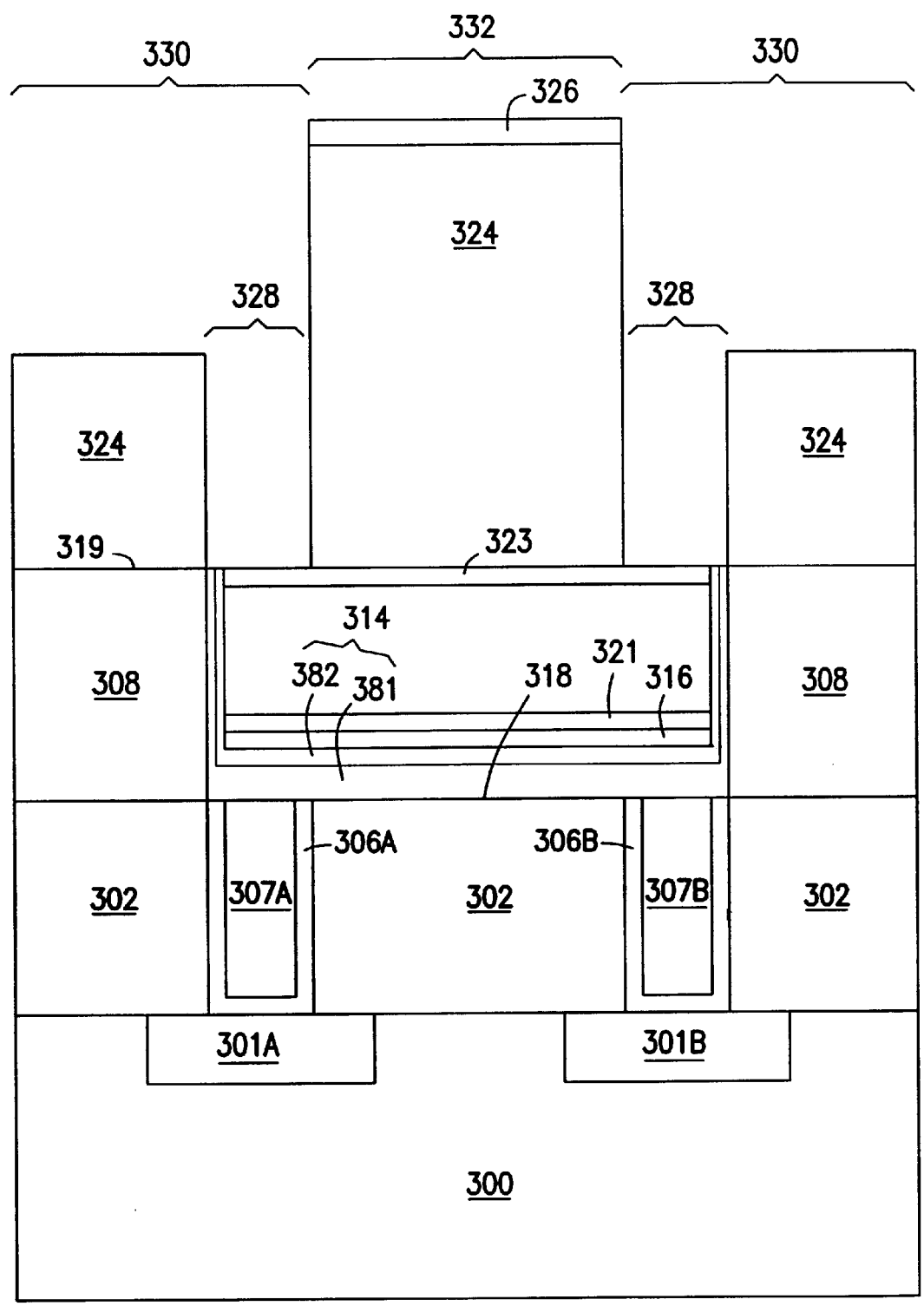

As shown in FIG. 3G, the process sequence may be continued to form any number of subsequent metal layers in a multilayer wiring structure. FIG. 3G illustrates the structure after the next sequence of processing steps. In FIG. 3G, a dual damascene process is used to define and fill a first to a second level of vias and a second level metallurgy. To do so, a second oxide layer 324 is deposited over the wafer surface, e.g. the metallic conductor 320, or number of first level metal lines 320, and the first oxide layer 308. The second oxide layer 324 is again deposited using any suitable technique. In one embodiment, depositing a second oxide layer 324 includes depositing a fluorinated silicon oxide layer 324. In one embodiment, the second oxide layer 324 is deposited to have a thickness of approximately 10,000 Å. As one of ordinary skill in the art will understand, upon reading this disclosure, other suitable thickness for the second oxide layer 324 may also be deposited as suited for forming a first to a second level of vias, e.g. second level vias, and a number of second level metal lines, the invention is not so limited. The second oxide layer 324 is patterned to define a second level of vias and a number of second level metal lines in the second oxide layer 324 opening to the metallic conductor 320, or number of first level metal lines 320. In other words, a second level of vias is defined in a second mask layer of photoresist 326 and then the second oxide layer 324 is etched, using any suitable process, e.g. reactive ion etching (RIE), such that a second level of via openings 328 are defined in the second oxide layer 324. Using the dual damascene process, a number of second level metal lines are also defined in a second mask layer of photoresist 326 and the second oxide layer 324 is again etched, using any suitable process, e.g. reactive ion etching (RIE), such that a second level of metal line trenches 330 are defined in the oxide. One of ordinary skill in the art will understand upon reading this disclosure, the manner in which a photoresist layer 326 can be mask, exposed, and developed using a dual damascene process to pattern a second level of via openings 328 and a second level of metal line trenches 330 in the second oxide layer 324.

As described previously, and according to the teachings of the present invention, a residual photoresist layer 326 is left in place on the second oxide layer 324 in a number of regions 332 outside of the second level of metal line trenches 330. A suitable plasma and/or wet cleaning process is used to remove any contaminates from the second level of via openings 328 and a second level of metal line trenches 330, as the same will be understood by one of ordinary skill in the art upon reading this disclosure. The structure is now as appears in FIG. 3G.

Figure 3H:
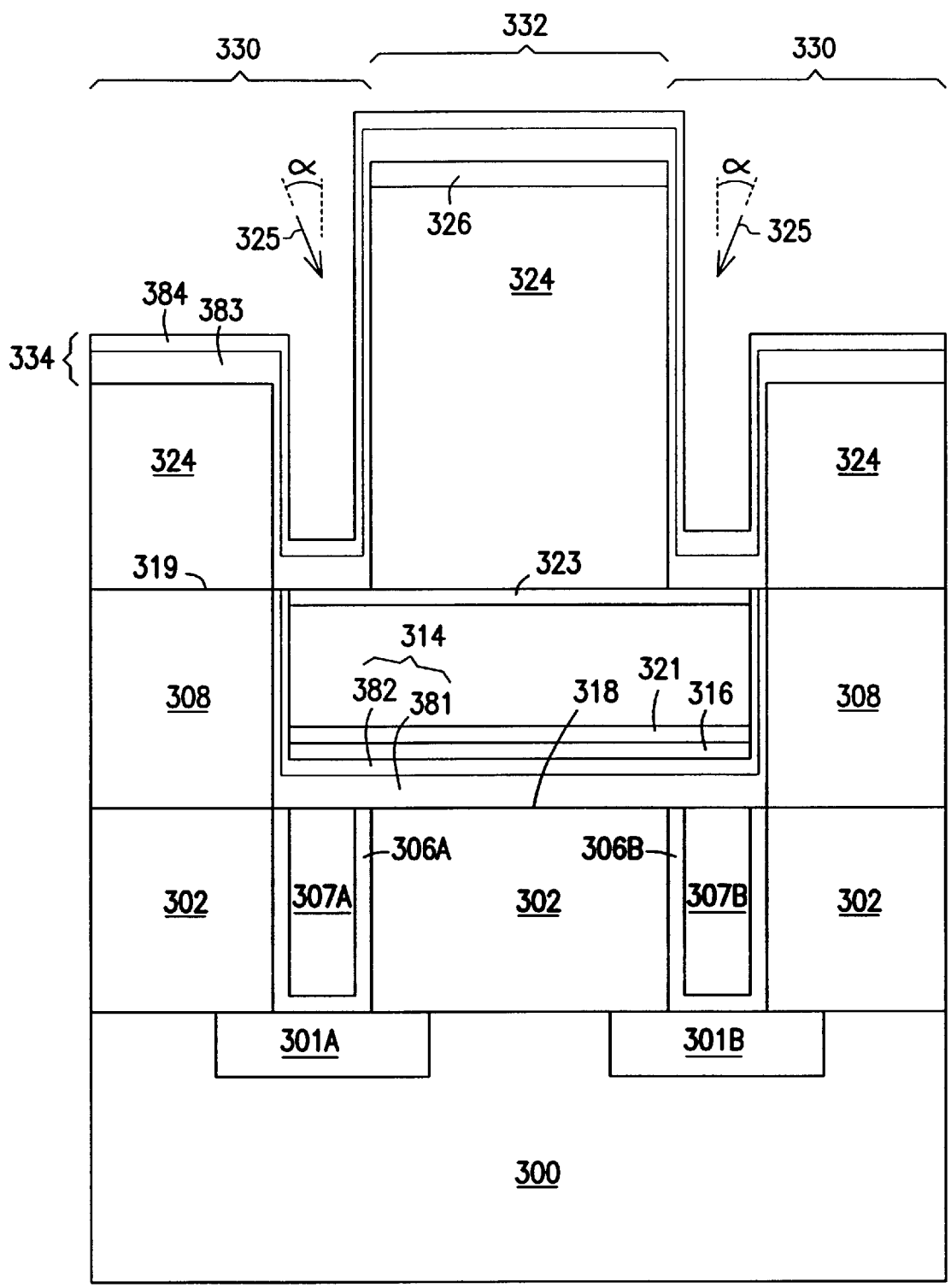
Figure 31:
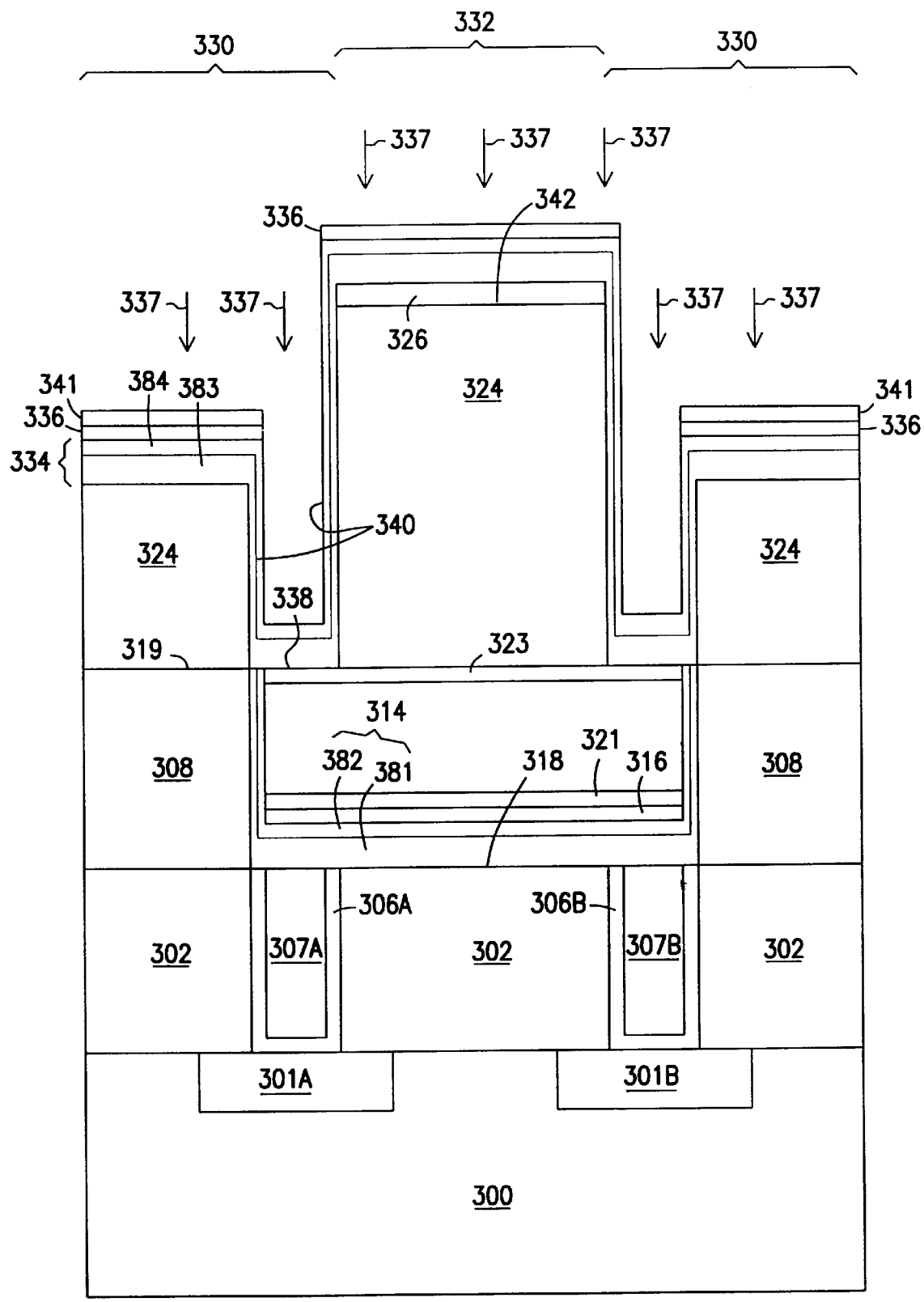

FIG. 3H illustrates the structure after the next sequence of processing steps. In FIG. 3H, a second barrier/adhesion layer 334 is deposited in the second level of via openings 328 and a second level of metal line trenches 330 using a low energy ion implantation. As described above, in one embodiment according to the teachings of the present invention, depositing the second barrier/adhesion layer 334 includes depositing a tantalum nitride layer 334 having a thickness of approximately 5 to 100 Å. In alternate embodiments, depositing the second barrier/adhesion layer 334 includes depositing a second barrier/adhesion layer 334 of tantalum and/or CuTi. In one embodiment, depositing the tantalum nitride layer 334 includes first depositing a layer of tantalum 383 to have a thickness of approximately 100 Å using a low energy ion implantation of approximately 100 electron volts (eV) at a varying angle implant ( ), e.g. the angle of implantation ( ) is changed from normal to the wafer's surface to approximately 15 degrees off normal as shown by arrows 325. In one embodiment, this is achieved using a $10^{17}$ ion implant of tantalum. Next, according to the teachings of the present invention, a layer of nitrogen 384 is implanted at 700 electron volts (eV) into the layer of tantalum 383. In one embodiment, this is achieved using an $8 \times 10^{16}$ ion implant of nitrogen. As one of ordinary skill in the art will understand upon reading this disclosure, using a varying angle implant ( ), where an angle of implantation is changed from normal to the wafer's surface to approximately 15 degrees off normal deposits the second barrier/adhesion layer 334 on all surfaces in the second level of via openings 328 and in the second level of metal line trenches 330 formed in the second oxide layer 324. The structure is now as appears in FIG. 3H.

FIG. 3I illustrates the structure after the next sequence of processing steps. In FIG. 3I, a second seed layer 336 is deposited on the second barrier/adhesion layer 334 using a low energy ion implantation. According to the broader teachings of the present invention, depositing the second seed layer 336 on the second barrier/adhesion layer 314 includes depositing a second seed layer 336 selected from the group consisting of aluminum, copper, silver, and gold. However, according to the teachings of the present embodiment, depositing the second seed layer 336 includes depositing a second layer of copper 336 having a thickness of approximately 50 Å. In one embodiment, this is achieved using an $8 \times 10^{16}$ ion implant of copper. According to the teachings of the present invention, using a low energy ion implantation includes implanting the layer of copper 336 at 100 electron volts (eV) into the surfaces of the second level of via openings 328 and the second level of metal line trenches 330 in the polymer layer. Also the layer of copper 336 is implanted at an angle normal to the wafer's surface as shown by arrows 337. As one of ordinary skill in the art will understand upon reading this disclosure, implanting the layer of copper 336 at an angle normal to the wafer's surface results in the second seed layer of copper 336 remaining on a bottom surface 338 in the second level of via openings 328 and to a much lesser extent on the side surfaces 340 of the second level of via openings 328 and a second level of metal line trenches 330. In one embodiment, an optional layer of aluminum 341 is deposited over the second copper seed layer 336 again using a low energy ion implantation of 100 electron volts (eV). The optional layer of aluminum is deposited to have a thickness of approximately a 50 Å. In one embodiment, this is achieved using a $3 \times 10^{16}$ ion implant of aluminum normal to the wafer surface. As one of ordinary skill in the art will understand upon reading this disclosure, the layer of aluminum 341 is used to protect the second copper seed layer 336 from oxidation prior to subsequent processing steps. The structure is now as shown in FIG. 3I.

Figure 3J:
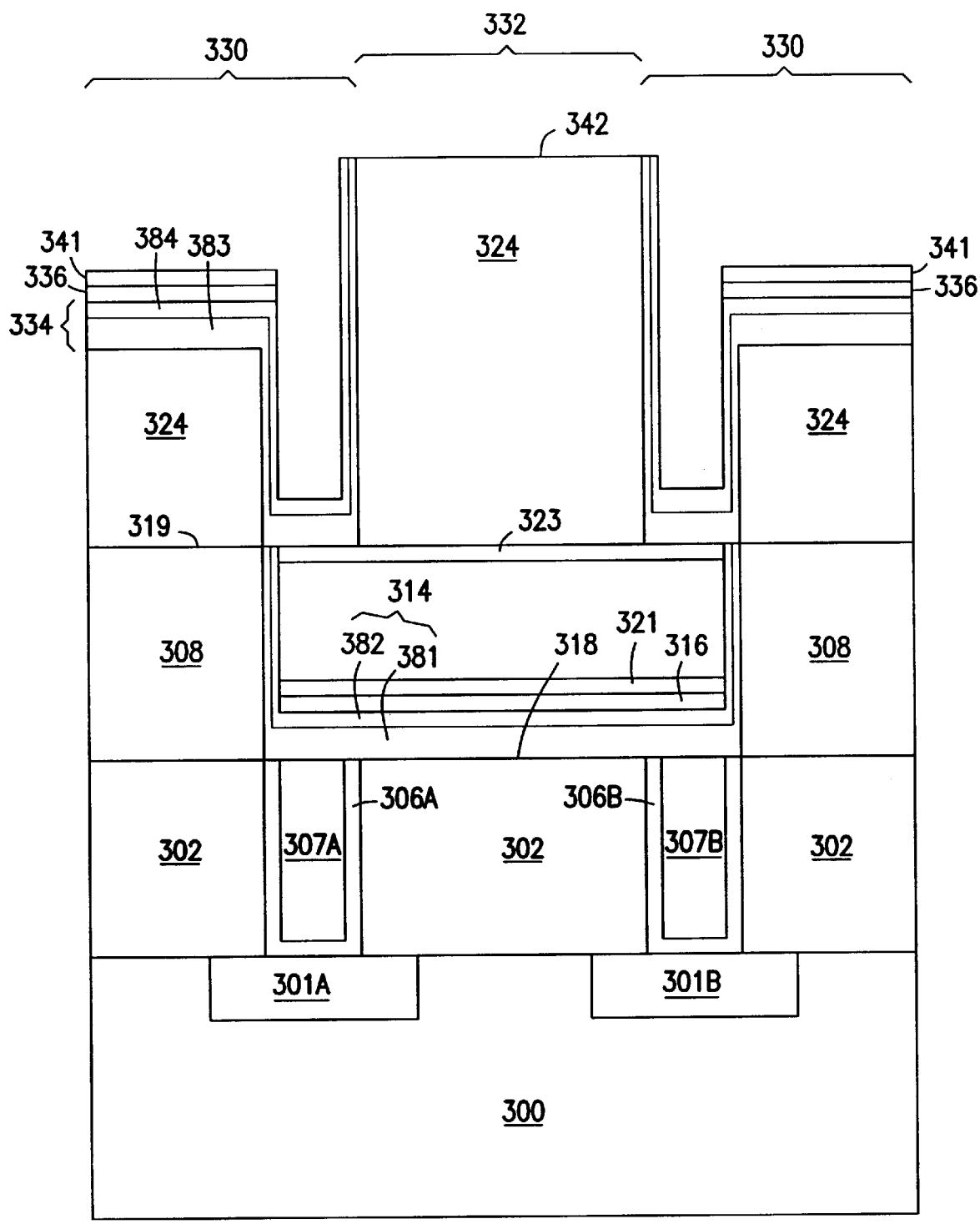

FIG. 3J illustrates the structure after the next sequence of processing steps. As one of ordinary skill in the art will understand upon reading this disclosure, the residual photoresist layer 326 has served as a blocking layer to define the implant areas for the second barrier/adhesion layer 334, the second seed layer 336, and the aluminum layer 341. The residual photoresist layer 326 is now removed using a wet strip process, as the same will be understood by one of ordinary skill in the art upon reading this disclosure. According to the teachings of the present invention, removing the residual photoresist layer 326 includes removing the unwanted aluminum layer 341, the unwanted seed layer 336, and the unwanted barrier/adhesion layer 334 from other areas of the wafer's surface, e.g. from over a number of regions 332 outside of second level of metal line trenches 330 on a top surface 342 of the second insulator layer 324. The structure is now as shown in FIG. 3J.

Figure 3K:
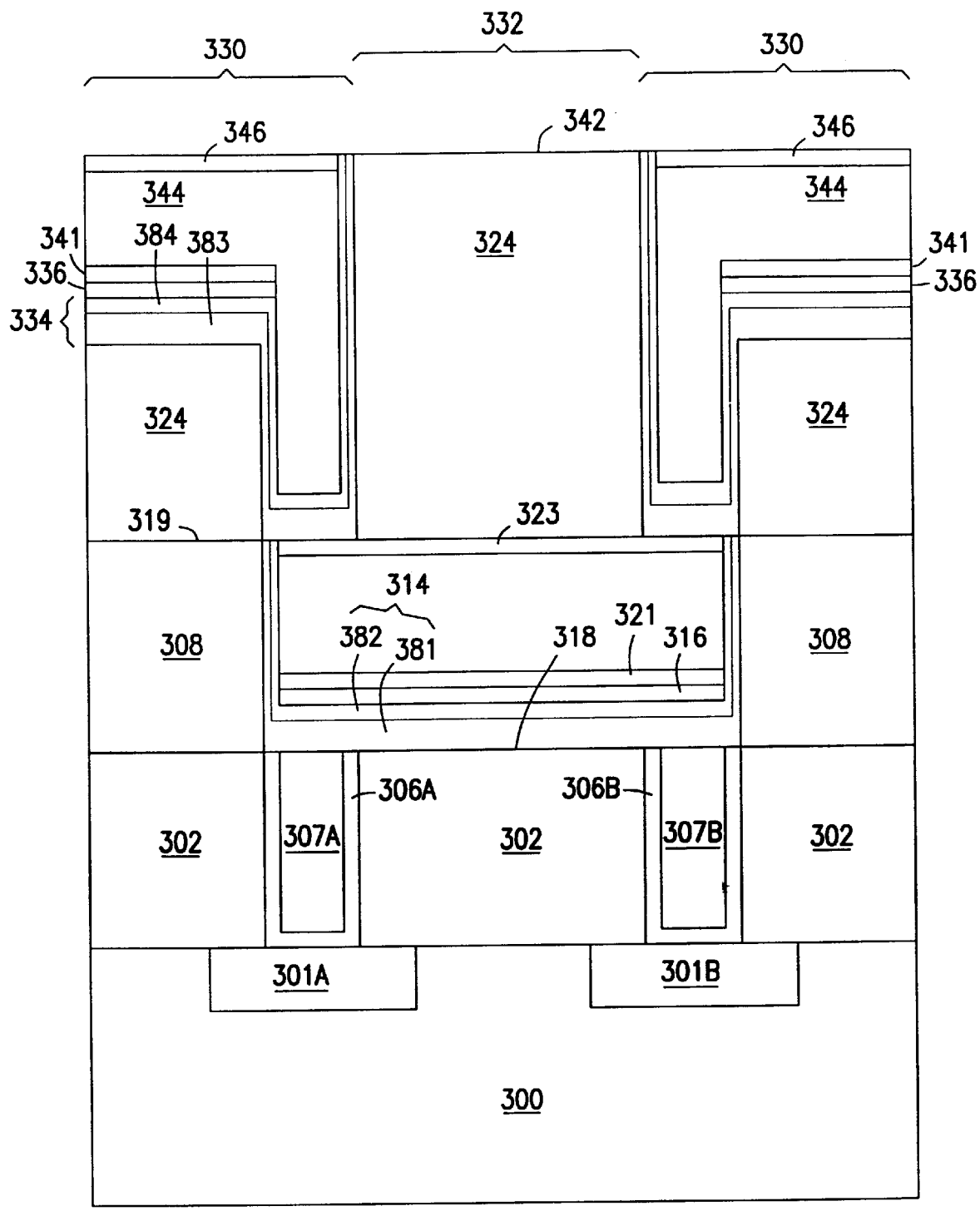

In FIG. 3K, a second metallic conductor 344, or second core conductor 344, is deposited over or formed on the second seed layer 336 and within the second barrier/adhesion layer 334 in the second level of via openings 328 and the second level of metal line trenches 330 in the polymer layer. In this embodiment the second metallic conductor 344, or second core conductor 344, is copper, but in other embodiments of the present invention the second metallic conductor 344, or second core conductor 344, can be selected from the group consisting of aluminum, silver, and gold. In one embodiment, the second metallic conductor 344, or second core conductor 344, is deposited using a selective CVD process. In another embodiment, depositing a second metallic conductor 344, or second core conductor 344, over on the second seed layer 336 and within the second barrier/adhesion layer 334 includes depositing a second metallic conductor 344, or second core conductor 344, using electroless plating. Electroless copper plating is used to deposit sufficient copper to fill the second level of via openings 328 and the second level of metal line trenches 330 to level approximately 100 Å below the top surface 342 of the second insulator layer 324. At this point, a second layer of tantalum nitride 346 is deposited to a thickness of approximately 100 Å on the second metallic conductor 344, or second core conductor 344. A chemical mechanical planarization (CMP) cleanup process is then used to remove the tantalum nitride from the top surface 342 of the second insulator layer 324. Thus, the second barrier/adhesion layer 334, the second seed layer 336, and the second metallic conductor 344, or second core conductor 344, constitute a second number of conductive structures which includes a number of second level vias and a number of second level metal lines which are formed over and connect to a first number of conductive structures, e.g. the metallic conductor 320, or number of first level metal lines 320.

Another Embodiment of a Metal Interconnect using Copper

FIGS. 4A–4L illustrate a novel methodology for the formation of metal interconnects and/or a wiring structure in an integrated circuit according to the teachings of the present invention. The novel methodology includes the novel formation of a barrier/adhesion layer and a seed layer in an integrated circuit using a low energy ion implantation. The novel methodology also encompasses a novel method of making copper, silver, aluminum, or gold interconnect for an integrated circuit.

Figure 4A:
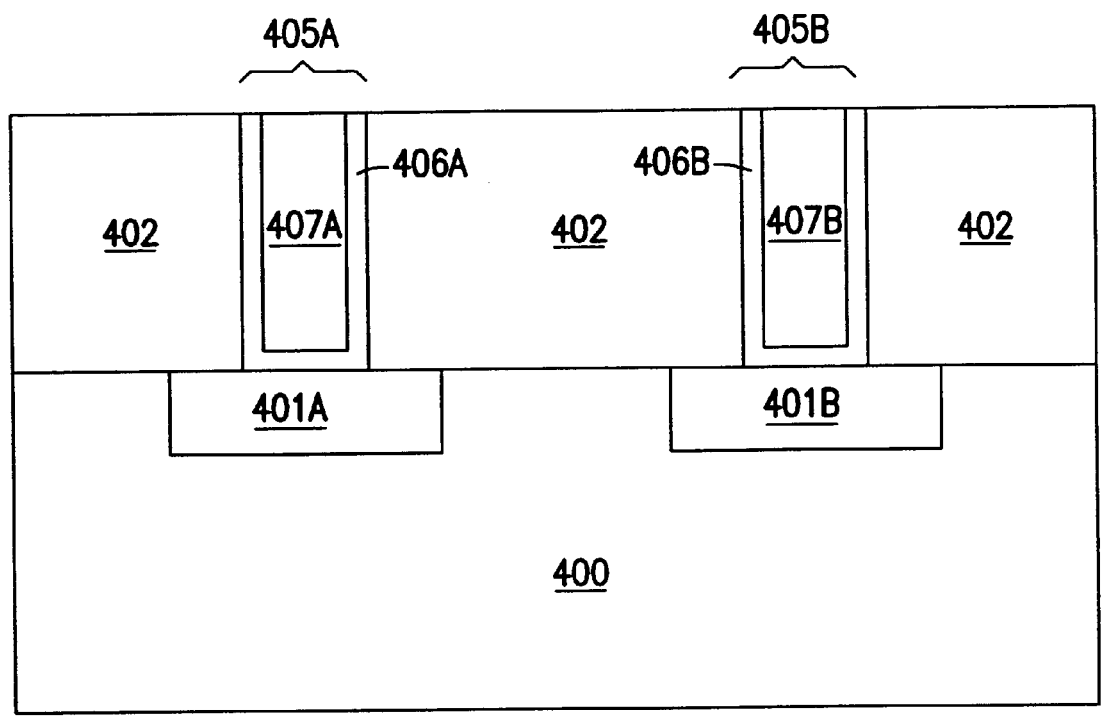

FIG. 4A illustrates a portion of an integrated circuit structure, namely an integrated circuit having a number of semiconductor devices formed in a substrate. FIG. 4A illustrates the structure after a device structure is formed in the substrate and the contact structure to the device structure is in place. One of ordinary skill in the art will understand upon reading this disclosure the manner in which a number of semiconductor structures, e.g. transistors, can be formed in a substrate. One of ordinary skill in the art will also understand upon reading this disclosure the manner in which a contact structure can be formed connecting to a given semiconductor device in a substrate, such as described in connection with FIG. 1A. For example, FIG. 4A illustrates the structure after a number of device structures, e.g. transistor 401A and 401B are formed in the substrate 400. An insulator layer 402 is deposited over the number of semiconductors 401A and 401B. The deposition of the insulator layer 402 can include depositing a layer of $Si_3N_4$ having a thickness in the range of 100 to 500 Angstroms (Å). This insulator layer will also serve as an additional barrier to impurities coming from subsequent processing steps. Contact holes 405A and 405B are opened to the number of device structures 401A and 401B using a photolithography technique. One of ordinary skill in the are will understand, upon reading this disclosure, the manner in which a photolithography technique can be used to create contact holes 405A and 405B. In one embodiment of the present invention a titanium silicide liner 406A and 406B is placed in the contact holes 405A and 405B, such a through a process such as chemical vapor deposition (CVD). Next, tungsten vias 407A and 407B can be deposited in the contact holes 405A and 405B. The tungsten vias 407A and 407B can be deposited in the contact holes using any suitable technique such as using a CVD process. The excess tungsten is then removed from the wafer surface by chemical mechanical planarization (CMP) or other suitable processes to form a planarized surface 409.

Figure 4B:
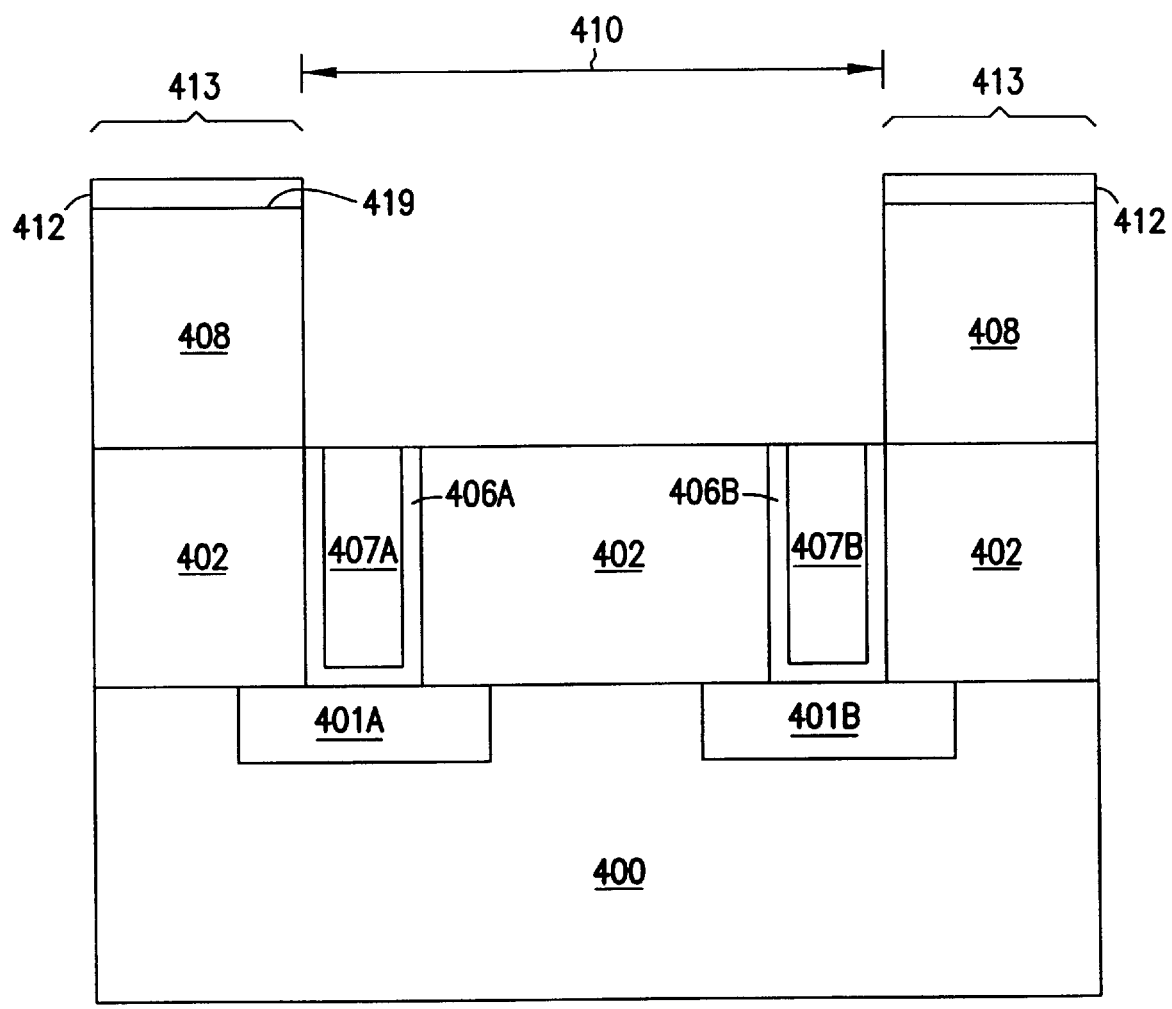

As shown in FIG. 4B, a first polymer layer 408, or first layer of polyimide 408, is deposited over the wafer surface. The first polymer layer 408 may be deposited using, for example, the process and material described in co-pending and commonly assigned U.S. application Ser. No. 09/128, 859, entitled "Copper Metallurgy in Integrated Circuits," which is hereby incorporated by reference. In one embodiment, depositing a first polymer layer 408 includes depositing a foamed polymer layer 408. In one embodiment, the first layer of polyimide 408 is deposited and cured, forming a 5000 Å thick layer of polymer 408 after curing. As one of ordinary skill in the art will understand, upon reading this disclosure, other suitable thickness for the first layer of polyimide 408, or insulator layer/material 408, may also be deposited as suited for forming a first level metal pattern, the invention is not so limited. The first layer of polyimide 408, or first insulator layer/material 408 is patterned to define a number of trenches 410 in the first insulator layer 408 opening to a number of first level vias, e.g. tungsten vias 407A and 407B in planarized surface 409. In other words, a first level metal pattern 410 is defined in a mask layer of photoresist 412 and then the first layer of polyimide 408 is etched, using any suitable process; e.g. reactive ion etching (RIE), such that the first level metal pattern 410 is defined in the polyimide. According to the teachings of the present invention, a residual photoresist layer 412 is left in place on the first insulator layer 408 in a number of region 413 outside of the number trenches 410. The structure is now as appears in FIG. 4B.

Figure 4C:
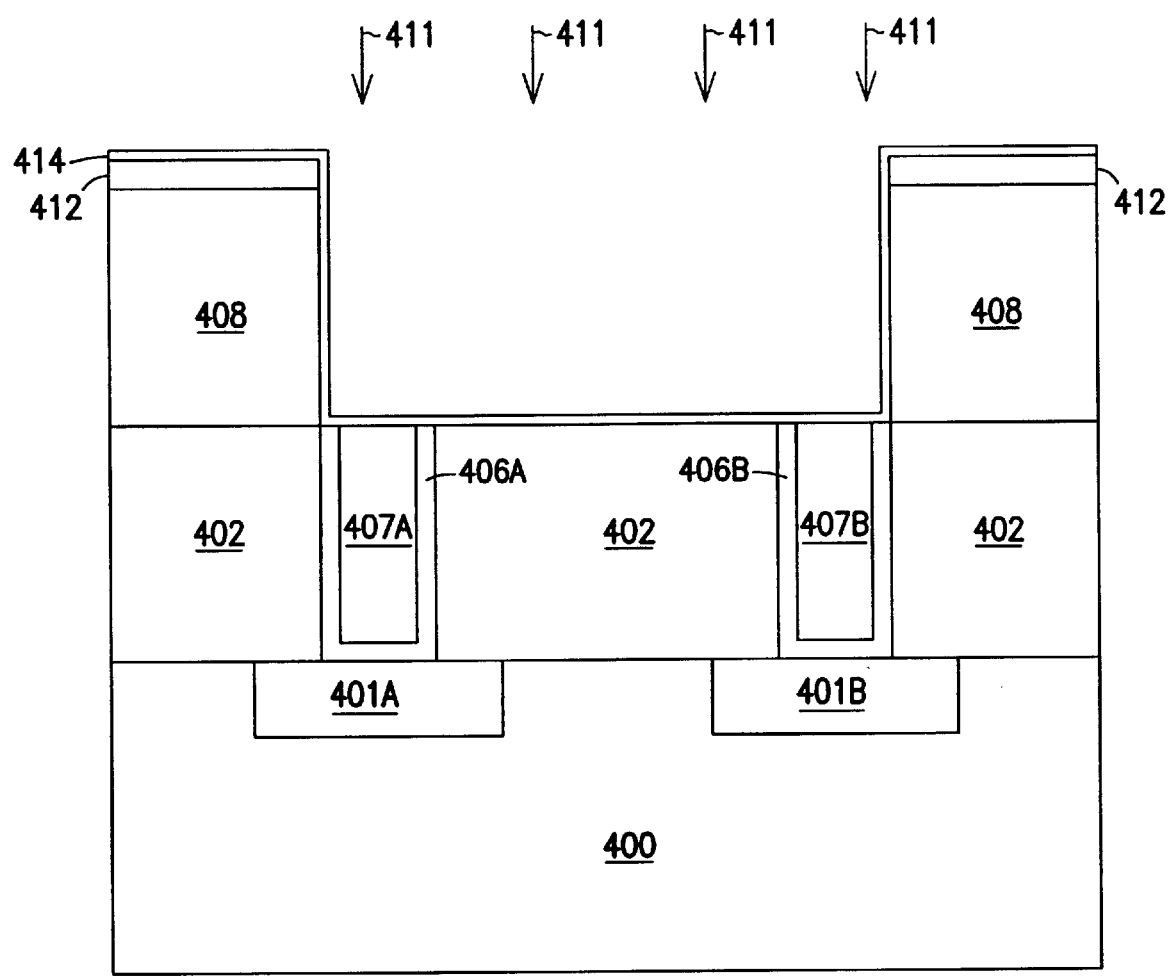

As shown in FIG. 4C, a first barrier/adhesion layer 414 is deposited in the number of trenches 410 using a low energy ion implantation. In one embodiment according to the teachings of the present invention, depositing the barrier/adhesion layer 414 includes depositing a layer of zirconium 414 having a thickness of approximately 5 to 100 Å. in alternate embodiments, depositing the barrier/adhesion layer 414 includes depositing a barrier/adhesion layer 414 of titanium and/or hafnium. In one embodiment, depositing the depositing a layer of zirconium 414 includes depositing a layer of zirconium 414 having a thickness of approximately 15 Å. This can be achieved using a $10^{17}$ ion implant of zirconium. According to the teachings of the present invention, the layer of zirconium 414 is implanted at 100 electron volts (eV) into the surface of the trenches 410 in the polymer layer 408 using an angle of implant normal to the wafer's surface as shown by arrows 411. The structure is now as appears in FIG. 4C.

Figure 4D:
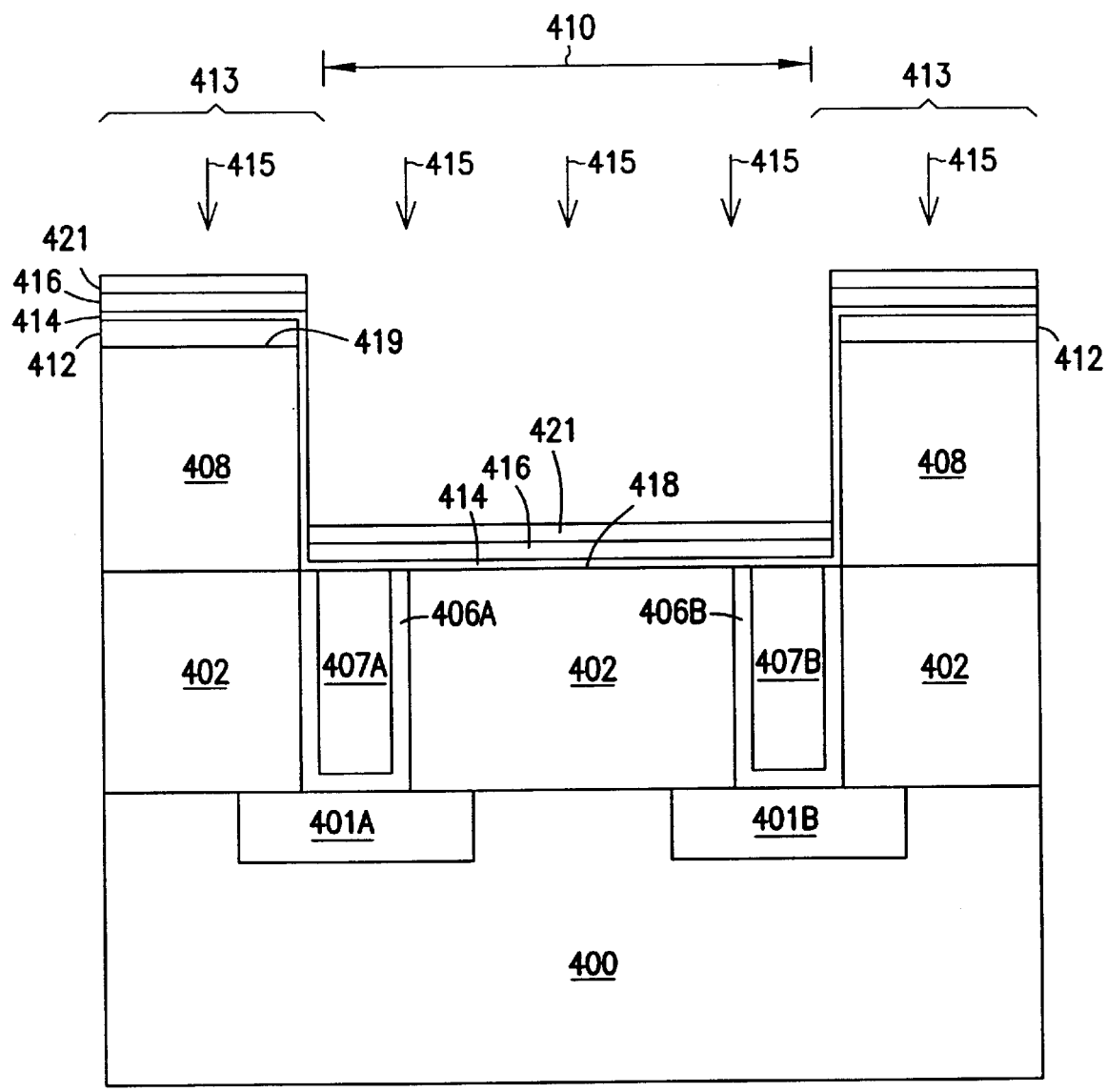

In FIG. 4D, a first seed layer 416 is deposited on the first barrier/adhesion layer 414 using a low energy ion implantation. According to the broader teachings of the present invention, depositing the seed layer 416 on the barrier/adhesion layer 414 includes depositing a seed layer 416 selected from the group consisting of aluminum, copper, silver, and gold. However, according to the teachings of the present embodiment, depositing the seed layer 416 includes depositing a layer of copper 416 having a thickness of approximately a 50 Å. This can be achieved using an $8 \times 10^{16}$ ion implant of copper. According to the teachings of the present invention, using a low energy ion implantation includes implanting the layer of copper 416 at 100 electron volts (eV) into the surface of the trenches 410 in the polymer layer. Also the layer of copper 416 is implanted at an angle normal to the wafer's surface as shown by arrows 415. As one of ordinary skill in the art will understand upon reading this disclosure, implanting the layer of copper 416 at an angle normal to the wafer's surface results in the seed layer of copper 416 remaining on a bottom surface 418 in the number of trenches 410 and to a much lesser extent on the side surfaces 420 of the number of trenches 410. In one embodiment, an optional layer of aluminum 421 is deposited over the copper seed layer 416 again using a low energy ion implantation of 100 electron volts (eV). The optional layer of aluminum 421 is deposited to have a thickness of approximately a 50 Å. This can be achieved using a $3 \times 10^{16}$ ion implant of aluminum normal to the wafer surface as shown by arrows 415. As one of ordinary skill in the art will understand upon reading this disclosure, the layer of aluminum 421 is used to protect the copper seed layer 416 from oxidation prior to subsequent processing steps. The structure is now as appears in FIG. 4D.

Figure 4E:
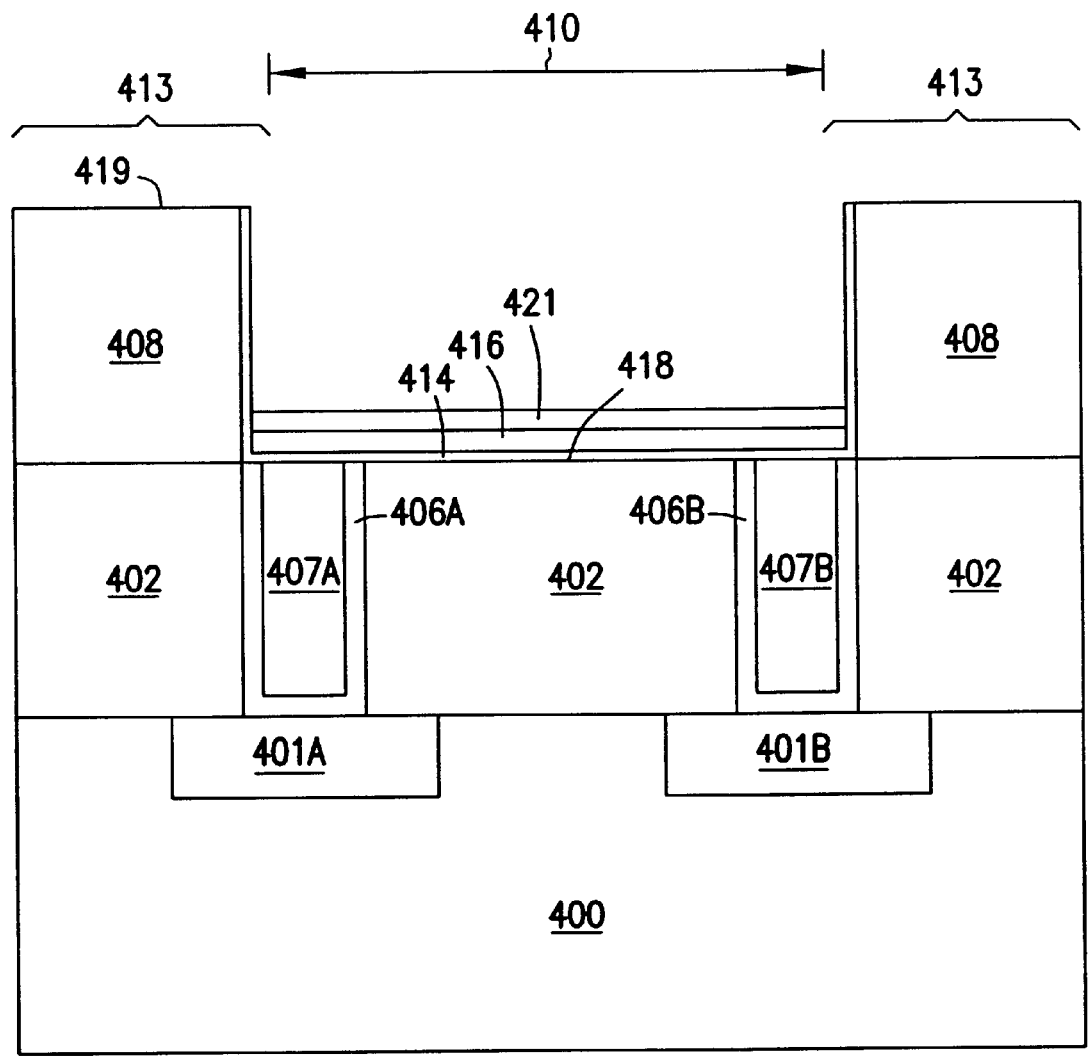

FIG. 4E illustrates the structure after the next sequence of processing steps. As one of ordinary skill in the art will understand upon reading this disclosure, the residual photoresist layer 412 has served as a blocking layer to define the implant areas for the barrier/adhesion layer 414, the seed layer 416, and the layer of aluminum 421. The residual photoresist layer 412 is now removed using a wet strip process, as the same will be understood by one of ordinary skill in the art upon reading this disclosure. According to the teachings of the present invention, removing the residual photoresist layer 412 includes removing the unwanted aluminum layer 421, the unwanted seed layer 416, and the unwanted barrier/adhesion layer 414 from other areas of the wafer's surface, e.g. from over a number of regions 413 outside of the trenches 410 on a top surface 419 of the first insulator layer 408. The structure is now as shown in FIG. 4E.

Figure 4F:
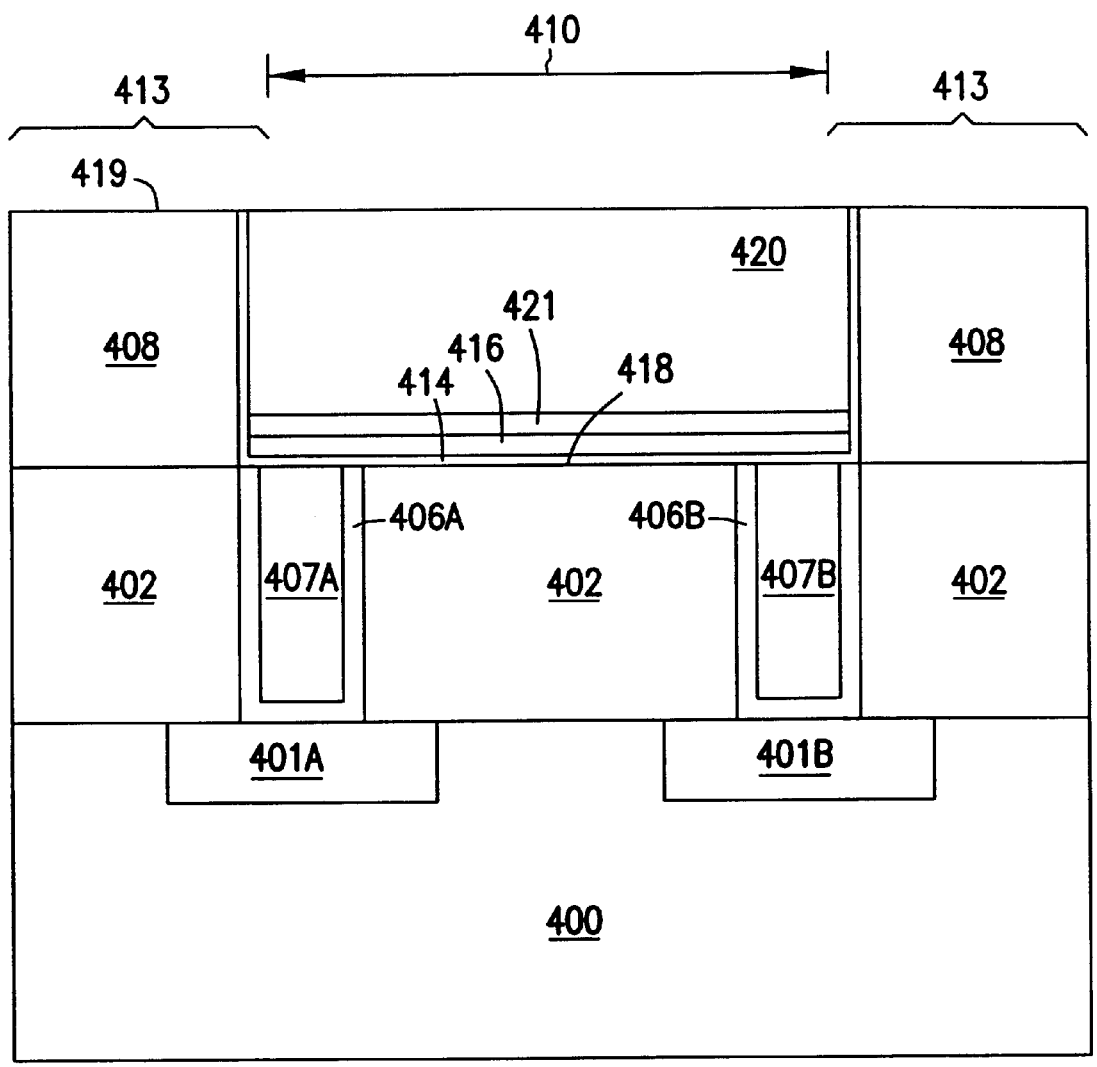

In FIG. 4F, a metallic conductor 420, or number of first level metal lines 420, is deposited over the seed layer 416 in the number of trenches 410. According to teachings of the metallic conductor 420, or number of first level metal lines 420, is selected from the group consisting of aluminum, copper, silver, and gold depending on the type of seed layer 416 which was deposited. According to this embodiment, a number of copper metal lines 420, or first level copper metal lines 420 are selectively formed on the copper seed layer 416. In one embodiment, the metallic conductor 420, or number of first level metal lines 420, is deposited using a selective CVD process. In another embodiment, depositing a metallic conductor 420, or number of first level metal lines 420, over the seed layer 416 includes depositing a metallic conductor 420 using electroless plating. Electroless copper plating is used to deposit sufficient copper to fill the number of trenches 410 to the top surface 419 of the first insulator layer 408.

Figure 4G:
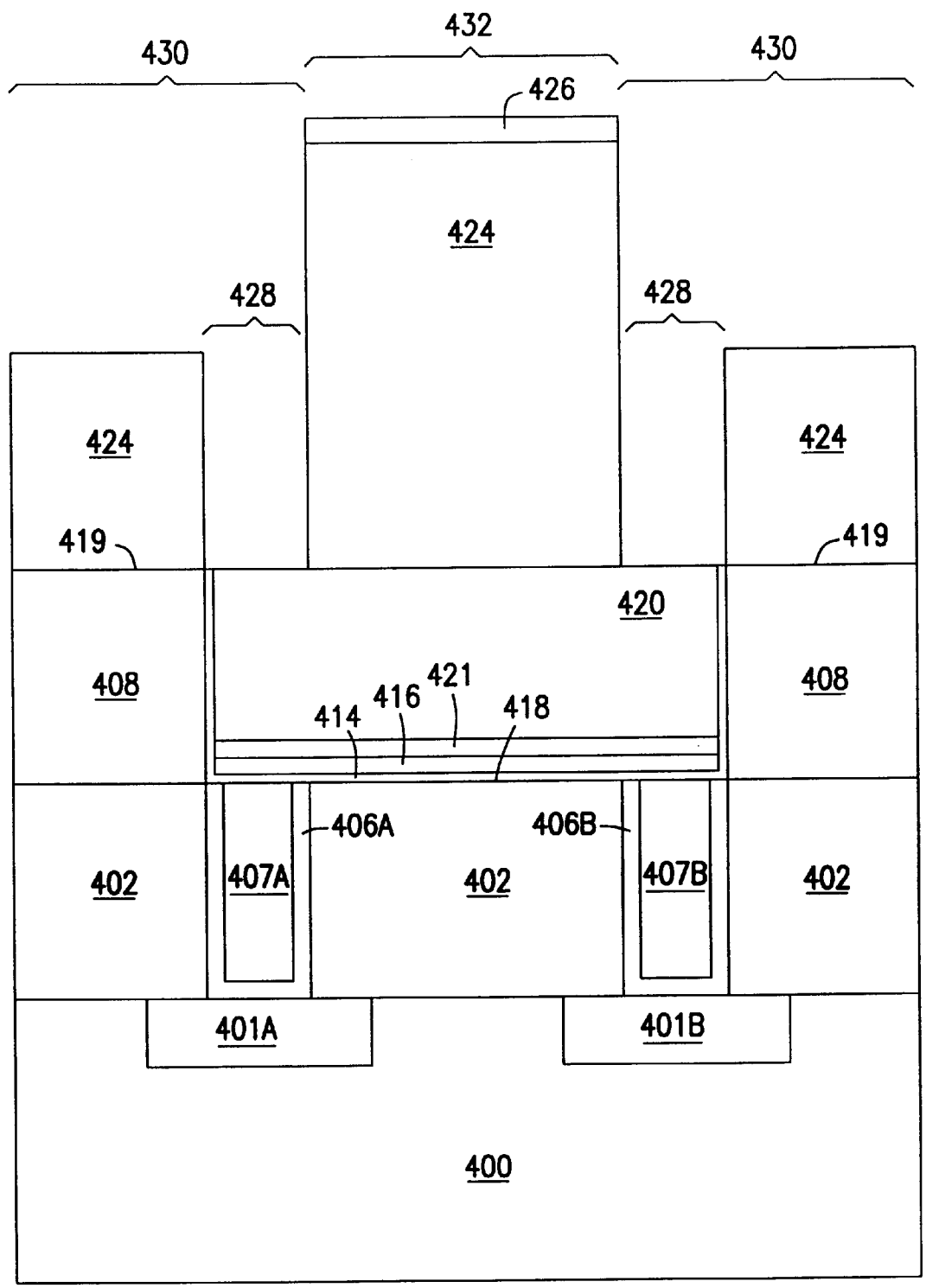

As shown in FIG. 4G, the process sequence may be continued to form any number of subsequent metal layers in a multilayer wiring structure. FIG. 4G illustrates the structure after the next sequence of processing steps. In FIG. 4G, a dual damascene process is used to define and fill a first to a second level of vias and a second level metallurgy. To do so, a second polymer layer 424, or second layer of polyimide 424, is deposited over the wafer surface, e.g. the metallic conductor 420, or number of first level metal lines 420, and the first polymer layer 408. The second polymer layer 424 may similarly be deposited using, for example, the process and material described in co-pending and commonly assigned U.S. application Ser. No. 09/128,859, entitled "Copper Metallurgy in Integrated Circuits," which is hereby incorporated by reference. In one embodiment, depositing a second polymer layer 424 includes depositing a foamed second polymer layer 424. In one embodiment, the second polymer layer 424 is deposited and cured, forming a 10,000 Å thick second polymer layer 424 after curing. As one of ordinary skill in the art will understand, upon reading this disclosure, other suitable thickness for the second polymer layer 424, or second insulator layer/material 424, may also be deposited as suited for forming a first to a second level of vias, e.g. Second level vias, and a number of second level metal lines, the invention is not so limited. The second polymer layer 424, or second insulator layer/material 424 is patterned to define a second level of vias and a number of second level metal lines in the second insulator layer/material 424 opening to the metallic conductor 420, or number of first level metal lines 420. In other words, a second level of vias is defined in a second mask layer of photoresist 426 and then the second polymer layer 424 is etched, using any suitable process, e.g. reactive ion etching (RIE), such that a second level of via openings 428 are defined in the polyimide. Using the dual damascene process, a number of second level metal lines are also defined in a second mask layer of photoresist 426 and the second polymer layer 424 is again etched, using any suitable process, e.g. reactive ion etching (RIE), such that a second level of metal line trenches 430 are defined in the polyimide. One of ordinary skill in the art will understand upon reading this disclosure, the manner in which a photoresist layer 426 can be mask, exposed, and developed using a dual damascene process to pattern a second level of via openings 428 and a second level of metal line trenches 430 in the second insulator layer/material 424.

As described previously, and according to the teachings of the present invention, a residual photoresist layer 426 is left in place on the second insulator layer/material 424 in a number of regions 432 outside of the second level of metal line trenches 430. A suitable plasma and/or wet cleaning process is used to remove any contaminates from the second level of via openings 428 and a second level of metal line trenches 430, as the same will be understood by one of ordinary skill in the art upon reading this disclosure. The structure is now as appears in FIG. 4G.

Figure 4H:
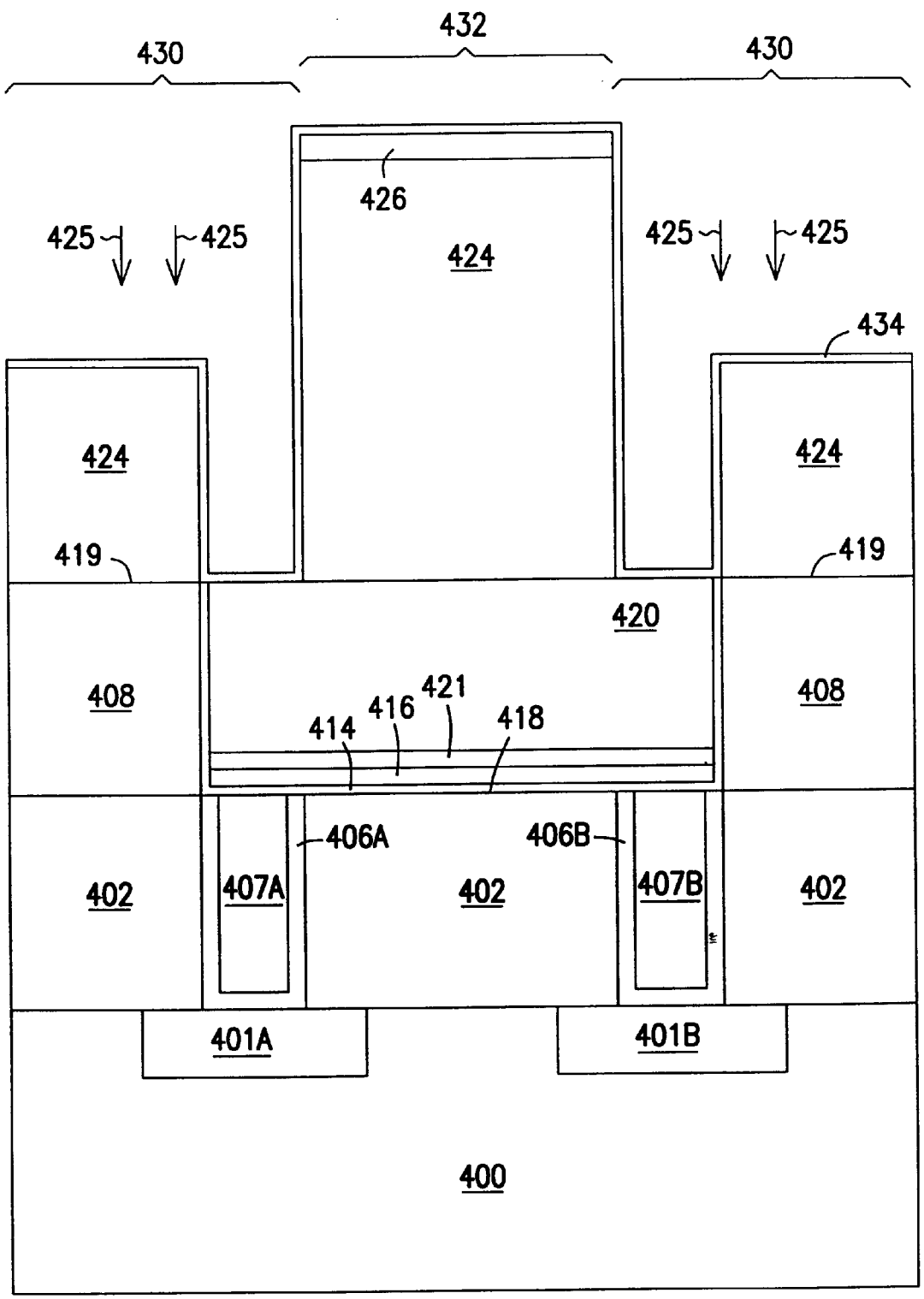
Figure 41:
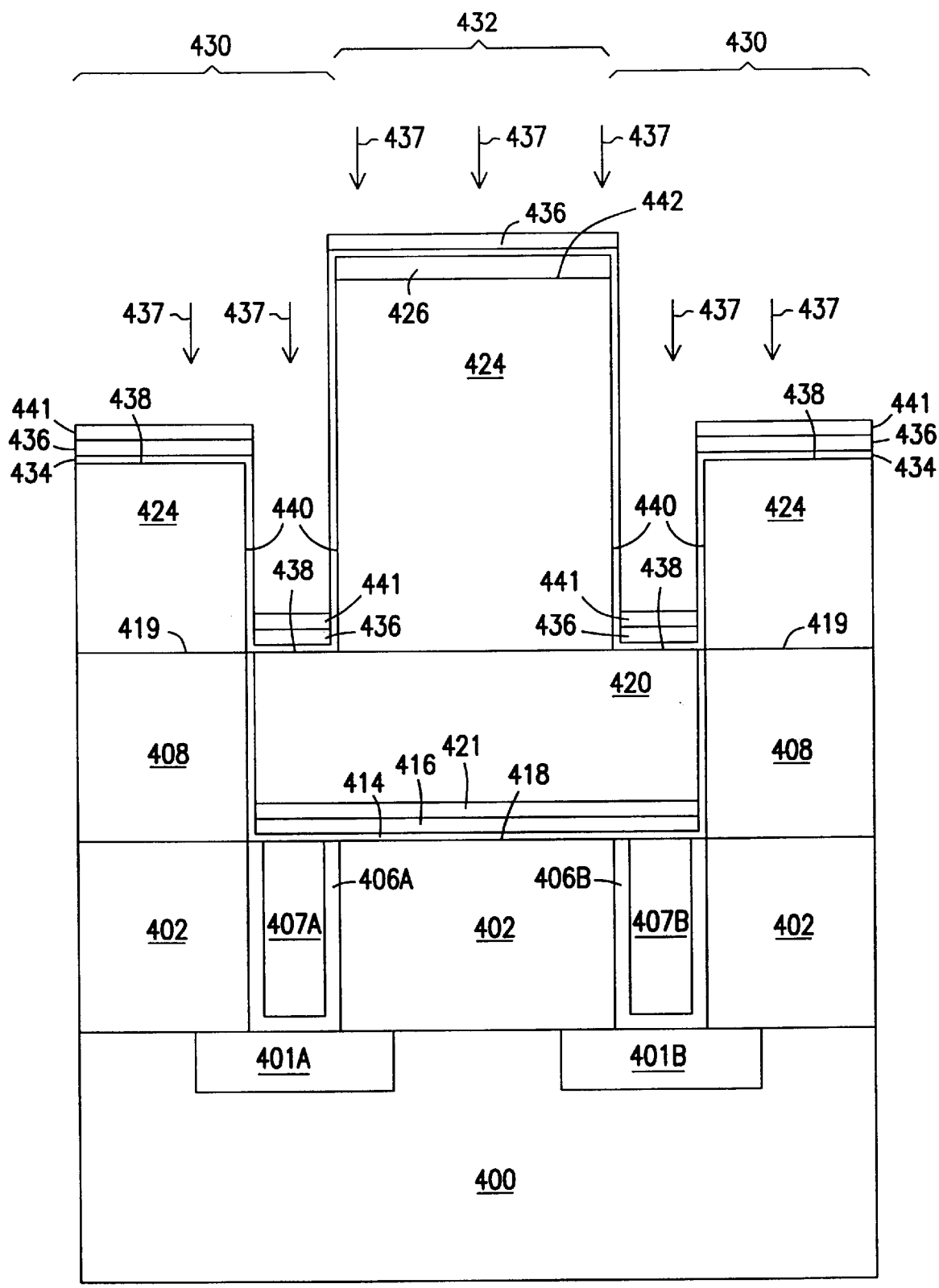

FIG. 4H illustrates the structure after the next sequence of processing steps. In FIG. 4H, a second barrier/adhesion layer 434 is deposited in the second level of via openings 428 and a second level of metal line trenches 430 using a low energy ion implantation. As described above, in one embodiment according to the teachings of the present invention, depositing the second barrier/adhesion layer 434 includes depositing a layer of zirconium 434 having a thickness of approximately 5 to 100 Å. In alternate embodiments, depositing the second barrier/adhesion layer 434 includes depositing a barrier/adhesion layer 434 of titanium and/or hafnium. In one embodiment, depositing the layer of zirconium 434 includes depositing a layer of zirconium 434 having a thickness of approximately 15 Å. In one embodiment, this is achieved using a $10^{17}$ ion implant of zirconium. According to the teachings of the present invention, the layer of zirconium 434 is implanted at 100 electron volts (eV) into the surface of the second level of via openings 428 and a second level of metal line trenches 430 in the second polymer layer 424 using an implant angle normal to the wafer's surface as shown by arrows 425. The structure is now as appears in FIG. 4H.

FIG. 4I illustrates the structure after the next sequence of processing steps. In FIG. 4L a second seed layer 436 is deposited on the second barrier/adhesion layer 434 using a low energy ion implantation. According to the broader teachings of the present invention, depositing the second seed layer 436 on the second barrier/adhesion layer 414 includes depositing a second seed layer 436 selected from the group consisting of aluminum, copper, silver, and gold. However, according to the teachings of the present embodiment, depositing the second seed layer 436 includes depositing a second layer of copper 436 having a thickness of approximately a 50 Å. In one embodiment, this is achieved using an $8\times10^{16}$ ion implant of copper. According to the teachings of the present invention, using a low energy ion implantation includes implanting the layer of copper 436 at 100 electron volts (eV) into the second level of via openings 428 and the second level of metal line trenches 430 in the polymer layer. Also the layer of copper 436 is implanted at an angle normal to the wafer's surface as shown by arrows 437. As one of ordinary skill in the art will understand upon reading this disclosure, implanting the layer of copper 436 at an angle normal to the wafer's surface results in the second seed layer of copper 436 remaining on a bottom surface 438 in the second level of via openings 428 and to a much lesser extent on the side surfaces 440 of the second level of via openings 428 and a second level of metal line trenches 430. In one embodiment, an optional layer of aluminum 441 is deposited over the second copper seed layer 436 again using a low energy ion implantation of 100 electron volts (eV). The optional layer of aluminum is deposited to have a thickness of approximately a 50 Å. In one embodiment, this is achieved using a $3\times10^{16}$ ion implant of aluminum normal to the wafer surface. As one of ordinary skill in the art will understand upon reading this disclosure, the layer of aluminum 441 is used to protect the second copper seed layer 436 from oxidation prior to subsequent processing steps. The structure is now as appears in FIG. 4I.

Figure 4J:
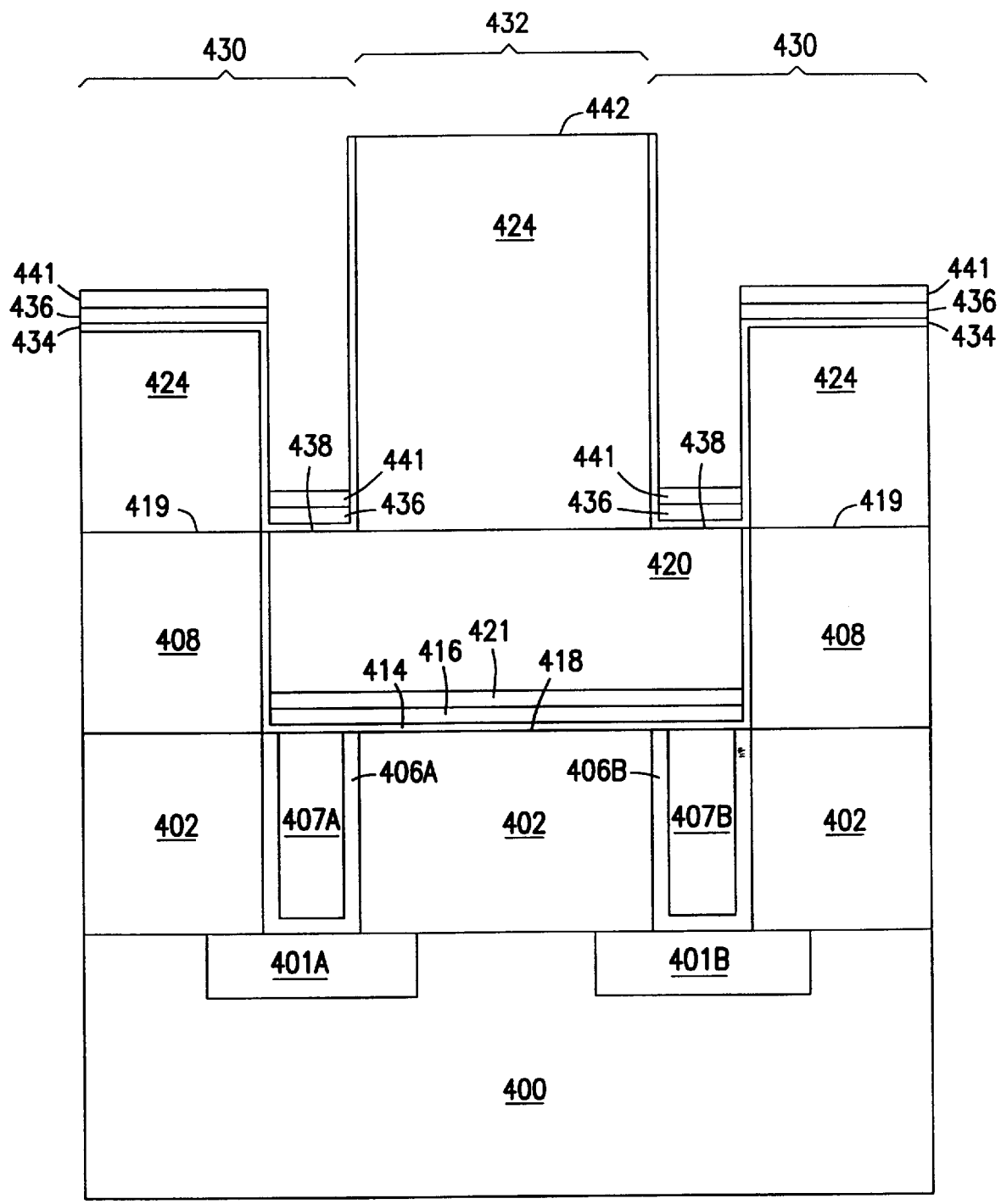

FIG. 4J illustrates the structure after the next sequence of processing steps. As one of ordinary skill in the art will understand upon reading this disclosure, the residual photoresist layer 426 has served as a blocking layer to define the implant areas for the second barrier/adhesion layer 434, the second seed layer 436, and the aluminum layer 441. The residual photoresist layer 426 is now removed using a wet strip process, as the same will be understood by one of ordinary skill in the art upon reading this disclosure. According to the teachings of the present invention, removing the residual photoresist layer 426 includes removing the unwanted aluminum layer 441, the unwanted seed layer 436, and the unwanted barrier/adhesion layer 434 from other areas of the wafer's surface, e.g. from over a number of regions 432 outside of second level of metal line trenches 430 on a top surface 442 of the second insulator layer 424. The structure is now as shown in FIG. 4J.

Figure 4K:
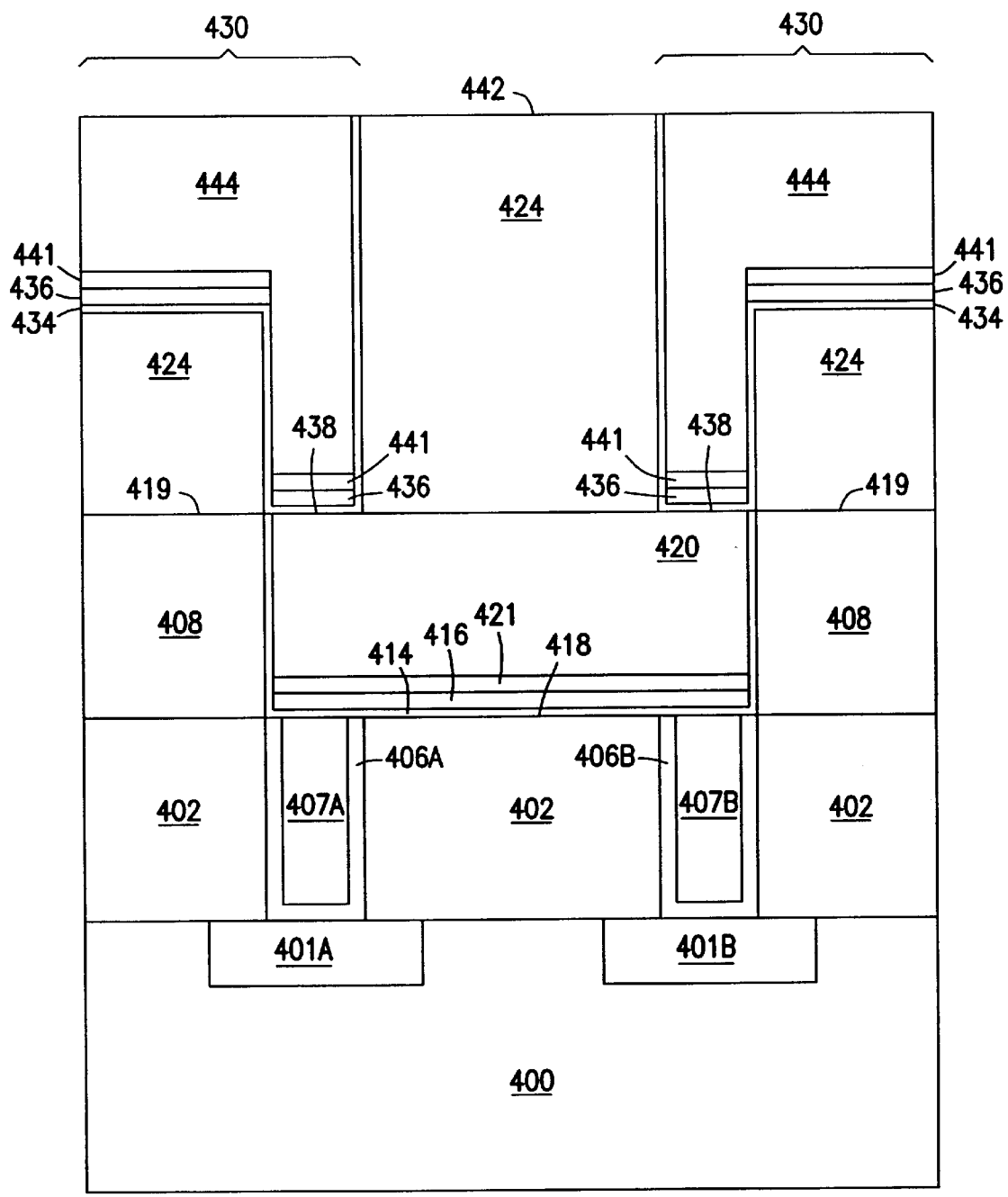
Figure 4L:
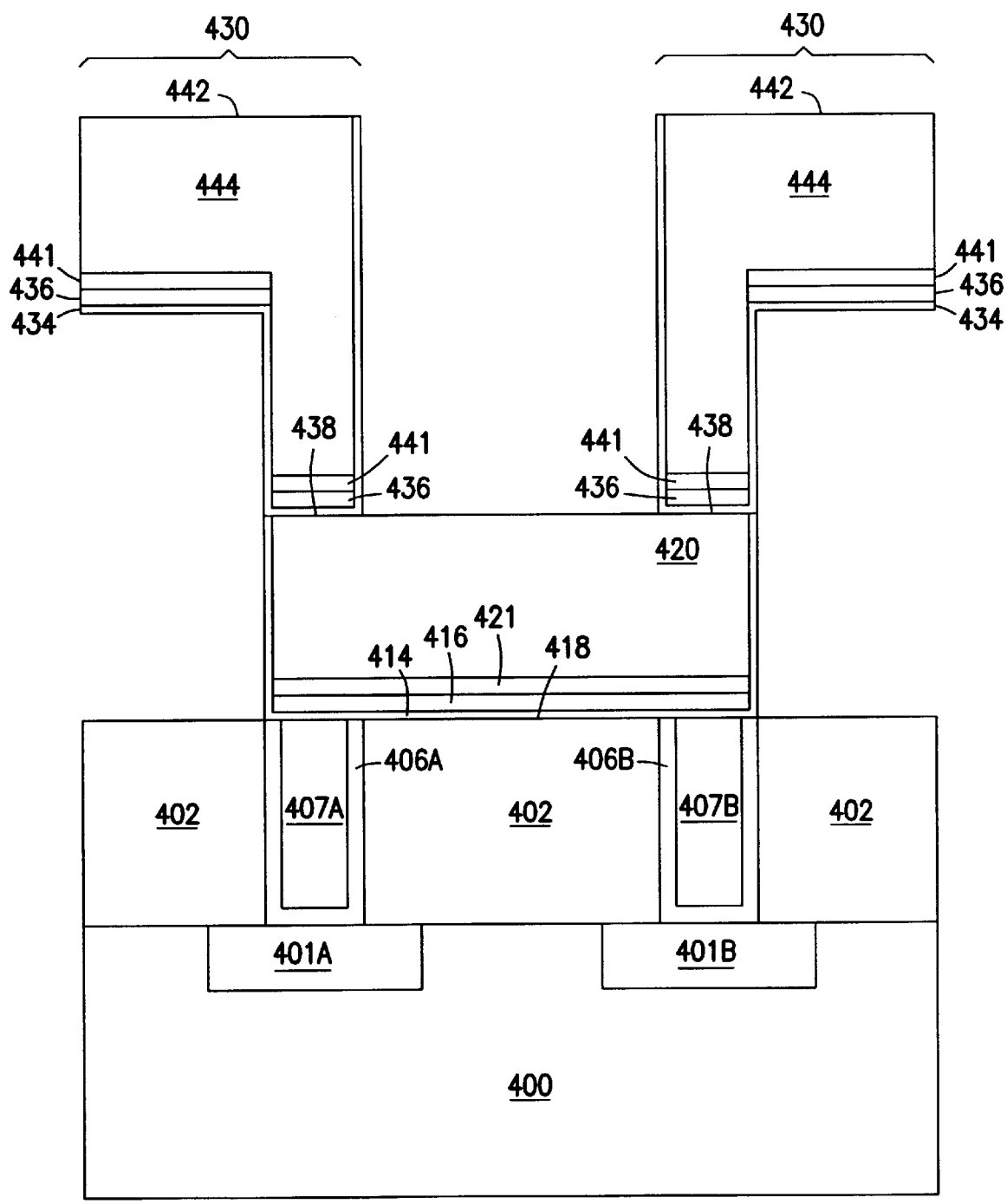

In FIG. 4K, a second metallic conductor 444, or second core conductor 444, is deposited over or formed on the second seed layer 436 and within the second barrier/adhesion layer 434 in the second level of via openings 428 and the second level of metal line trenches 430 in the polymer layer. In this embodiment the second metallic conductor 444, or second core conductor 444, is copper, but in other embodiments of the present invention the second metallic conductor 444, or second core conductor 444, can be selected from the group consisting of aluminum, silver, and gold. In one embodiment, the second metallic conductor 444, or second core conductor 444, is deposited using a selective CVD process. In another embodiment, depositing a second metallic conductor 444, or second core conductor 444, over on the second seed layer 436 and within the second barrier/adhesion layer 434 includes depositing a second metallic conductor 444, or second core conductor 444, using electroless plating. Electroless copper plating is used to deposit sufficient copper to fill the second level of via openings 428 and the second level of metal line trenches 430 to the top surface 442 of the second insulator layer 424. Thus, the second barrier/adhesion layer 434, the second seed layer 436, and the second metallic conductor 444, or second core conductor 444, constitute a second number of conductive structures which includes a number of second level vias and a number of second level metal lines which are formed over and connect to a first number of conductive structures, e.g. the metallic conductor 420, or number of first level metal lines 420.

As one of ordinary skill in the art will understand upon reading this disclosure, the above described method embodiments can be repeated until the requisite number of metal layers are formed. FIG. 4L illustrates the structure following the final sequence of processing steps. Upon completion of the last level of metal, the entire polymer structure, e.g. first polymer layer 408 and second polymer layer 424, are removed using an O₂ plasma etch. The structure is now as appears in FIG. 4L.

Figure 5:
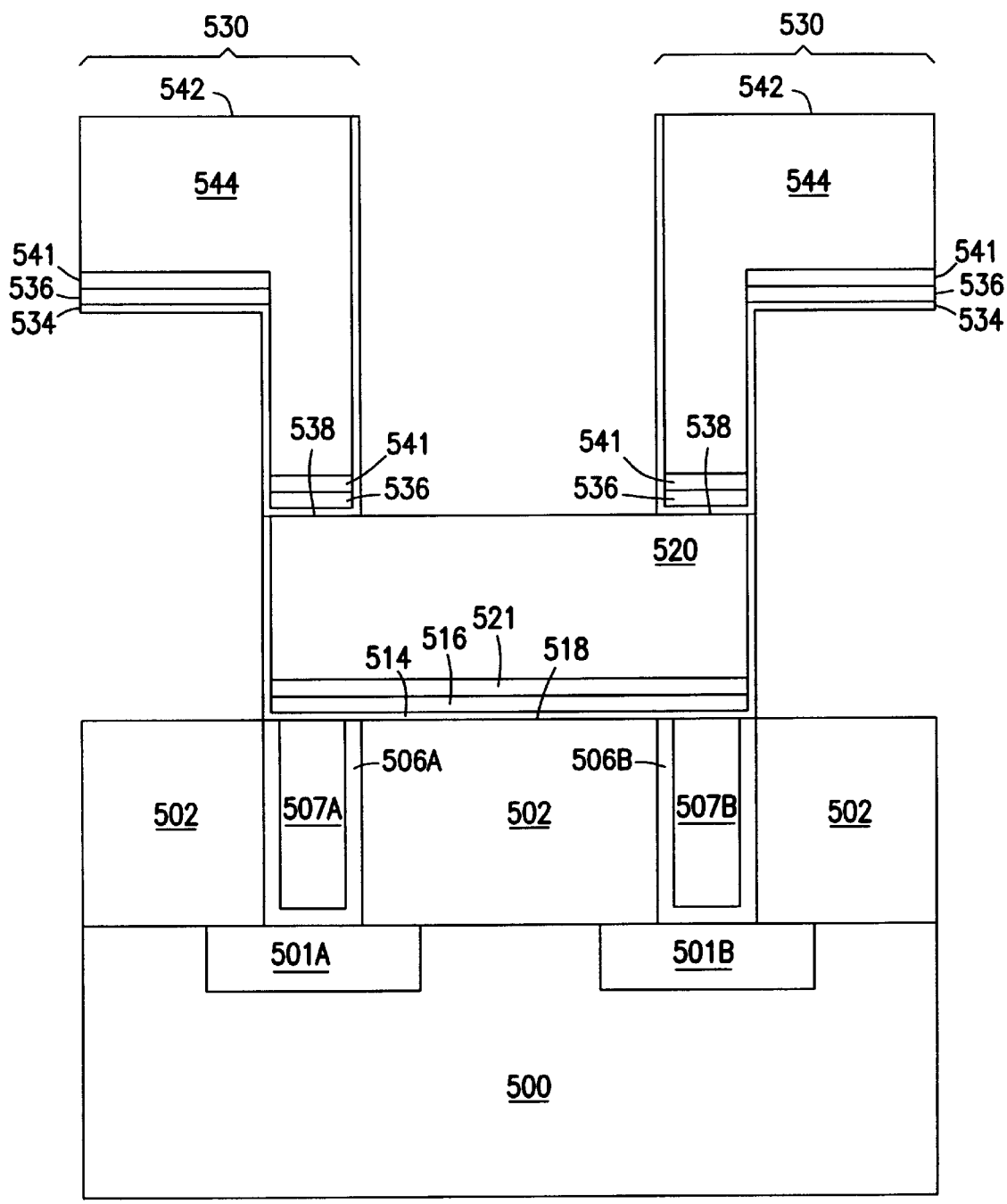
FIG. 5, is an illustration of an integrated circuit formed according to the teachings of the present invention.

FIG. 5, is an illustration of an embodiment of an integrated circuit formed according to the teachings of the present invention. As shown in FIG. 5, the integrated circuit includes a metal layer in an integrated circuit. The metal layer includes a number of first level vias 507A and 507B connecting to a number of silicon devices 501 A and 501 B in a substrate 500. A number of first level metal lines 520 are formed above and connect to the number of first level vias 507A and 507B. A barrier/adhesion layer 518 having a thickness in the range of 5 to 150 Angstroms is formed on the number of first level metal lines 520. A seed layer 516 having a thickness in the range of 5 to 150 Angstroms is formed at least between a portion of the barrier/adhesion layer 518 and the number of first level metal lines 520. As described above the barrier adhesion layer 50 having a thickness in the range of 5 to 150 Angstroms includes a barrier/adhesion layer selected from the group consisting of titanium, zirconium, and hafnium. In one embodiment, as shown in FIG. 5, the number of first level vias 507A and 507B connecting to a number of silicon devices 501A and 501B in substrate 500 are surrounded by an insulator layer.

As described above the number of first level metal lines 502 includes a number of first level metal lines 520 is selected from the group consisting of Aluminum, Copper, Silver, and Gold. In one embodiment, the integrated circuit 503 comprises a portion of an integrated memory circuit 503. In this embodiment, the number of silicon devices 501A and 501B includes one or more transistors 501A and 501B in the substrate 500.

As one of ordinary skill in the art will understand upon reading this disclosure, any one of the embodiments as shown in FIGS. 1K, 2K, 3K, and/or 4L can comprise a portion of an integrated circuit according to the teachings of the present invention.

Figure 6:
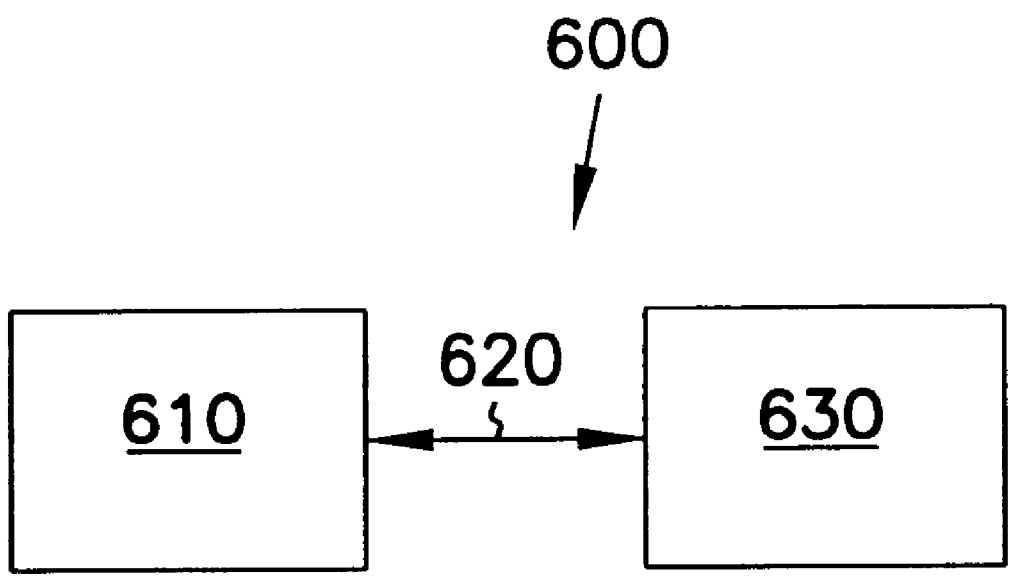
FIG. 6 illustrates an embodiment of a system including a portion of an integrated circuit formed according to any of the embodiments described in the present application.

FIG. 6 illustrates an embodiment of a system 600 including a portion of an integrated circuit formed according to any of the embodiments described in the present application. As one of ordinary skill in the art will understand upon reading this disclosure, this system 600 includes a processor 610 and an integrated circuit, or integrated memory circuit 630 coupled to the processor 610. The processor 610 can be coupled to the integrated memory circuit 630 via any suitable bus, as the same are known and understood by one of ordinary skill in the art. In the embodiment, the processor 610 and integrated circuit 630 are located on a single wafer or die. Again, at least a portion of the integrated circuit 630 includes a portion of an integrated circuit 603 as disclosed in the various embodiments provided herein.

CONCLUSION

Thus, structures and methods have been provided which improve the performance of integrated circuits according to shrinking design rules. The structures and methods include a diffusion barrier and a seed layer in an integrated circuit both formed using a low energy ion implantation followed by a selective deposition of metal lines for the integrated circuit. According to the teachings of the present invention, the selective deposition of the metal lines avoids the need for multiple chemical mechanical planarization (CMP) steps. The low energy ion implantation of the present invention allows for the distinct placement of both the diffusion barrier and the seed layer. A residual resist can be used to remove the diffusion barrier and the seed layer from unwanted areas on a wafer surface. The structures formed by the described novel processes accommodate aluminum, copper, gold, and silver metal interconnects.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed:

1. A method of making a diffusion barrier and a seed layer in an integrated circuit assembly, comprising:
    pattering an insulator material to define a number of trenches in the insulator layer opening to a number of first level vias in a planarized surface;
    depositing a barrier/adhesion layer in the number of trenches using a low energy ion implantation; aid
    depositing a seed layer on the barrier/adhesion layer in the number of trenches using a low energy ion implantation, wherein using a low energy ion implantation includes using a 100 to 800 electron volt (eV) ion implantation.

2. The method of claim 1, where in pattering an insulator material includes pattering a polyimide.

3. The method of claim 1, wherein depositing a barrier/adhesion layer includes depositing a barrier/adhesion layer selected from the group consisting of Titanium, Zirconium, and Hafnium.

4. The method of claim 3, wherein depositing a barrier/adhesion layer includes depositing a barrier/adhesion layer having a thickness in the range of 5 to 100 Angstroms.

5. The method of claim 1, wherein the method further includes depositing a metallic conductor over the seed layer in the number of trenches, wherein the metallic conductor is selected from the group consisting of Aluminum, Copper, Silver, and Gold.

6. The method of claim 5, wherein depositing a metallic conductor over the seed layer includes depositing a metallic conductor using electroless plating.

7. The method of claim 1, wherein depositing a seed layer on the barrier/adhesion layer includes depositing a seed layer selected from the group consisting of Aluminum, Copper, Silver, and Gold.

8. A method of making copper, silver, or gold interconnect for an integrated circuit, comprising:
    depositing an insulator layer having a thickness suitable for a first level metal interconnect over a planarized surface;
    etching the insulator layer using a mask layer of photoresist to define a number of trenches in the insulator layer opening to a number of first level vias in the planarized surface;
    depositing a barrier/adhesion layer in the number of trenches using a low energy ion implantation of 100 to 700 electron volts;
    depositing a seed layer on the barrier/adhesion layer in the number of trenches using a low energy ion implantation of 100 to 700 electron volts; and
    depositing a metallic conductor over the seed layer.

9. The method of claim 8, wherein etching the insulator layer using a mask layer of photoresist to define a number of trenches in the insulator layer further includes:
   leaving a residual photoresist layer on the insulator layer in a number of regions outside of the number of trenches; and
   removing the barrier/adhesion layer and the seed layer from the number of regions outside of the number of trenches using a photoresist strip prior to depositing the metallic conductor over the seed layer.

10. The method of claim 8, wherein depositing a barrier/adhesion layer in the number of trenches includes depositing a barrier/adhesion layer of Zirconium using a low energy ion implantation of approximately 100 electron volts and using a varying angle implant, wherein an angle of implantation is changed from normal to the planarized surface to approximately 15 degrees off normal.

11. The method of claim 10, wherein depositing a barrier/adhesion layer of Zirconium includes depositing a barrier/adhesion layer of Zirconium having a thickness of approximately 50 Angstroms.

12. The method of claim 8, wherein depositing an insulator layer having a thickness suitable for a first level metal interconnect includes depositing a layer of polyimide having a thickness of approximately 5000 Angstroms.

13. The method of claim 8, wherein depositing a seed layer on the barrier/adhesion layer in the number of trenches includes depositing a layer of Copper using a low energy ion implantation of approximately 100 electron volts normal to the planarized surface.

14. The method of claim 13, wherein depositing a layer of Copper includes depositing a layer of Copper having a thickness of approximately 100 Angstroms.

15. The method of claim 14, wherein the method further includes depositing a layer of Aluminum having a thickness of approximately 50 Angstroms on the layer of Copper using a low energy ion implantation of approximately 100 electron volts normal to the planarized surface.

16. A method of making a diffusion barrier and a seed layer in an integrated circuit assembly, comprising:
   depositing an insulator layer having a thickness suitable for a first level metal interconnect over a planarized surface;
   etching the insulator layer using a mask layer of photoresist to define a number of trenches in the insulator layer opening to a number of first level vias in the planarized surface;
   depositing a barrier/adhesion layer in the number of trenches having a thickness in the range of 5 to 150 Angstroms using a low energy ion implantation of 100 to 700 electron volts;
   depositing a seed layer on the barrier/adhesion layer in the number of trenches having a thickness in the range of 5 to 150 Angstroms using a low energy ion implantation of 100 to 700 electron volts; and
   depositing a metallic conductor over the seed layer using a selective deposition process.

17. The method of claim 16, wherein depositing an insulator layer includes depositing an oxide layer.

18. The method of claim 17, wherein depositing an oxide layer includes depositing a fluorinated silicon oxide.

19. The method of claim 16, wherein depositing a barrier/adhesion layer in the number of trenches includes depositing a barrier/adhesion layer of Titanium or Zirconium having a thickness of approximately 50 Angstroms and using a low energy ion implantation of approximately 100 electron volts.

20. The method of claim 16, wherein depositing a seed layer on the barrier/adhesion layer in the number of trenches includes:
   depositing a first layer of Aluminum on the barrier/adhesion layer having a thickness of approximately 50 Angstroms using a low energy ion implantation of approximately 100 electron volts;
   depositing a layer of Copper on the first layer of Aluminum having a thickness of approximately 10 Angstroms using a low energy ion implantation of approximately 100 electron volts; and
   depositing a second layer of Aluminum on the layer of Copper having a thickness of approximately 50 Angstroms using a low energy ion implantation of approximately 100 electron volts.

21. The method of claim 20, wherein depositing a metallic conductor over the seed layer using a selective deposition process includes depositing a metallic conductor over the seed layer sufficient to fill the number of trenches to a top surface of the insulator layer.

22. A method of making a diffusion barrier and a seed layer in an integrated circuit assembly, comprising:
   depositing an oxide layer having a thickness suitable for a first level metal interconnect over a planarized surface;
   etching the oxide layer using a mask layer of photoresist to define a number of trenches in the oxide layer opening to a number of first level vias in the planarized surface;
   depositing a layer of tantalum in the number of trenches, wherein the layer of tantalum has a thickness of approximately 100 Angstroms and is deposited using a low energy ion implantation of approximately 100 electron volts;
   depositing a layer of Nitrogen on the layer of tantalum using a low energy ion implantation of approximately 700 electron volts;
   depositing a seed layer of Copper on layer of Nitrogen in the number of trenches having a thickness of approximately 100 Angstroms using a low energy ion implantation of approximately 100 electron volts; and
   depositing a metallic conductor over the seed layer using a selective deposition process.

23. The method of claim 22, wherein depositing a layer of tantalum using a low energy ion implantation of approximately 100 electron volts includes varying an angle of implantation wherein the angle is varied from an angle normal to the planarized surface to an angle 15 degrees off normal.

24. The method of claim 22, wherein depositing a layer of Nitrogen on the layer of tantalum using a low energy ion implantation of approximately 700 electron volts includes varying an angle of implantation wherein the angle is varied from an angle normal to the planarized surface to an angle 15 degrees off normal.

25. The method of claim 22, wherein depositing a seed layer of Copper on the barrier/adhesion layer in the number of trenches using a low energy ion implantation of approximately 100 electron volts includes implanting the seed layer of copper at an angle normal to the planarized surface.

26. The method of claim 23, wherein etching the insulator layer using a mask layer of photoresist to define a number of trenches in the insulator layer further includes:
   leaving a residual photoresist layer on the insulator layer in a number of regions outside of the number of trenches; and removing the tantalum, Nitrogen and seed layer of copper from the number of regions outside of the number of trenches using a photoresist strip prior to depositing the metallic conductor over the seed layer.

27. The method of claim 22, wherein depositing a metallic conductor over the seed layer using a selective deposition process includes depositing a layer of copper using electroless plating.

28. The method of claim 27, wherein depositing a metallic conductor over the seed layer includes filling the number of trenches to a height (h) approximately 100 Angstroms lower than a top surface of the oxide layer.

29. The method of claim 28, wherein the method further includes depositing a layer of tantalum nitride having a thickness of approximately 100 Angstroms on the metallic conductor in the number of trenches.

30. A method of forming copper metal lines in an integrated circuit assembly, comprising:

depositing a polymer layer having a thickness suitable for a first level metal interconnect over a planarized surface;

etching the polymer layer using a mask layer of photoresist to define a number of trenches in the polymer layer opening to a number of first level vias in the planarized surface;

depositing a layer of zirconium in the number of trenches, wherein the layer of zirconium has a thickness of approximately 15 Angstroms and is deposited using a low energy ion implantation of approximately 100 electron volts;

depositing a seed layer of Copper on the layer of zirconium in the number of trenches having a thickness of approximately 50 Angstroms using a low energy ion implantation of approximately 100 electron volts; and depositing a first level metallic conductor over the seed layer using a selective deposition process.

31. The method of claim 30, wherein the method further includes depositing a layer of aluminum having a thickness of approximately 50 Angstroms on the seed layer of Copper using a low energy ion implantation of approximately 100 electron volts.

32. The method of claim 30, wherein etching the polymer layer using a mask layer of photoresist to define a number of trenches in the polymer layer further includes:

leaving a residual photoresist layer on the polymer layer in a number of regions outside of the number of trenches; and removing the zirconium and the seed layer of copper from the number of regions outside of the number of trenches using a photoresist strip prior to depositing the first level metallic conductor over the seed layer.

33. The method of claim 30 wherein depositing a metallic conductor over the seed layer using a selective deposition process includes depositing a layer of copper using electroless plating to fill the number of trenches to a top surface of the polymer layer.

34. The method of claim 30, wherein depositing a polymer layer includes depositing a foamed polymer layer.

35. The method of claim 34, wherein the method further includes:

depositing a polymer layer having a thickness of approximately 10,000 Angstroms in which to form a number of second level vias and a second level metal interconnect over the first level metallic conductor;

etching the polymer layer using a mask layer of photoresist in a dual damascene process to define a number of second level vias and a number of second level metal trenches in the polymer layer opening to the first level metallic conductor;

depositing a layer of zirconium in the number of second level vias and a number of second level metal trenches, wherein the layer of zirconium has a thickness of approximately 15 Angstroms and is deposited using a low energy ion implantation of approximately 100 electron volts;

depositing a seed layer of Copper on the layer of zirconium in the number of second level vias and a number of second level metal trenches having a thickness of approximately 50 Angstroms using a low energy ion implantation of approximately 100 electron volts; and depositing a layer of copper over the seed layer in the number of second level vias and a number of second level metal trenches using a selective deposition process.

36. The method of claim 35, wherein the method further includes depositing a layer of aluminum having a thickness of approximately 50 Angstroms on the seed layer of Copper using a low energy ion implantation of approximately 100 electron volts.

37. The method of claim 36, wherein depositing a layer of copper over the seed layer includes depositing a layer of copper over the seed layer using electroless plating.

38. The method of claim 37, wherein the method further includes removing each of the polymer layers using an $O_2$ plasma etch.

39. A method of making a multilayer wiring structure in an integrated circuit assembly, comprising:

patterning a first insulator layer using a mask layer of photoresist to define a number of first level metal line trenches in the first insulator layer opening to a number of first level vias in the planarized surface;

depositing a first barrier/adhesion layer in the number of first level metal line trenches having a thickness in the range of 5 to 150 Angstroms using a low energy ion implantation of 100 to 700 electron volts;

depositing a first seed layer on the barrier/adhesion layer in the number of first level metal line trenches having a thickness in the range of 5 to 150 Angstroms using a low energy ion implantation of 100 to 700 electron volts;

depositing a number of first level metal lines over the seed layer using a selective deposition process;

depositing a second insulator layer having a thickness of approximately 10,000 Angstroms in which to form a number of second level vias and a second level metal interconnect over the number of first level metal lines;

etching the second insulator layer using a mask layer of photoresist in a dual damascene process to define a number of second level vias and a number of second level metal trenches in the second insulator layer opening to the number of first level metal lines;

depositing a second barrier/adhesion layer in the number of second level vias and a number of second level metal trenches having a thickness in the range of 5 to 150 Angstroms using a low energy ion implantation of 100 to 700 electron volts;

depositing a second seed layer on the barrier/adhesion layer in the number of second level vias and a number of second level metal trenches having a thickness in the range of 5 to 150 Angstroms using a low energy ion implantation of 100 to 700 electron volts; and depositing a metal conductor over the second seed layer in the number of second level vias and the number of second level metal trenches using a selective deposition process.

40. The method of claim 39, wherein patterning a first insulator layer and depositing a second insulator layer includes patterning a first insulator layer and depositing a second insulator layer of polyimide.

41. The method of claim 39, wherein depositing a first and a second barrier/adhesion layer includes depositing a first and a second barrier/adhesion layer selected from the group consisting of tantalum nitride, titanium, zirconium, and hafnium.

42. The method of claim 39, wherein depositing a number of first level metal lines and depositing a metal conductor over the second seed layer includes depositing a number of first level metal lines and depositing a metal conductor over the second seed layer which are selected from the group consisting of Aluminum, Copper, Silver, and Gold.

43. The method of claim 39, wherein depositing a number of first level metal lines and depositing a metal conductor over the second seed layer includes depositing a number of first level metal lines and depositing a metal conductor over the second seed layer using electroless plating.

44. The method of claim 39, wherein depositing a first and a second seed layer on the first and the second barrier/adhesion layer includes depositing a first and a second seed layer selected from the group consisting of Aluminum, Copper, Silver, and Gold.

45. The method of claim 39, wherein patterning a first insulator layer using a mask layer of photoresist and etching the second insulator layer using a mask layer of photoresist in a dual damascene process includes:

leaving a residual photoresist layer on a top surface of the first and the second insulator layers; and removing the first and the second barrier/adhesion layers as well as the first and the second seed layers from above the top surface of the first and the second insulator layers using a photoresist strip prior to depositing the number of first level metal lines and prior to depositing a metal conductor over the second seed layer.

* * * * *

UNITED STATES PATENT AND TRADEMARK OFFICE
CERTIFICATE OF CORRECTION

PATENT NO. : 6,376,370 B1
DATED : April 23, 2002
INVENTOR(S) : Farrar

It is certified that error appears in the above-identified patent and that said Letters Patent is hereby corrected as shown below:

<u>Title page, Item [54] and Column 1, lines 3-6,</u>
Delete "PROCESS FOR PROVIDING SEED LAYERS FOR USING ALUMINUM, COPPER, GOLD AND SILVER METALLURGY".

Item [56], References Cited, OTHER PUBLICATIONS,
Delete "Phys.Lett.60" and insert -- Phys. Lett. 60 --, therefor.
Delete "Foundation" and insert -- Foundations --, therefor.
Delete "PRoceedings" and insert -- Proceedings --, therefor.
Delete "Proc" and insert -- Proc. --, therefor.
Delete "electrless" and insert -- electroless --, therefor.
Delete "Sio2" and insert -- $SiO_2$ --, therefor.
Delete "PLasma" and insert -- Plasma --, therefor.
Delete "mangetron" and insert -- magnetron --, therefor.
Delete "SiO2" and insert -- $SiO_2$ --, therefor.

<u>Column 1,</u>
Line 14, delete "Method for Making Copper Interconnects in Integrated Circuits" and insert -- Methods for Making Integrated-Circuit Wiring from Copper, Silver, Gold, and Other Metals --, therefor.
Line 48, delete "through." and insert -- through --, therefor.
Line 55, delete "vol.57" and insert -- vol. 57 --, therefor.

<u>Column 2,</u>
Line 6, delete "the." and insert -- the --, therefor.
Line 37, delete "must be." and insert -- must be --, therefor.

<u>Column 3,</u>
Line 4, delete "co-pending." and insert -- co-pending --, therefor.
Line 12, delete "comers" and insert -- corners --, therefor.
Line 23, delete "scale integration" and insert -- scale-integration --, therefor.

<u>Column 4,</u>
Line 53, delete "unhoped" and insert -- undoped --, therefor.

UNITED STATES PATENT AND TRADEMARK OFFICE
CERTIFICATE OF CORRECTION

PATENT NO. : 6,376,370 B1
DATED : April 23, 2002
INVENTOR(S) : Farrar

It is certified that error appears in the above-identified patent and that said Letters Patent is hereby corrected as shown below:

Column 5,
Line 17, delete "Embodiment of a Metal Interconnect using Copper and Polymide" and insert -- Embodiment of a Metal Interconnect using Copper and Polymide --, therefor.
Line 33, delete "skill in." and insert -- skill in --, therefor.
Line 50, delete "are" and insert -- art --, therefor.

Column 6,
Line 34, delete "depositing the" after "embodiment,".
Line 42, delete "()" and insert -- ($\propto$) --, therefor.

Figure 11:
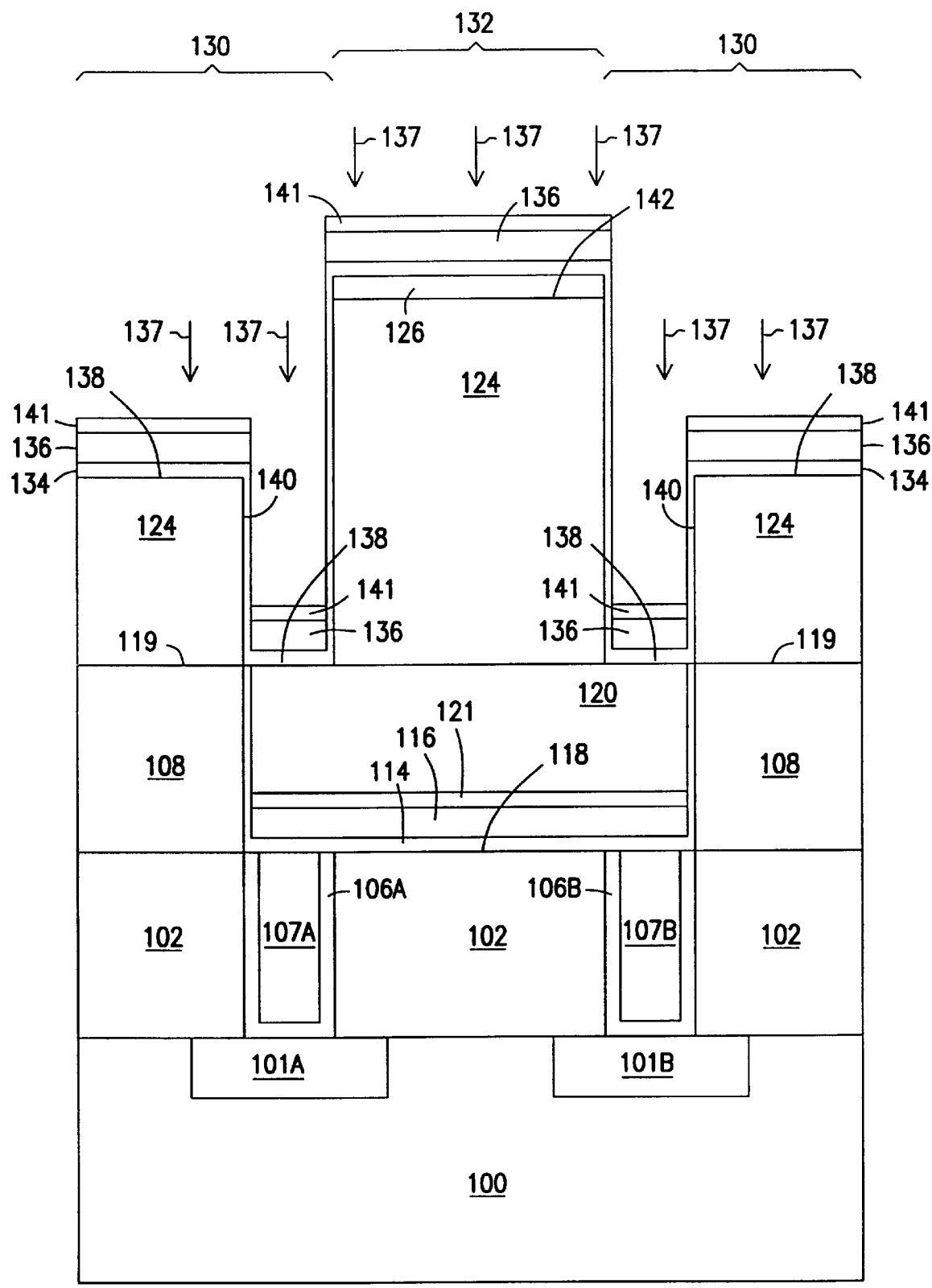

Column 9,
Line 6, delete "FIG. 11" and insert -- FIG. 1I --, therefor.

Column 10,
Line 22, delete "Embodiment of a Metal Interconnect using Aluminum Metal Lines and Oxide Insulators" and insert -- Embodiment of a Metal Interconnect using Aluminum Metal Lines and Oxide Insulators --, therefor.
Line 50, delete "are" and insert -- art --, therefor.
Line 55, delete "a through" and insert -- as through --, therefor.

Column 11,
Line 31, delete "depositing the" after "embodiment,".
Line 38, delete "()" and insert -- ($\propto$) --, therefor.
Line 43, delete "()" and insert -- ($\propto$) --, therefor.

Column 12,
Line 37, delete "number." and insert -- number --, therefor.

Column 13,
Line 19, delete "this," and insert -- this --, therefor.
Line 54, delete "()" and insert -- ($\propto$) --, therefor.
Line 59, insert -- $\propto$ -- after "implantation,".

Column 14,
Line 39, delete "226." and insert -- 226 --, therefor.

UNITED STATES PATENT AND TRADEMARK OFFICE
CERTIFICATE OF CORRECTION

PATENT NO. : 6,376,370 B1
DATED : April 23, 2002
INVENTOR(S) : Farrar

It is certified that error appears in the above-identified patent and that said Letters Patent is hereby corrected as shown below:

<u>Column 15,</u>
Line 7, delete "Embodiment of a Metal Interconnect using Copper Metal Lines and Oxide Insulators" and insert -- <u>Embodiment of a Metal Interconnect using Copper Metal Lines and Oxide Insulators</u> --, therefor.
Line 41, delete "are" and insert -- art --, therefor.
Line 46, delete "a through" and insert -- as through --, therefor.

<u>Column 16,</u>
Line 24, delete "()" and insert -- ($\propto$) --, therefor.
Line 25, delete "()" and insert -- ($\propto$) --, therefor.
Line 65, delete "sing" and insert -- using --, therefor.

<u>Column 18,</u>
Line 37, delete "()" and insert -- ($\propto$) --, therefor.
Line 38, delete "()" and insert -- ($\propto$) --, therefor.
Line 42, delete "is." and insert -- is --, therefor.
Line 47, delete "()" and insert -- ($\propto$) --, therefor.

<u>Column 20,</u>
Line 8, delete "Another Embodiment of a Metal Interconnect using Copper" and insert -- <u>Another Embodiment of a Metal Interconnect using Copper</u> --, therefor.
Line 41, delete "are" and insert -- art --, therefor.
Line 46, delete "a through" and insert -- as through --, therefor.

<u>Column 21,</u>
Line 10, delete "process;" and insert -- process, --, therefor.
Line 25, delete "depositing the" after "embodiment,".

<u>Column 22,</u>
Line 59, delete "Second" and insert -- second --, therefor.

UNITED STATES PATENT AND TRADEMARK OFFICE
CERTIFICATE OF CORRECTION

PATENT NO. : 6,376,370 B1
DATED : April 23, 2002
INVENTOR(S) : Farrar

It is certified that error appears in the above-identified patent and that said Letters Patent is hereby corrected as shown below:

Column 23,
Line 48, delete "FIG. 4L" and insert -- FIG. 4I, --, therefor.

Column 26,
Line 24, delete "aid" and insert -- and --, therefor.

Column 28,
Line 62, delete "claim 23" and insert -- claim 22 --, therefor.

Signed and Sealed this

Twenty-ninth Day of October, 2002

Attest:

Attesting Officer

JAMES E. ROGAN
Director of the United States Patent and Trademark Office

UNITED STATES PATENT AND TRADEMARK OFFICE

CERTIFICATE OF CORRECTION

PATENT NO. : 6,376,370 B1
DATED : April 23, 2002
INVENTOR(S) : Farrar

It is certified that error appears in the above-identified patent and that said Letters Patent is hereby corrected as shown below:

<u>Title page, Item [54] and Column 1, lines 3-6,</u>
Delete "PROCESS FOR PROVIDING SEED LAYERS FOR USING ALUMINUM, COPPER, GOLD AND SILVER METALLURGY".

Item [56], References Cited, OTHER PUBLICATIONS,
Delete "Phys.Lett.60" and insert -- Phys. Lett. 60 --, therefor.
Delete "Foundation" and insert -- Foundations --, therefor.
Delete "PRoceedings" and insert -- Proceedings --, therefor.
Delete "Proc" and insert -- Proc. --, therefor.
Delete "electrless" and insert -- electroless --, therefor.
Delete "Sio2" and insert -- $SiO_2$ --, therefor.
Delete "PLasma" and insert -- Plasma --, therefor.
Delete "mangetron" and insert -- magnetron --, therefor.
Delete "SiO2" and insert -- $SiO_2$ --, therefor.

<u>Column 1,</u>
Line 14, delete "Method for Making Copper Interconnects in Integrated Circuits" and insert -- Methods for Making Integrated-Circuit Wiring from Copper, Silver, Gold, and Other Metals --, therefor.
Line 48, delete "through." and insert -- through --, therefor.
Line 55, delete "vol.57" and insert -- vol. 57 --, therefor.

<u>Column 2,</u>
Line 6, delete "the." and insert -- the --, therefor.
Line 37, delete "must be." and insert -- must be --, therefor.

<u>Column 3,</u>
Line 4, delete "co-pending." and insert -- co-pending --, therefor.
Line 12, delete "comers" and insert -- corners --, therefor.
Line 23, delete "scale integration" and insert -- scale-integration --, therefor.

<u>Column 4,</u>
Line 53, delete "unhoped" and insert -- undoped --, therefor.

UNITED STATES PATENT AND TRADEMARK OFFICE
CERTIFICATE OF CORRECTION

PATENT NO.      : 6,376,370 B1
DATED           : April 23, 2002
INVENTOR(S)     : Farrar It is certified that error appears in the above-identified patent and that said Letters Patent is hereby corrected as shown below:

Column 5,
Line 17, delete "Embodiment of a Metal Interconnect using Copper and Polymide" and insert -- Embodiment of a Metal Interconnect using Copper and Polymide --, therefor.
Line 33, delete "skill in." and insert -- skill in --, therefor.
Line 50, delete "are" and insert -- art --, therefor.

Column 6,
Line 34, delete "depositing the" after "embodiment,".
Line 42, delete "()" and insert -- ($\propto$) --, therefor.

Column 9,
Line 6, delete "FIG. 11" and insert -- FIG. 1I --, therefor.

Column 10,
Line 22, delete "Embodiment of a Metal Interconnect using Aluminum Metal Lines and Oxide Insulators" and insert -- Embodiment of a Metal Interconnect using Aluminum Metal Lines and Oxide Insulators --, therefor.
Line 50, delete "are" and insert -- art --, therefor.
Line 55, delete "a through" and insert -- as through --, therefor.

Column 11,
Line 31, delete "depositing the" after "embodiment,".
Line 38, delete "()" and insert -- ($\propto$) --, therefor.
Line 43, delete "()" and insert -- ($\propto$) --, therefor.

Column 12,
Line 37, delete "number." and insert -- number --, therefor.

Column 13,
Line 19, delete "this," and insert -- this --, therefor.
Line 54, delete "()" and insert -- ($\propto$) --, therefor.
Line 59, insert -- $\propto$ -- after "implantation,".

Column 14,
Line 39, delete "226." and insert -- 226 --, therefor.

UNITED STATES PATENT AND TRADEMARK OFFICE
CERTIFICATE OF CORRECTION

PATENT NO. : 6,376,370 B1
DATED : April 23, 2002
INVENTOR(S) : Farrar

It is certified that error appears in the above-identified patent and that said Letters Patent is hereby corrected as shown below:

Column 15,
Line 7, delete "Embodiment of a Metal Interconnect using Copper Metal Lines and Oxide Insulators" and insert -- Embodiment of a Metal Interconnect using Copper Metal Lines and Oxide Insulators --, therefor.
Line 41, delete "are" and insert -- art --, therefor.
Line 46, delete "a through" and insert -- as through --, therefor.

Column 16,
Line 24, delete "()" and insert -- ($\propto$) --, therefor.
Line 25, delete "()" and insert -- ($\propto$) --, therefor.
Line 65, delete "sing" and insert -- using --, therefor.

Column 18,
Line 37, delete "()" and insert -- ($\propto$) --, therefor.
Line 38, delete "()" and insert -- ($\propto$) --, therefor.
Line 42, delete "is." and insert -- is --, therefor.
Line 47, delete "()" and insert -- ($\propto$) --, therefor.

Column 20,
Line 8, delete "Another Embodiment of a Metal Interconnect using Copper" and insert -- Another Embodiment of a Metal Interconnect using Copper --, therefor.
Line 41, delete "are" and insert -- art --, therefor.
Line 46, delete "a through" and insert -- as through --, therefor.

Column 21,
Line 10, delete "process;" and insert -- process, --, therefor.
Line 25, delete "depositing the" after "embodiment,".

Column 22,
Line 59, delete "Second" and insert -- second --, therefor.

UNITED STATES PATENT AND TRADEMARK OFFICE
CERTIFICATE OF CORRECTION

PATENT NO. : 6,376,370 B1
DATED : April 23, 2002
INVENTOR(S) : Farrar

It is certified that error appears in the above-identified patent and that said Letters Patent is hereby corrected as shown below:

Column 23,
Line 48, delete "FIG. 4L" and insert -- FIG. 4I, --, therefor.

Column 26,
Line 24, delete "aid" and insert -- and --, therefor.

Column 28,
Line 62, delete "claim 23" and insert -- claim 22 --, therefor.

Signed and Sealed this

Twenty-ninth Day of October, 2002

Attest:

Attesting Officer

JAMES E. ROGAN
*Director of the United States Patent and Trademark Office*